(12) United States Patent
Inoue et al.

(10) Patent No.: US 10,852,610 B2
(45) Date of Patent: Dec. 1, 2020

(54) THIN FILM TRANSISTOR SUBSTRATE HAVING SOURCE AND DRAIN UPPER-LAYER ELECTRODES

(71) Applicant: Mitsubishi Electric Corporation, Tokyo (JP)

(72) Inventors: Kazunori Inoue, Kumamoto (JP); Koji Oda, Kumamoto (JP); Takafumi Hashiguchi, Tokyo (JP); Takeshi Kubota, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/296,654

(22) Filed: Mar. 8, 2019

(65) Prior Publication Data
US 2019/0293980 A1 Sep. 26, 2019

(30) Foreign Application Priority Data
Mar. 26, 2018 (JP) .................. 2018-057967

(51) Int. Cl.
*H01L 27/12* (2006.01)
*G02F 1/13* (2006.01)
(Continued)

(52) U.S. Cl.
CPC .......... *G02F 1/1368* (2013.01); *H01L 21/443* (2013.01); *H01L 27/1225* (2013.01);
(Continued)

(58) Field of Classification Search
CPC ............. H01L 27/1225; H01L 27/1262; H01L 27/1288; G02F 1/1368
See application file for complete search history.

(56) References Cited

U.S. PATENT DOCUMENTS 6,727,522 B1 4/2004 Kawasaki et al.
9,076,875 B2 * 7/2015 Inoue .................. H01L 29/7869
(Continued)

FOREIGN PATENT DOCUMENTS

JP 2000-150900 A 5/2000
JP 2003-086808 A 3/2003
(Continued)

OTHER PUBLICATIONS

Kenji Nomura, et al., "Room-temperature fabrication of transparent flexible thin-film transistors using amorphous oxide semiconductors," Nature, vol. 432, Nov. 25, 2004, pp. 488-492.

*Primary Examiner* — Ida M Soward
(74) *Attorney, Agent, or Firm* — Studebaker & Brackett PC

(57) ABSTRACT

An opening insulation film covers a substrate and is in contact with a side surface of a gate electrode. The opening insulation film is provided with a first opening portion having a side surface on the gate electrode. A gate insulation film made of an oxide insulator is on the gate electrode and the opening insulation film. A semiconductor channel film made of an oxide semiconductor is on the gate insulation film and is encompassed by the first opening portion. Source and drain electrodes are on the semiconductor channel film. A source upper-layer electrode and a drain upper-layer electrode both made of an oxide are provided at least on upper surfaces of the source electrode and the drain electrode, respectively. An interlayer insulation film made of an oxide has a portion provided on the source upper-layer electrode and the drain upper-layer electrode and is in contact the semiconductor channel film.

11 Claims, 29 Drawing Sheets

(51) Int. Cl.
*G02F 1/1368* (2006.01)
*H01L 21/443* (2006.01)
*H01L 21/02* (2006.01)
*G02F 1/1343* (2006.01)
*H01L 21/4757* (2006.01)

(52) U.S. Cl.
CPC ...... *H01L 27/1262* (2013.01); *H01L 27/1288* (2013.01); *G02F 1/134363* (2013.01); *G02F 2201/121* (2013.01); *G02F 2201/123* (2013.01); *G02F 2202/10* (2013.01); *G02F 2203/01* (2013.01); *H01L 21/0217* (2013.01); *H01L 21/02164* (2013.01); *H01L 21/02274* (2013.01); *H01L 21/02565* (2013.01); *H01L 21/02631* (2013.01); *H01L 21/47573* (2013.01)

(56) References Cited

U.S. PATENT DOCUMENTS

| | | | | |
|---|---|---|---|---|
| 9,177,855 B2* | 11/2015 | Yamazaki | ............ | H01L 21/0217 |
| 9,190,420 B2* | 11/2015 | Nagayama | .......... | H01L 27/1225 |
| 9,343,487 B2* | 5/2016 | Nagayama | .......... | H01L 27/1225 |
| 9,859,306 B2* | 1/2018 | Kondo | ................ | H01L 27/1225 |
| 9,865,742 B2* | 1/2018 | Yamazaki | ........... | H01L 27/1288 |
| 9,881,942 B2* | 1/2018 | Sun | ....................... | H01L 27/124 |
| 9,911,765 B2* | 3/2018 | Imamura | ............. | H01L 27/1225 |
| 10,374,184 B2* | 8/2019 | Eguchi | ................ | H01L 27/1225 |
| 10,409,128 B2* | 9/2019 | Inoue | ................ | G02F 1/134336 |
| 2003/0047785 A1 | 3/2003 | Kawasaki et al. | | |
| 2005/0127380 A1 | 6/2005 | Kawasaki et al. | | |
| 2009/0189153 A1 | 7/2009 | Iwasaki et al. | | |
| 2009/0239335 A1* | 9/2009 | Akimoto | ............... | H01L 21/477 438/104 |
| 2010/0053507 A1 | 3/2010 | Song et al. | | |
| 2010/0084961 A1 | 4/2010 | Hashizume | | |
| 2014/0014962 A1* | 1/2014 | Arai | .................... | H01L 33/0041 257/59 |
| 2014/0070211 A1 | 3/2014 | Iwasaki et al. | | |
| 2015/0008429 A1* | 1/2015 | Ito | .................... | H01L 21/02565 257/43 |
| 2015/0162351 A1* | 6/2015 | Hiwatashi | ............... | H01L 21/47 257/43 |
| 2018/0145094 A1* | 5/2018 | Yan | .................... | H01L 29/78633 |
| 2018/0286985 A1* | 10/2018 | Hara | ...................... | G02F 1/1368 |
| 2018/0350998 A1* | 12/2018 | Yamazaki | ........... | H01L 29/7869 |
| 2020/0035719 A1* | 1/2020 | Ohhira | .................. | H01L 21/768 |
| 2020/0052005 A1* | 2/2020 | Yoshida | .................. | G02F 1/133 |

FOREIGN PATENT DOCUMENTS

| | | |
|---|---|---|
| JP | 2007-281409 A | 10/2007 |
| JP | 2009-151285 A | 7/2009 |
| JP | 2010-055065 A | 3/2010 |
| JP | 2010-086927 A | 4/2010 |

* cited by examiner

THIN FILM TRANSISTOR SUBSTRATE HAVING SOURCE AND DRAIN UPPER-LAYER ELECTRODES

BACKGROUND OF THE INVENTION

Field of the Invention

The present invention relates to a thin film transistor substrate, a display device, and a method of manufacturing a thin film transistor substrate.

Description of the Background Art

Thin film transistors (TFTs) are characterized by being low in power consumption and being thin, and find increasing applications to electronic devices. TFT active matrix substrates including TFTs used as switching elements, i.e. thin film transistor substrates (TFT substrates), are used for display devices (electro-optic devices) employing liquid crystal or organic EL (Electro-Luminescence), for example.

Electro-optic elements for liquid crystal displays (LCDs) include simple matrix LCDs and TFT-LCDs including TFTs used as switching elements. Of these, the TFT-LCDs are superior to the simple matrix LCDs in terms of visual quality, and are widely used as displays or monitors for mobile computers, personal computers, televisions, and the like.

In general, a TFT-LCD includes a liquid crystal display panel having a structure such that a liquid crystal layer is held between a TFT substrate having a plurality of TFTs arranged in an array and a counter substrate having a color filter and the like. A polarizing plate is provided on each of the front and back surface sides of the liquid crystal display panel. A backlight is further provided on one of the front and back surface sides thereof. This structure provides good color display.

Schemes for driving liquid crystal in LCDs include a vertical electric field type such as a TN (twisted nematic) mode and a VA (vertical alignment) mode, and a horizontal electric field type such as an IPS (in plane switching) mode ("IPS" is a registered trademark of Japan Display Inc.) and a FFS (fringe field switching) mode. In general, LCDs of the horizontal electric field type, which are more advantageous in widening a viewing angle than LCDs of the vertical electric field type, are becoming mainstream in display products for personal computers, vehicle-mounted display devices, and the like.

In a LCD of the vertical electric field type typified by the TN mode, pixel electrodes to which voltage dependent on an image signal is applied are disposed on the TFT substrate, and a common electrode fixed at a constant potential (common potential) is disposed on the counter substrate. Thus, the liquid crystal in the liquid crystal layer is driven by an electric field substantially perpendicular to the surface of the liquid crystal display panel.

In a liquid crystal display panel of the horizontal electric field type, both the pixels electrodes and the common electrode are disposed on the TFT substrate. The liquid crystal in the liquid crystal layer is driven by an electric field substantially horizontal with respect to the surface of the liquid crystal display panel. In particular, in a FFS mode TFT substrate, the pixels electrodes and the common electrode are disposed in vertically opposed relation, with an insulation film therebetween. Either the pixels electrodes or the common electrode may be disposed on the upper side (closer to the liquid crystal layer) or on the lower side. The electrode(s) on the upper side is (are) flat shaped, whereas the electrode(s) on the lower side is (are) lattice shaped with slits or comb tooth shaped.

Conventionally, amorphous silicon (a-Si) has principally been used as the material of an active layer (channel layer) for the TFTs serving as the switching elements of the TFT substrate for LCDs.

For example, as shown in FIGS. 2 and 3 of Japanese Patent Application Laid-Open No. 2009-151285, a FFS mode TFT substrate of a typical configuration having TFTs of a-Si (a-Si-TFTs) is manufactured by undergoing a total of seven photolithographic steps: (1) the step of forming a gate electrode; (2) the step of forming a gate insulation film and a channel layer; (3) the step of forming a source electrode and a drain electrode; (4) the step of forming a protective insulation film and a contact hole; (5) the step of forming a pixel electrode; (6) the step of forming a contact hole in an interlayer insulation film; and (7) the step of forming a common electrode.

An inorganic insulation film such as a silicon nitride (SiN) film or a silicon oxide (SiO) film may be used as the gate insulation film and the protective insulation film of a TFT disclosed in Japanese Patent Application Laid-Open No. 2009-151285. In particular, in a conventional a-Si-TFT, the SiN film is in general used preferably in consideration of its excellent barrier capability (interruption capability) against the entry of impurity elements affecting the properties and reliability of the channel layer from the substrate or external environments and its ease of fabrication processes (contact hole formation). A typical method of depositing the SiN film is a PECVD (plasma enhanced chemical vapor deposition) method that is high in deposition speed and in productivity. The SiN film deposited by the PECVD method contains a large number of hydrogen (H) atoms. When the SiN film containing such a large number of H atoms and an a-Si film having defects of dangling bonds between Si atoms are combined to each other, the H atoms in the SiN film act to repair the dangling bonds of the a-Si film. This produces the effect of recovering the properties of the a-Si film.

In recent years, a TFT (referred to hereinafter as an oxide TFT) including an oxide semiconductor film used as a channel layer has been developed. An oxide semiconductor has higher mobility than conventional a-Si. The use of such higher mobility achieves a high-performance TFT. This is advantageous in increase in definition of a panel and in decrease in power consumption. The practical use of the oxide TFT for portable devices such as smartphones and mobile computers and for personal computers has been promoted. Examples of the oxide semiconductor used principally include zinc oxide (ZnO) based materials and amorphous InGaZnO based materials prepared by adding gallium oxide ($Ga_2O_3$) and indium oxide ($In_2O_3$) to zinc oxide. Techniques relating to these oxide TFTs are disclosed, for example, in Japanese Patent Application Laid-Open No. 2000-150900, in Japanese Patent Application Laid-Open No. 2007-281409, and in Kenji Nomura et al, "Room-temperature fabrication of transparent flexible thin-film transistors using amorphous oxide semiconductors", Nature 2004, vol. 432, pp. 488-492.

Unfortunately, when the SiN film, i.e. the film containing a large number of H atoms, which is conventionally used for a-Si-TFTs is simply used as the gate insulation film or the protective insulation film, for example, in the oxide TFT, an interface layer is decreased in resistance or a structural defect layer is produced because of the reduction of the channel layer made of the oxide semiconductor, whereby the TFT properties and reliability are deteriorated. In other words, the H atoms have the preferable function of repairing the defects for the a-Si film, but have the function of deteriorating the properties for the oxide semiconductor.

It is hence contemplated that a SiO film made of an oxide, for example, is used as the gate insulation film. The SiO film is easily deposited by changing a source gas used in the PECVD method similar to that for the SiN film. Also, the SiO film contains oxygen atoms and can be lower in hydrogen concentration therein than the SiN film to thereby suppress the reduction reaction at the interface with the oxide semiconductor film. However, the SiO film is inferior to the SiN film in barrier capability against impurity elements. Thus, the SiO film presents the problem that the deterioration of the properties thereof due to the diffusion of impurity elements contained in the substrate into the oxide semiconductor film cannot be prevented.

As a measure to work around these problems, a gate insulation layer of laminated construction is disclosed, for example, in Japanese Patent Application Laid-Open No. 2003-86808. Specifically, a conventional SiN film excellent in barrier capability is provided on the side for contact with the substrate, whereas a SiO film is provided on the side for contact with the oxide semiconductor film to avoid the reduction action.

In such laminated construction, however, if the SiN film is present in part of the gate insulation layer which overlaps the oxide semiconductor film as seen in plan view, the H atoms contained in the SiN film can diffuse through the SiO film into the oxide semiconductor film. For this reason, it is difficult for such laminated construction to sufficiently solve the aforementioned problems.

It is hence contemplated that another method of depositing an insulation film is used in place of the PECVD method which results in the containment of a large number of H atoms. Specifically, it is contemplated that a sputtering method is used to deposit the SiN film, the SiO film, or a metal oxide insulation film such as tantalum oxide (TaO), aluminum oxide (AlO), or titanium oxide (TiO). The insulation films deposited by the sputtering method are less prone to cause the reduction reaction at the interface with the oxide semiconductor film because the insulation films contain few H atoms. However, the process of depositing these insulation films by means of the sputtering method is in general lower (e.g., not greater than one-half) in deposition rate than the process of depositing the SiN film or the SiO film by means of the PECVD method to result in decreased production capacity and increased manufacturing costs. Further, if a new oxide insulation film is used in place of the SiN film and the SiO film, the introduction of a new insulator material (sputtering target material) and a new etching process (the introduction of a gas for dry etching or a chemical liquid for wet etching) gives rise to a further increase in manufacturing costs.

Japanese Patent Application Laid-Open No. 2003-86808 further discloses the provision of a protective insulation film on the oxide semiconductor film, a source electrode, and a drain electrode after the provision of the source and drain electrodes on the oxide semiconductor film. In this step, it is considered to be preferable to use an oxide insulation film such as the SiO film containing oxygen atoms as this protective insulation film from the viewpoint of suppressing the reduction reaction of the oxide semiconductor film. However, if the source and drain electrodes made of metal or alloys are present at the surface where the SiO film is to be deposited, an oxidation-reduction reaction (a reaction such that the surfaces of the source and drain electrodes are oxidized and the SiO film is reduced and deprived of oxygen) occurs. As a result, the SiO film has structural defects of oxygen vacancy near the interface with the oxide semiconductor film. Such structural defects result in defect levels at a channel interface with the oxide semiconductor film. The presence of the defect levels deteriorates the properties and reliability of the TFTs.

SUMMARY

It is therefore an object of the present invention to provide a TFT substrate having good properties and high reliability when an oxide semiconductor is used, and a method of manufacturing the same.

A thin film transistor substrate according to the present invention includes a thin film transistor having a layered structure in which a first conductive layer, a first insulation layer, a second insulation layer made of an oxide insulator different from the material of the first insulation layer, an oxide semiconductor layer, a second conductive layer, a third conductive layer made of an oxide, and a third insulation layer made of an oxide are disposed on a substrate. The thin film transistor substrate includes: a gate electrode included in the first conductive layer; an opening insulation film included in the first insulation layer; a gate insulation film included in the second insulation layer; a semiconductor channel film included in the oxide semiconductor layer; a source electrode included in the second conductive layer; a drain electrode included in the second conductive layer; a source upper-layer electrode included in the third conductive layer; a drain upper-layer electrode included in the third conductive layer; and an interlayer insulation film included in the third insulation layer. The gate electrode is provided on the substrate and has a side surface. The opening insulation film covers the substrate and is in contact with the side surface of the gate electrode. The opening insulation film is provided with a first opening portion having a side surface on the gate electrode. The gate insulation film is provided on the gate electrode and the opening insulation film. The semiconductor channel film is provided on the gate insulation film and is encompassed by the first opening portion of the opening insulation film as seen in plan view. The source electrode and the drain electrode are provided on the semiconductor channel film. The source upper-layer electrode is provided at least on an upper surface of the source electrode. The drain upper-layer electrode is provided at least on an upper surface of the drain electrode. The interlayer insulation film has a portion provided on the source upper-layer electrode and the drain upper-layer electrode and is in contact with the semiconductor channel film.

A method of manufacturing a thin film transistor substrate according to the present invention is a method of manufacturing a thin film transistor substrate including a thin film transistor disposed on a substrate. The method includes the steps of: (A) forming a gate electrode having a side surface from a first conductive layer deposited on a substrate; (B) forming an opening insulation film from a first insulation layer deposited so as to cover the substrate, the opening insulation film being in contact with the side surface of the gate electrode, the opening insulation film being provided with a first opening portion having a side surface on the gate electrode; (C) depositing a second insulation layer made of an oxide insulator different from the material of the first insulation layer on the gate electrode and the opening insulation film to form a gate insulation film; (D) patterning a laminate comprised of an oxide semiconductor layer and a second conductive layer deposited in sequential order on the gate insulation film to form a semiconductor channel film from the oxide semiconductor layer, the semiconductor channel film being encompassed by the first opening portion of the opening insulation film as seen in plan view; and (E) depositing a third conductive layer made of an oxide and patterning a laminate comprised of the third conductive layer and the second conductive layer into two spaced portions on an upper surface of the semiconductor channel film to form a source electrode and a drain electrode from the second conductive layer on the upper surface of the semiconductor channel film and to form a source upper-layer electrode and a drain upper-layer electrode from the third conductive layer on the source electrode and the drain electrode, respectively.

According to the present invention, a TFT substrate having good properties and high reliability is provided when an oxide semiconductor is applied to TFTs.

DESCRIPTION OF THE PREFERRED EMBODIMENTS

Figure 1:
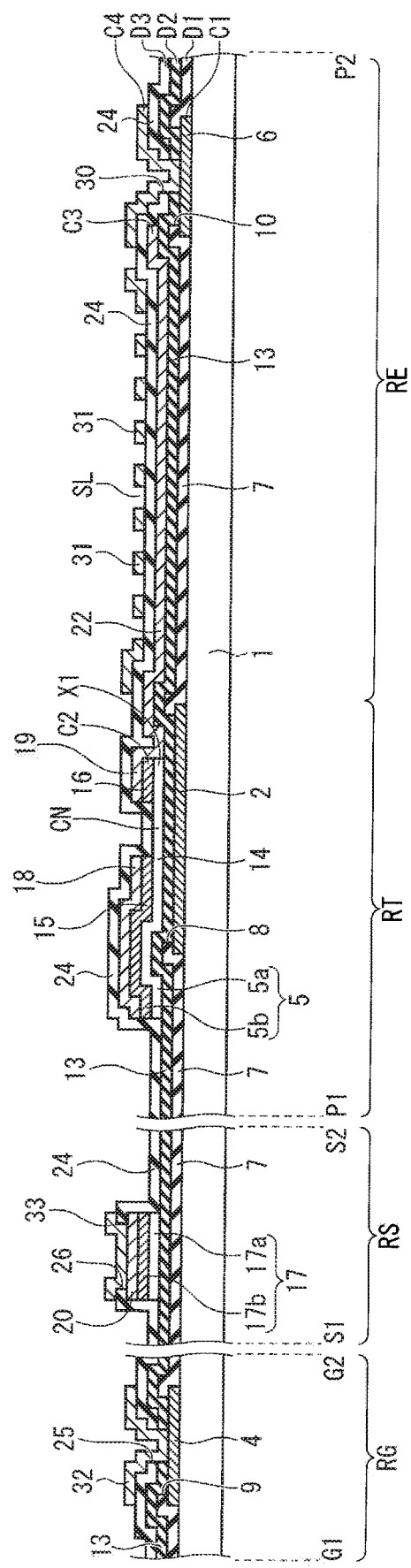
FIG. 1 is a schematic partial sectional view showing a configuration of a thin film transistor substrate according to a first preferred embodiment of the present invention and taken along the lines G1-G2, S1-S2, and P1-P2 of FIGS. 2 and 3.

Preferred embodiments according to the present invention will now be described with reference to the drawings. Identical or corresponding parts in the drawings are designated by the same reference numerals and characters, and will not be described repeatedly.

First Preferred Embodiment (Overview of Configuration of Thin Film Transistor Substrate)

Figure 2:
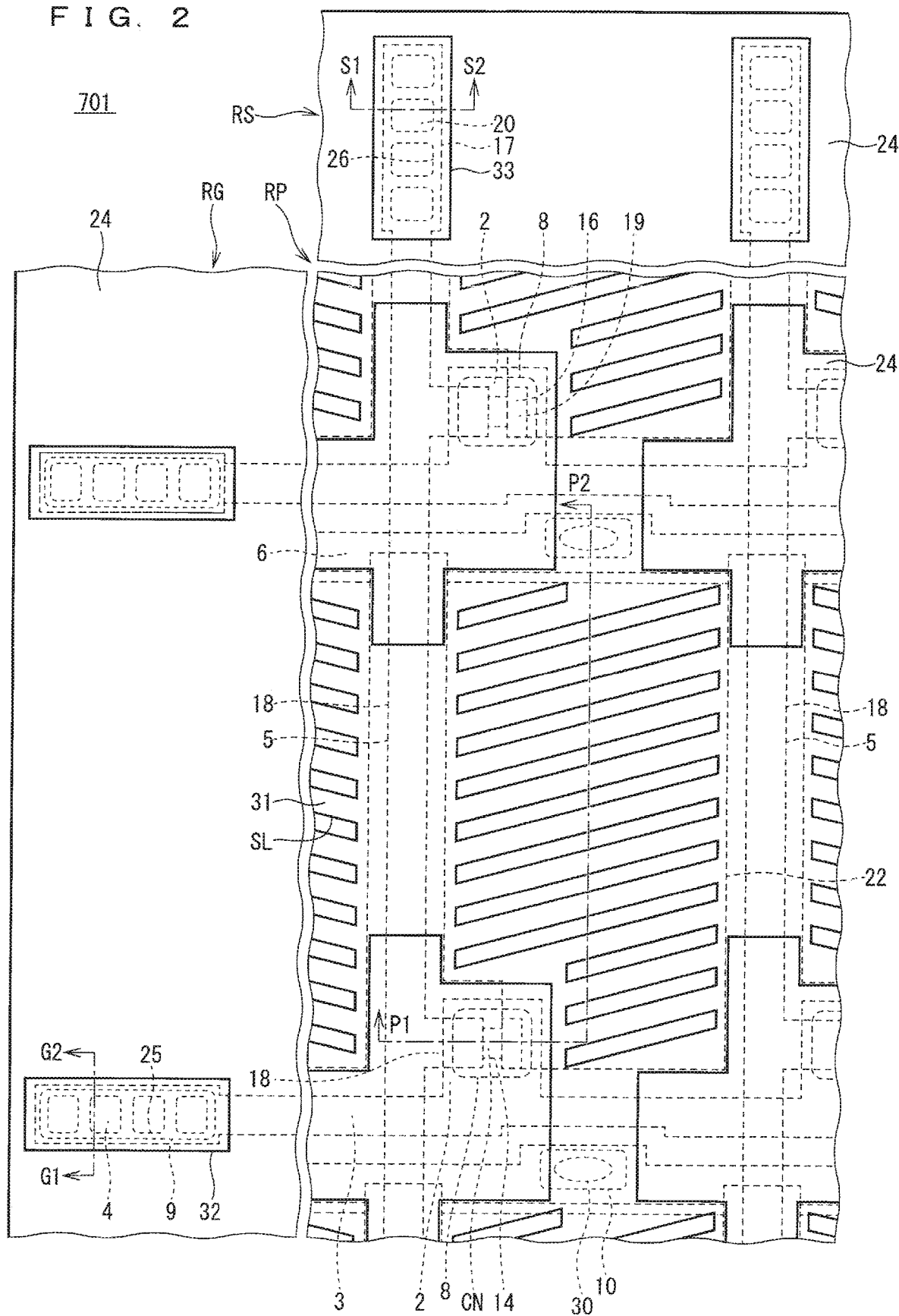
FIG. 2 is a schematic partial plan view showing the configuration of the thin film transistor substrate according to the first preferred embodiment of the present invention.
Figure 3:
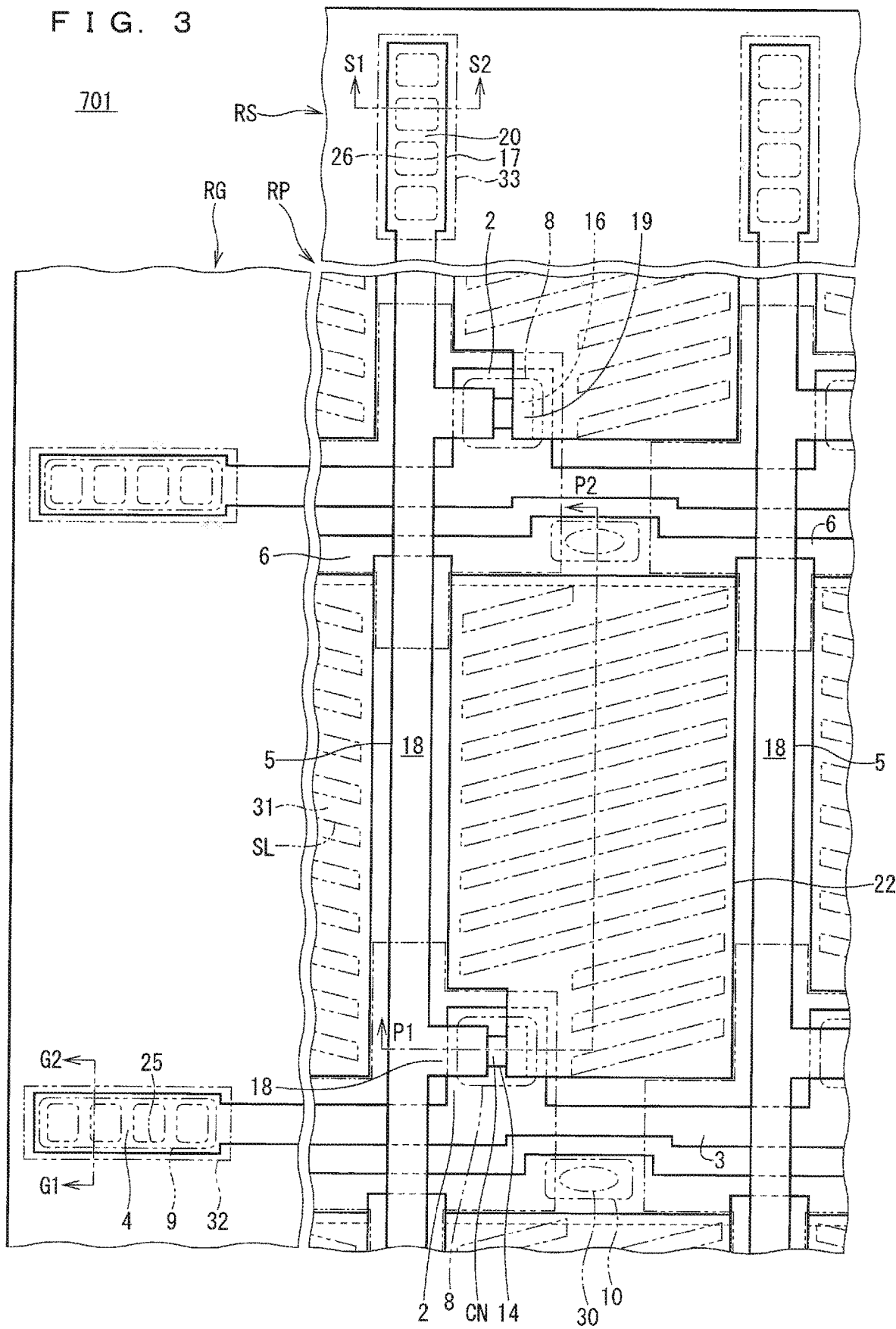
FIG. 3 is a partial plan view showing an internal configuration of the thin film transistor substrate according to the first preferred embodiment of the present invention by omitting some of the members shown in FIG. 2.

FIG. 1 is a schematic partial sectional view showing a configuration of a TFT substrate 701 (thin film transistor substrate) according to a first preferred embodiment of the present invention and taken along the lines G1-G2, S1-S2, and P1-P2 of FIGS. 2 and 3. In the figure, members belonging to a common layer are indicated by common hatching in a layered structure to be described later. FIG. 2 is a schematic partial plan view showing the configuration of the TFT substrate 701. FIG. 3 is a partial plan view showing an internal configuration of the TFT substrate 701 by omitting some of the members shown in FIG. 2. Each of FIGS. 2 and 3 shows the periphery of one pixel region RP, a gate terminal region RG disposed outside all pixel regions included in the TFT substrate 701 (at the left-hand end as seen in the figures), and a source terminal region RS disposed outside all pixel regions included in the TFT substrate 701 (at the upper end as seen in the figures).

The TFT substrate 701 includes a plurality of pixel regions RP (FIGS. 2 and 3) disposed in a matrix as seen in plan view on a substrate 1 (FIG. 1), and TFT portions RT (thin film transistors) disposed in corresponding relation to the respective pixel regions RP, as shown in FIG. 1.

The TFT substrate 701 has a layered structure shown in FIG. 1. The layered structure includes a first conductive layer C1, a first insulation layer D1, a second insulation layer D2 made of an oxide insulator different from the material of the first insulation layer D1, an oxide semiconductor layer X1, a second conductive layer C2, a third conductive layer C3 made of an oxide, and a third insulation layer D3 made of an oxide, all of which are disposed on the substrate 1. These layers may be laminated in the order named. Each of the layers may have at least one pattern. In such a case, the layers have space as a region lying between patterns or an open region in patterns. Layers lying above and below a layer having the space may be in contact with each other through the space. A plurality of members included in the same layer may be made of a common material. The term "common material" as used herein may refer to a common laminate material. Also, the term "common material" as used herein may refer to materials having the same composition ratio or materials slightly different in composition ratio between the members. In the former case, the members can be formed by performing a simple patterning process on one layer. In the latter case, the members can be formed by locally performing some process that influences the composition on one layer after the one layer is deposited.

The TFT substrate 701 includes a plurality of gate electrodes 2 included in the first conductive layer C1, a plurality of gate interconnect lines 3 included in the first conductive layer C1, an opening insulation film 7 included in the first insulation layer D1, a gate insulation film 13 included in the second insulation layer D2, a plurality of semiconductor channel films 14 included in the oxide semiconductor layer X1, a plurality of source electrodes 15 included in the second conductive layer C2, a plurality of drain electrodes 16 included in the second conductive layer C2, a plurality of source interconnect lines 5 at least part of which is included in the second conductive layer C2, a plurality of source upper-layer electrodes 18 included in the third conductive layer C3, a plurality of drain upper-layer electrodes 19 included in the third conductive layer C3, a plurality of pixel electrodes 22 included in the third conductive layer C3, and an interlayer insulation film 24 included in the third insulation layer D3.

The gate electrodes 2 are provided on the substrate 1. The gate electrodes 2 are provided in the respective TFT portions RT. Each of the gate electrodes 2 has side surfaces. The gate interconnect lines 3 are provided on the substrate 1. Each of the gate interconnect lines 3 is connected to some of the gate electrodes 2 which belong to a corresponding row in the matrix arrangement. Each of the gate interconnect lines 3 extends in one direction (in a horizontal direction as seen in FIG. 3) in the plurality of pixel regions RP. The gate interconnect lines 3 preferably extend linearly in one direction but may extend in a zigzag fashion.

The opening insulation film 7 covers the substrate 1, and is in contact with the side surfaces of the plurality of gate electrodes 2. The opening insulation film 7 is provided with a plurality of TFT-region opening portions 8 (first opening portions) having side surfaces on the respective gate electrodes 2. The gate insulation film 13 is provided on the gate electrodes 2 and the opening insulation film 7.

The semiconductor channel films 14 are provided on the gate insulation film 13. The semiconductor channel films 14 are encompassed by the respective TFT-region opening portions 8 of the opening insulation film 7 as seen in plan view.

The source electrodes 15 and the drain electrodes 16 are provided on the semiconductor channel films 14. Specifically, one source electrode 15 and one drain electrode 16 are provided on each of the semiconductor channel films 14.

The source interconnect lines 5 intersect the gate interconnect lines 3 as seen in plan view. Specifically, each of the source interconnect lines 5 intersects the plurality of gate interconnect lines 3. In other words, each of the gate interconnect lines 3 intersects the plurality of source interconnect lines 5. Each of the source interconnect lines 5 is connected to some of the source electrodes 15 which belong to a corresponding column in the matrix arrangement.

The source upper-layer electrodes 18 are provided at least on upper surfaces of the source electrodes 15. Specifically, each of the source upper-layer electrodes 18 is provided on the upper surfaces of some of the source electrodes 15 which belong to a corresponding column in the matrix arrangement.

The drain upper-layer electrodes 19 are provided at least on upper surfaces of the drain electrodes 16. Specifically, in each of the pixel regions RP, one drain upper-layer electrode 19 is provided at least on the upper surface of one drain electrode 16.

The pixel electrodes 22 are connected to the respective drain upper-layer electrodes 19. The pixel electrodes 22 are in contact with side surfaces of the respective drain electrodes 16. Specifically, in each of the pixel regions RP, one pixel electrode 22 is connected to one drain upper-layer electrode 19, and one pixel electrode 22 is in contact with a side surface of one drain electrode 16.

The interlayer insulation film 24 has a portion provided on the source upper-layer electrodes 18 and the drain upper-layer electrodes 19. The interlayer insulation film 24 is in contact with the semiconductor channel films 14.

The TFT substrate 701 may include a counter electrode 31 provided over the pixel electrodes 22, with the interlayer insulation film 24 therebetween. The counter electrode 31 has openings in the form of comb teeth or slits. In the configuration shown in FIG. 2, the counter electrode 31 has a plurality of slit opening portions SL.

The TFT substrate 701 may include a plurality of common electrodes 6 provided on the substrate 1. In such a case, the opening insulation film 7 is provided with a plurality of common-electrode-region opening portions 10 (second opening portions). In the respective common-electrode-region opening portions 10, the counter electrode 31 is in contact with the plurality of common electrodes 6 through a plurality of common-electrode contact holes 30 provided in at least one of the gate insulation film 13 and the interlayer insulation film 24. The edges of the common-electrode-region opening portions 10 are disposed outside the common-electrode contact holes 30 as seen in plan view. The common electrodes 6 are included in at least one of the first conductive layer C1 and the second conductive layer C2. In the configuration shown in FIG. 1, the common electrodes 6 are included in the first conductive layer C1.

(Overview of Configuration of Thin Film Transistors)

Each of the TFT portions RT (thin film transistors) included in the TFT substrate 701 has a layered structure shown in FIG. 1. The layered structure includes the first conductive layer C1, the first insulation layer D1, the second insulation layer D2 made of an oxide insulator different from the material of the first insulation layer D1, the oxide semiconductor layer X1, the second conductive layer C2, the third conductive layer C3 made of an oxide, and the third insulation layer D3 made of an oxide, all of which are disposed on the substrate 1. These layers may be laminated in the order named. Each of the layers may have at least one pattern. In such a case, the layers have space as a region lying between patterns or an open region in patterns. Layers lying above and below a layer having the space may be in contact with each other through the space. A plurality of members included in the same layer may be made of a common material. The term "common material" as used herein may refer to a common laminate material. Also, the term "common material" as used herein may refer to materials having the same composition ratio or materials slightly different in composition ratio between the members. In the former case, the members can be formed by performing a simple patterning process on one layer. In the latter case, the members can be formed by locally performing some process that influences the composition on one layer after the one layer is deposited.

A TFT portion RT includes a gate electrode 2 included in the first conductive layer C1, the opening insulation film 7 included in the first insulation layer D1, the gate insulation film 13 included in the second insulation layer D2, a semiconductor channel film 14 included in the oxide semiconductor layer X1, a source electrode 15 included in the second conductive layer C2, a drain electrode 16 included in the second conductive layer C2, a source upper-layer electrode 18 included in the third conductive layer C3, a drain upper-layer electrode 19 included in the third conductive layer C3, and the interlayer insulation film 24 included in the third insulation layer D3.

The gate electrode 2 is provided on the substrate 1, and has side surfaces. The opening insulation film 7 covers the substrate 1, and is in contact with the side surfaces of the gate electrode 2. The opening insulation film 7 is provided with a TFT-region opening portion 8 (a first opening portion) having side surfaces on the gate electrode 2. The gate insulation film 13 is provided on the gate electrode 2 and the opening insulation film 7. The semiconductor channel film 14 is provided on the gate insulation film 13, and is encompassed by the TFT-region opening portion 8 of the opening insulation film 7 as seen in plan view. The source electrode 15 and the drain electrode 16 are provided on the semiconductor channel film 14. The source upper-layer electrode 18 is provided at least on the upper surface of the source electrode 15. The drain upper-layer electrode 19 is provided at least on the upper surface of the drain electrode 16. The interlayer insulation film 24 has a portion provided on the source upper-layer electrode 18 and the drain upper-layer electrode 19, and is in contact with the semiconductor channel film 14.

Preferably, at least one end portion of the semiconductor channel film 14 is spaced inwardly apart from edges of the gate electrode 2 and is spaced inwardly apart from edges of the TFT-region opening portion 8 of the opening insulation film 7, as seen in plan view (FIG. 3).

(Details on Configuration)

Next, details on the configuration of the TFT substrate 701 according to the first preferred embodiment will be described in reference to a preferred example thereof.

The TFT substrate 701 is provided for a display device and specifically for a FFS mode LCD capable of light transmission type image display. With reference to FIGS. 2 and 3, the image display is performed in an area where the pixel regions RP are arranged. Gate terminal pads 32 for applying a gate signal to the gate interconnect lines 3 are arranged in the gate terminal region RG. Source terminal pads 33 for applying a display signal to the source interconnect lines 5 are arranged in the source terminal region RS.

Each of the pixel regions RP (FIGS. 2 and 3) includes the TFT portion RT and a pixel electrode portion RE in which the pixel electrode 22 is disposed. The TFT portion RT and the pixel electrode portion RE are arranged along the line P1-P2, as shown in FIG. 1. The TFT substrate 701 is formed using the substrate 1. The substrate 1 is a transparent insulation substrate made of glass or the like, for example. The gate electrodes 2, gate terminals 4, and the common electrodes 6 which are included in the first conductive layer C1 are provided respectively in the TFT portions RT, the gate terminal region RG, and the pixel electrode portions RE on the substrate 1.

With reference to FIG. 3, the gate interconnect lines 3 and the common electrodes 6 extend substantially parallel to each other in a horizontal direction. The gate electrodes 2 are provided in the respective TFT portions RT (FIG. 1). Some of the gate electrodes 2 which correspond to one row in the matrix arrangement of the pixel regions RP are connected to a common one of the gate interconnect lines 3. In the configuration of FIG. 3, the gate electrodes 2 in corresponding relation to respective columns in the matrix arrangement of the pixel regions RP protrude from each of the gate interconnect lines 3. The gate terminals 4 are provided on respective first end portions of the gate interconnect lines 3.

Examples of the material of the first conductive layer C1 used in the first preferred embodiment include: metals such as copper (Cu), molybdenum (Mo), chromium (Cr), and aluminum (Al); and alloys prepared by adding other elements in trace amounts to these metals. In the example, copper (Cu) is used as the material of the first conductive layer C1.

As shown in FIG. 1, the opening insulation film 7 included in the first insulation layer D1 is provided on the substrate 1 so as to cover the gate electrodes 2, the gate terminals 4, and the common electrodes 6. The first insulation layer D1 is preferably made of a material low in moisture permeability and excellent in barrier (transmission blocking) properties. The term "barrier properties" used herein refers the properties of being less prone to allow impurity atoms (ions) contained in the substrate 1 to pass through. Examples of the impurity atoms referred to herein include lithium (Li), boron (B), carbon (C), sodium (Na), magnesium (Mg), and potassium (K). In the example, a SiN layer typically used in conventional a-Si-TFTs is used as the first insulation layer D1.

With reference to FIG. 3, the opening insulation film 7 is provided with the TFT-region opening portions 8 in regions which overlap the gate electrodes 2 and in which channel portions CN for TFTs are disposed. The opening insulation film 7 is further provided with gate-terminal-region opening portions 9 in regions which overlap the gate terminals 4, and the common-electrode-region opening portions 10 in regions which overlap the common electrodes 6. These opening portions extend to the first conductive layer C1. On the other hand, the opening insulation film 7 is provided with no opening portions on regions where members (electrodes and interconnect patterns) included in the first conductive layer C1 are not provided. Thus, substantially most of the surface of the substrate 1 is covered with the opening insulation film 7. This prevents the impurity atoms contained in the substrate 1 from being diffused from the surface of the substrate 1.

As shown in FIG. 1, the gate insulation film 13 included in the second insulation layer D2 is provided on the opening insulation film 7 having the TFT-region opening portions 8, the gate-terminal-region opening portions 9, and the common-electrode-region opening portions 10. The second insulation layer D2 is preferably made of an oxide insulator so that the semiconductor channel films 14 included in the oxide semiconductor layer X1 are not reduced, i.e. so that the semiconductor channel films 14 are not deprived of oxygen atoms. In the example, a SiO layer is used as the second insulation layer D2.

The semiconductor channel film 14 included in the oxide semiconductor layer X1 and the source and drain electrodes 15 and 16 included in the second conductive layer C2 on the semiconductor channel film 14 are provided on the gate insulation film 13 in each TFT portion RT. A source terminal 17 that is a laminate comprised of a terminal lower-layer portion 17a included in the oxide semiconductor layer X1 and a terminal upper-layer portion 17b included in the second conductive layer C2 is provided in the source terminal region RS.

Examples of the material of the oxide semiconductor layer X1 used in the first preferred embodiment include: zinc oxide (ZnO) based oxide semiconductor, InZnSnO based oxide semiconductor prepared by adding indium oxide ($In_2O_3$) and tin oxide ($SnO_2$) to zinc oxide, and InGaZnO based oxide semiconductor prepared by adding gallium oxide ($Ga_2O_3$) and indium oxide ($In_2O_3$) to zinc oxide. The semiconductor channel films 14 made of an oxide semiconductor have higher mobility than conventional semiconductor channel films made of a-Si. In the example, InGaZnO is used as the material of the oxide semiconductor layer X1, and Cu is used as the material of the second conductive layer C2 in a manner similar to the first conductive layer C1.

With reference to FIG. 1, each of the source interconnect lines 5 is a laminate comprised of an interconnect lower-layer portion 5a included in the oxide semiconductor layer X1 and an interconnect upper-layer portion 5b included in the second conductive layer C2. With reference to FIGS. 1 and 3, the oxide semiconductor layer X1 and the second conductive layer C2 are provided in the same shape (the same pattern) in regions where the source electrodes 15, the source interconnect lines 5, and the source terminal 17 are disposed as seen in plan view. Also, the oxide semiconductor layer X1 and the second conductive layer C2 are provided in the same shape (the same pattern) in regions where the drain electrodes 16 are disposed as seen in plan view. The oxide semiconductor layer X1 includes the channel portions CN each connecting the former and latter patterns, and the second conductive layer C2 is not formed on the channel portions CN. The commonality of the patterns described above allows the oxide semiconductor layer X1 and the second conductive layer C2 to be patterned at the same time by etching in the same photolithographic step during the manufacture, which will be described later. This is advantageous in simplifying the manufacturing steps. When the oxide semiconductor layer X1 and the second conductive layer C2 are etched by one operation, there are cases in which a slight shape difference (typically displacement in shape) occurs between the oxide semiconductor layer X1 and the second conductive layer C2 due to variations in amounts of etching. However, if there is such a slight shape difference, the oxide semiconductor layer X1 and the second conductive layer C2 are regarded as being substantially in the same shape.

The source interconnect lines 5 intersect the gate interconnect lines 3 and the common electrodes 6, and extend in a vertical direction as seen in FIG. 3. The source terminal 17 is provided on a first end of each of the source interconnect lines 5. The source electrodes 15 are provided so as to branch off from the source interconnect lines 5. At this time, at least an end portion (a right-hand end portion as seen in FIG. 1) of the semiconductor channel film 14 which is closer to the drain electrode 16 is disposed inside the TFT-region opening portion 8 and inside the gate electrode 2 as seen plan view. With reference to FIG. 1, this prevents backlight coming from the back surface of the substrate 1 from being reflected from the drain electrode 16 included in the second conductive layer C2 and then entering the channel portion CN.

As shown in FIG. 1, the source upper-layer electrode 18 and the drain upper-layer electrode 19 which are included in the third conductive layer C3 are provided respectively on the source electrode 15 and the drain electrode 16 in each TFT portion RT. The drain upper-layer electrode 19 is provided in a pattern contiguous with the pixel electrode 22 similarly included in the third conductive layer C3 and integrally therewith. That is, the drain upper-layer electrode 19 is connected to the pixel electrode 22. The pixel electrode 22 is in contact with a laminate comprised of the semiconductor channel film 14 and the drain electrode 16, and extends to part of the gate insulation film 13 which lies on the pixel electrode portion RE. In the source terminal region RS, an upper-layer source terminal 20 included in the third conductive layer C3 is provided on the terminal upper-layer portion 17b of the source terminal 17.

With reference to FIG. 3, the source upper-layer electrodes 18 and the upper-layer source terminals 20 included in the third conductive layer C3 are provided in the same shape as the source electrodes 15, the source interconnect lines 5, and the source terminals 17. The use of such a planar shape provides two current paths, i.e. a current path formed by the second conductive layer C2 and a current path formed by the third conductive layer C3, along the source interconnect lines 5. The second conductive layer C2 and the third conductive layer C3 are deposited individually. Thus, if one of the current paths is split accidentally due to a film defect of one of the layers, the other current path ensures electrical continuity along the source interconnect lines 5. This prevents the occurrence of disconnection failure of the source interconnect lines.

Each of the pixel electrodes 22 is disposed in a region surrounded by one gate interconnect line 3 and one common electrode 6 adjacent to each other in a vertical direction in FIG. 3, and a pair of source interconnect lines 5 adjacent to each other in a horizontal direction in FIG. 3. Each of the pixel electrodes 22 has a portion overlapping the common electrode 6 as seen in plan view. This forms a storage capacitance of each of the pixel electrodes 22.

As shown in FIGS. 1 and 3, a laminate comprised of the source electrode 15 and the source upper-layer electrode 18 and a laminate comprised of the drain electrode 16 and the drain upper-layer electrode 19 overlap part of the semiconductor channel film 14. End surfaces of these laminates are opposed to each other, with a constant distance therebetween. A region of the semiconductor channel film 14 which is exposed for this constant distance between these laminates functions as the channel portion CN for each TFT The third conductive layer C3 is made of an oxide, and is typically a transparent conductive layer. Thus, the pixel electrodes 22 are permeable to light. Examples of the material of such a layer used herein include a material (ITO) that is a mixture of indium oxide ($In_2O_3$) and tin oxide ($SnO_2$) and a material (IZO) that is a mixture of indium oxide and zinc oxide (ZnO). In the example, IZO is used.

As shown in FIG. 1, the interlayer insulation film 24 included in the third insulation layer D3 is provided so as to cover the channel portion CN, the source upper-layer electrode 18, the upper-layer source terminal 20, the drain upper-layer electrode 19, the pixel electrode 22, and the like. The interlayer insulation film 24 functions also as a protective insulation film for protecting the channel portion CN included in the oxide semiconductor layer X1. It is hence preferable to use an oxide insulation film containing oxygen as the third insulation layer D3 so that the semiconductor channel film 14 included in the oxide semiconductor layer X1 is not reduced (so that the semiconductor channel film 14 is not deprived of oxygen atoms). In the example, a SiO film is used as the third insulation layer D3 in a manner similar to the second insulation layer D2.

In each pixel region RP, a common-electrode contact hole 30 extending through the gate insulation film 13 and the interlayer insulation film 24 is provided in a location overlapping the common electrode 6 and lying inside a common-electrode-region opening portion 10 as seen in plan view, as shown in FIGS. 1 and 3. In the gate terminal region RG, gate-terminal contact holes 25 extending through the gate insulation film 13 and the interlayer insulation film 24 are provided in locations overlapping the gate terminals 4 and lying inside the gate-terminal-region opening portions 9 as seen in plan view. In the source terminal region RS, source-terminal contact holes 26 extending through the interlayer insulation film 24 are provided in locations overlapping the upper-layer source terminals 20.

As shown in FIG. 1, a fourth conductive layer C4 is further provided as a layered structure on the third insulation layer D3 in the first preferred embodiment. The counter electrode 31 included in the fourth conductive layer C4 is provided on part of the interlayer insulation film 24 which overlaps the pixel electrodes 22 in the pixel electrode portions RE. Part of the counter electrode 31 is electrically connected to the common electrodes 6 provided thereunder through the common-electrode contact holes 30. This provides a constant potential (common potential) signal supplied from the common electrodes 6 to the counter electrode 31. Like the gate electrodes 2 or the gate interconnect lines 3, the common electrodes 6 are formed by the first conductive layer C1 The first conductive layer C1 is made of a material having a resistance lower than that of the transparent conductive material such as IZO constituting the counter electrode 31. Examples of the material of the first conductive layer C1 include metals such as Cu and alloys thereof. The common electrodes 6 extend in a horizontal direction in FIG. 3 throughout the entire pixel regions RP. A common potential is applied from the common electrodes 6 to a plurality of positions of the counter electrode 31, whereby the potential distribution of the counter electrode 31 is made uniform even if the TFT substrate 701 has a relatively large display area.

The counter electrode 31 (FIG. 2) is disposed so as to be opposed to the greater region of the pixel electrodes 22 (FIG. 3) as seen in plan view. As shown in FIG. 2, the counter electrode 31 in the first preferred embodiment extends over the plurality of pixel regions RP each surrounded by one gate interconnect line 3, one common electrode 6, and two adjacent source interconnect lines 5. Thus, if the conduction failure of the common potential signal occurs in one of the pixel regions RP, for example, due to contact failure of the common electrode 6 and the counter electrode 31 in the common-electrode contact hole 30, the common potential signal is supplied from its adjacent pixel region RP to the counter electrode 31. This prevents display failure (point defects) pixel by pixel.

The slit opening portions SL are provided in the counter electrode 31. Thus, when a signal voltage is applied between the pixel electrodes 22 and the counter electrode 31, an electric field in a substantially horizontal direction with reference to the substrate surface is generated over the counter electrode 31. This makes the TFT substrate 701 applicable to FFS mode LCDs made to horizontal electric field driving specifications. Comb tooth shaped openings may be provided in place of the slit opening portions SL.

In the gate terminal region RG and the source terminal region RS, the gate terminal pads 32 and the source terminal pads 33 which are included in the fourth conductive layer C4 are provided respectively in the gate-terminal contact holes 25 and the source-terminal contact holes 26 which are provided in the interlayer insulation film 24.

A transparent conductive layer made of an oxide is used as the fourth conductive layer C4 in the first preferred embodiment, and an IZO layer is used in the example. Thus, both of the pixel electrodes 22 and the counter electrode 31 are permeable to light. In the gate terminal region RG or the source terminal region RS, a good (separation-free) connection is ensured between a driving IC (integrated circuit)

terminal for signal input and a gate terminal or a source terminal. This improves the reliability of IC mounting.

The TFT substrate 701 according to the first preferred embodiment is configured as mentioned above, and may be used as a TFT substrate for FFS mode LCDs capable of light transmission type image display.

(Configuration of Display Device Having TFT Substrate)

Figure 4:
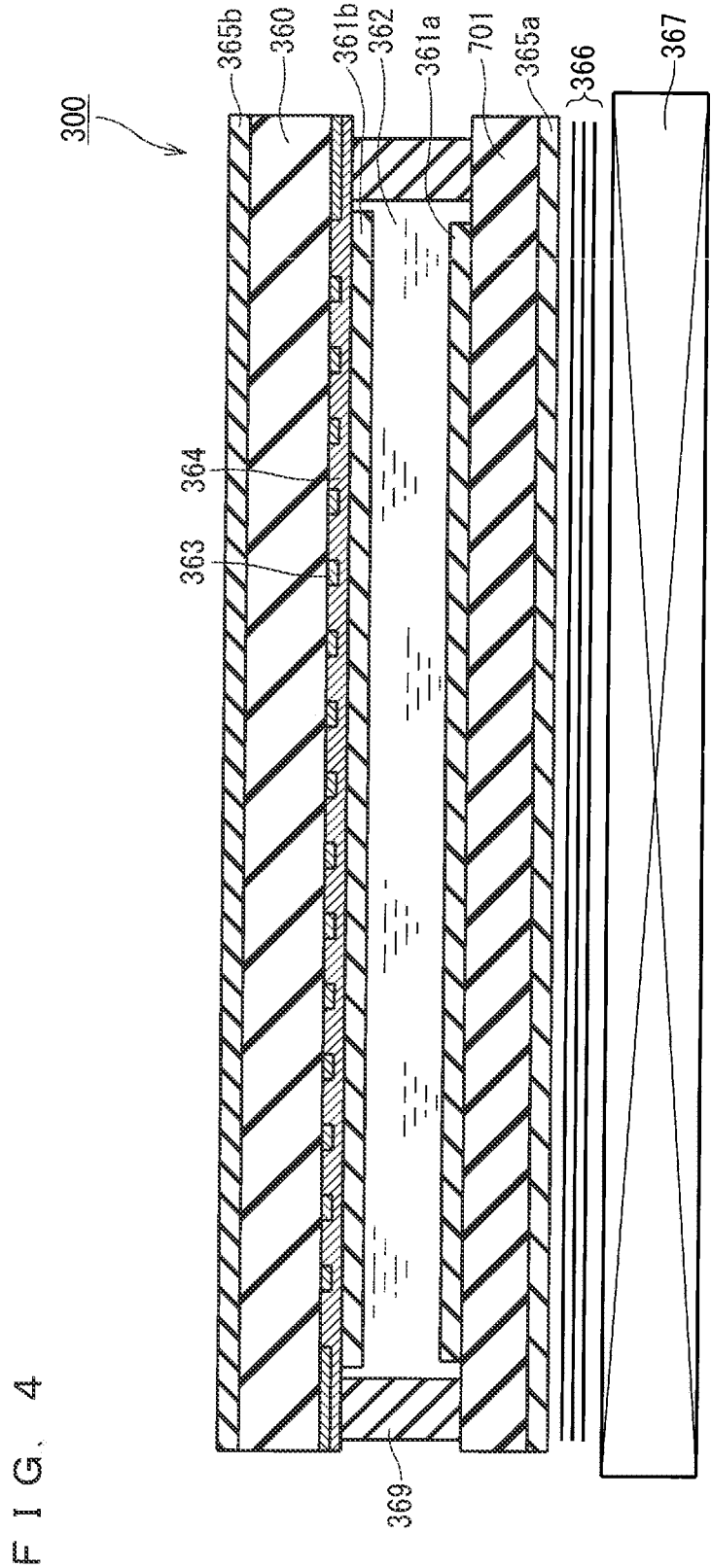
FIG. 4 is a schematic sectional view showing a configuration of a display device according to the first preferred embodiment of the present invention.

FIG. 4 is a schematic sectional view showing a configuration of a LCD 300 (display device) according to the first preferred embodiment of the present invention. The LCD 300 is configured as a FFS mode LCD by having the aforementioned TFT substrate 701. The LCD 300 further includes alignment films 361*a* and 361*b*, a liquid crystal layer 362, a counter substrate 360, a seal 369, polarizing plates 365*a* and 365*b*, optical films 366, and a backlight 367.

The alignment film 361*a* is provided on the counter electrode 31 (FIG. 1) of the TFT substrate 701. The liquid crystal layer 362 is provided on the alignment film 361*a*. The alignment film 361*b* is provided on the liquid crystal layer 362. The alignment film 361*b* is provided on the counter substrate 360. The counter substrate 360 on which the alignment film 361*b* is provided is opposed to the TFT substrate 701 in spaced apart relation to the TFT substrate 701. These alignment films are made of polyimide, for example. The counter substrate 360 is disposed on a viewing side. The counter substrate 360 is provided with a color filter 364 and a black matrix 363. With this configuration, the liquid crystal layer 362 is held between the TFT substrate 701 and the counter substrate 360.

Further, the polarizing plates 365*a* and 365*b* are provided respectively on the outside surfaces of the TFT substrate 701 and the counter substrate 360. The polarizing plates 365*a* and 365*b* are preferably disposed in a crossed Nicols arrangement. The backlight 367 is disposed on the back surface side of the TFT substrate 701 that is a non-viewing side (the side opposite from the viewing side) of a liquid crystal display panel, with the optical films 366 including a retardation film and the like therebetween. The liquid crystal display panel and these peripheral members may be housed in a frame (not shown) made of resin, metal, or the like.

The TFT substrate 701 adjusts the alignment direction of the liquid crystal layer 362 to thereby control the polarization state of light passing through the liquid crystal layer 362. Specifically, light from the backlight 367 is caused to become linearly polarized light by the polarizing plate 365*a* on the TFT substrate 701 side. This linearly polarized light passes through the liquid crystal layer 362, whereby the polarization state is changed. The intensity of light passing through the polarizing plate 365*b* on the counter substrate 360 side is changed in accordance with this polarization state. The alignment direction of the liquid crystal layer 362 is changed by a display voltage applied to the source terminal pads 33 (FIG. 1) of the TFT substrate 701. Thus, the intensity of light passing through the polarizing plate 365*b* is changed by controlling the display voltage. Thus, the process of liquid crystal display is performed.

(Manufacturing Method)

Next, a method of manufacturing the TFT substrate 701 according to the first preferred embodiment will be described with reference to FIGS. 5 to 14. The figures of the final process step of the manufacture correspond to FIGS. 1 and 2.

Figure 5:
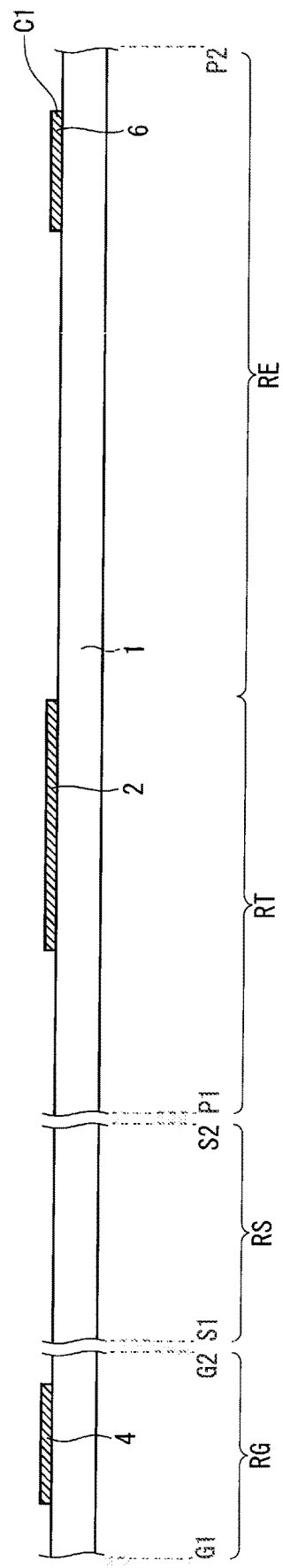
FIG. 5 is a schematic partial sectional view showing a first step of a method of manufacturing the thin film transistor substrate according to the first preferred embodiment of the present invention and taken along the lines G1-G2, S1-S2, and P1-P2 of FIG. 6.
Figure 6:
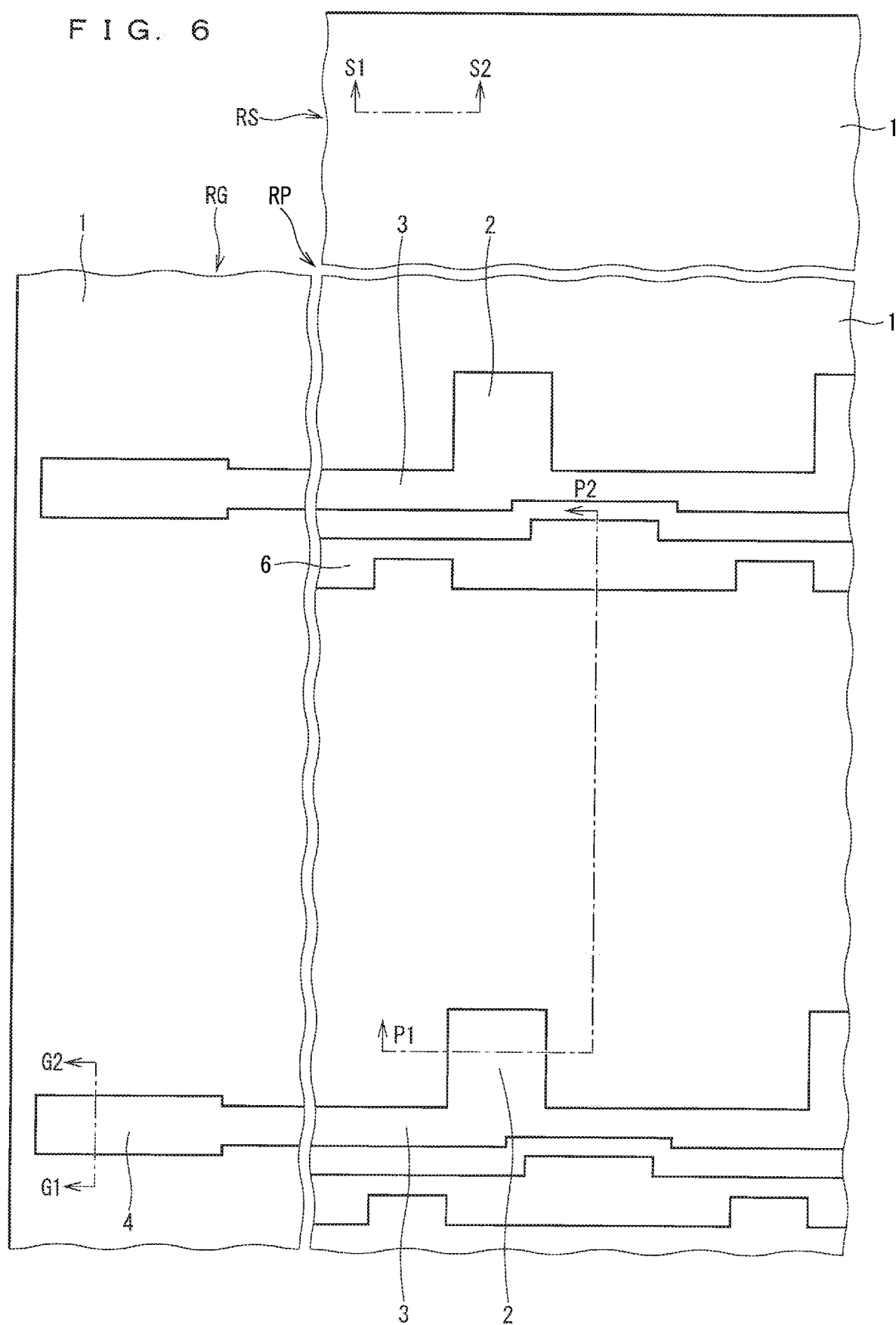
FIG. 6 is a schematic partial plan view showing the first step of the method of manufacturing the thin film transistor substrate according to the first preferred embodiment of the present invention.

(First Photolithographic Step: FIGS. 5 and 6)

First, the substrate 1 is cleaned using a cleaning liquid or pure water. In the example, a glass substrate having a thickness of 0.5 mm is used as the substrate 1. Then, the first conductive layer C1 is deposited on the cleaned substrate 1. Examples of the material of the first conductive layer C1 used herein include: metals such as chromium (Cr), molybdenum (Mo), titanium (Ti), copper (Cu), tantalum (Ta), tungsten (W), and aluminum (Al); and alloys prepared by adding at least one different element to these metal elements serving as a main component. The element serving as a main component shall refer to an element having the highest content of all elements constituting an alloy. Also, a laminated structure including at least two layers made of these metals or alloys may be used. The use of these metals or alloys provides a low-resistance conductive layer having a resistivity value of not greater than 50 μΩkm. In the example, a Cu layer serving as the first conductive layer C1 is deposited to a thickness of 200 nm by a sputtering method using argon (Ar) gas.

Thereafter, a photoresist material is applied onto the first conductive layer C1. A photoresist pattern is formed in the first photolithographic step including the pattern exposure and development process of the photoresist material. An organic alkaline developing solution containing 2.38 wt. % of TMAH (tetramethylammonium hydroxide), for example, is used for the development of the photoresist material. Then, the first conductive layer C1 is patterned by etching with the use of the photoresist pattern as a mask. In this process, wet etching using a solution containing ammonium persulfate may be used. Thereafter, the photoresist pattern is removed. Thus, the patterns of the gate electrodes 2, the gate interconnect lines 3, the gate terminals 4, and the common electrodes 6 are formed on the substrate 1, as shown in FIGS. 5 and 6. The gate interconnect lines 3 and the common electrodes 6 are formed so as to extend parallel to each other in a horizontal direction as seen in plan view. The gate electrodes 2 are formed so as to be connected to the gate interconnect lines 3. The gate terminals 4 are formed on first end portions of the respective gate interconnect lines 3.

Figure 7:
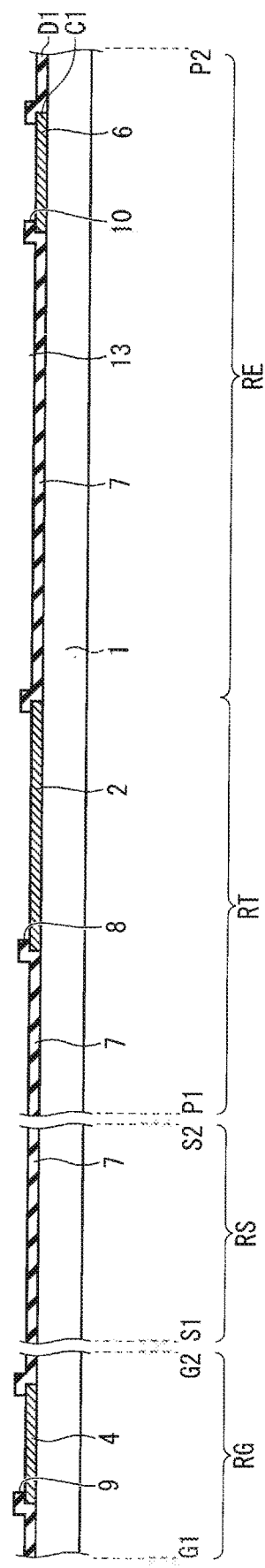
FIG. 7 is a schematic partial sectional view showing a second step of the method of manufacturing the thin film transistor substrate according to the first preferred embodiment of the present invention and taken along the lines G1-G2, S1-S2, and P1-P2 of FIG. 8.
Figure 8:
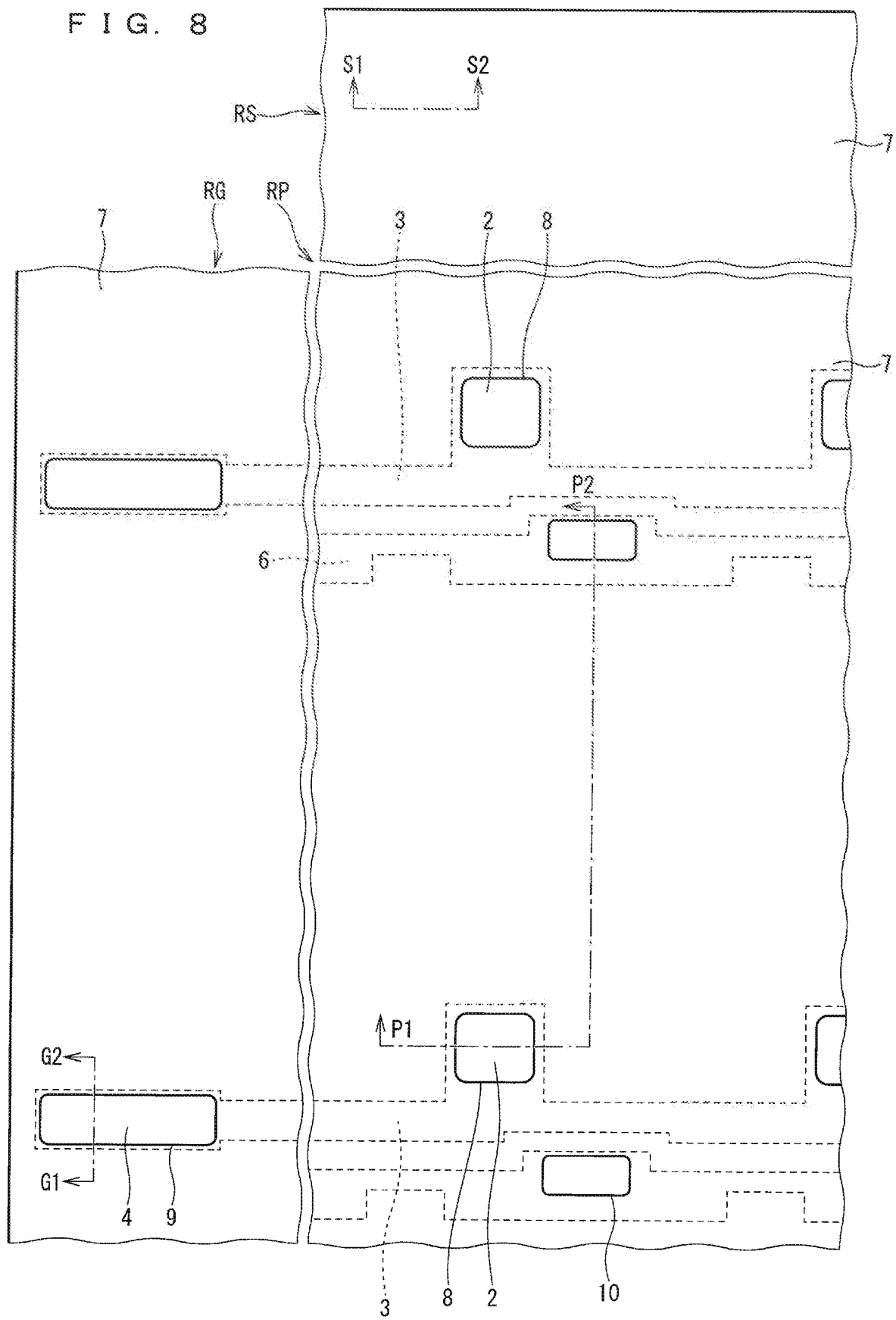
FIG. 8 is a schematic partial plan view showing the second step of the method of manufacturing the thin film transistor substrate according to the first preferred embodiment of the present invention.

(Second Photolithographic Step: FIGS. 7 and 8)

Next, the first insulation layer D1 is deposited. In the example, a SiN layer is deposited to a thickness of 400 nm as the first insulation layer D1 with the use of a PECVD method using silane ($SiH_4$) gas, ammonia ($NH_3$) gas, and nitrogen ($N_2$) gas as source gases. In general, 10 to 35 at. % of hydrogen (H) is contained in the SiN layer because the source gases containing a large amount of hydrogen (H) are used during the deposition of the SiN layer with the use of the PECVD method. On the other hand, the SiN layer has a high barrier capability (interruption capability) against moisture ($H_2O$) or impurity elements affecting the TFT properties such as Li, B, C, Na, Mg, or K. This prevents impurities contained in the substrate 1 from being diffused into the semiconductor channel films 14 to be formed later.

Thereafter, a photoresist material is applied onto the first insulation layer D1. A photoresist pattern is formed in the second photolithographic step. The first insulation layer D1 is patterned by etching with the use of the photoresist pattern as a mask. A dry etching process using a gas containing fluorine (F) may be used for this etching. A dry etching process using a gas prepared by adding oxygen ($O_2$) to sulfur hexafluoride ($SF_6$) is performed in the example. Thereafter, the photoresist pattern is removed. Thus, the opening insulation film 7 is formed, as shown in FIGS. 7 and 8. In the opening insulation film 7, the TFT-region opening portions 8 are formed in the regions which overlap the gate electrodes 2 in the TFT portions RT and in which the channel portions CN for TFTs are to be disposed. In the opening insulation film 7, the gate-terminal-region opening portions 9 are further formed in the regions which overlap the gate terminals in the gate terminal region RG, and the commonelectrode-region opening portions 10 are formed in the regions which overlap the common electrodes 6 in the pixel electrode portions RE.

Figure 9:
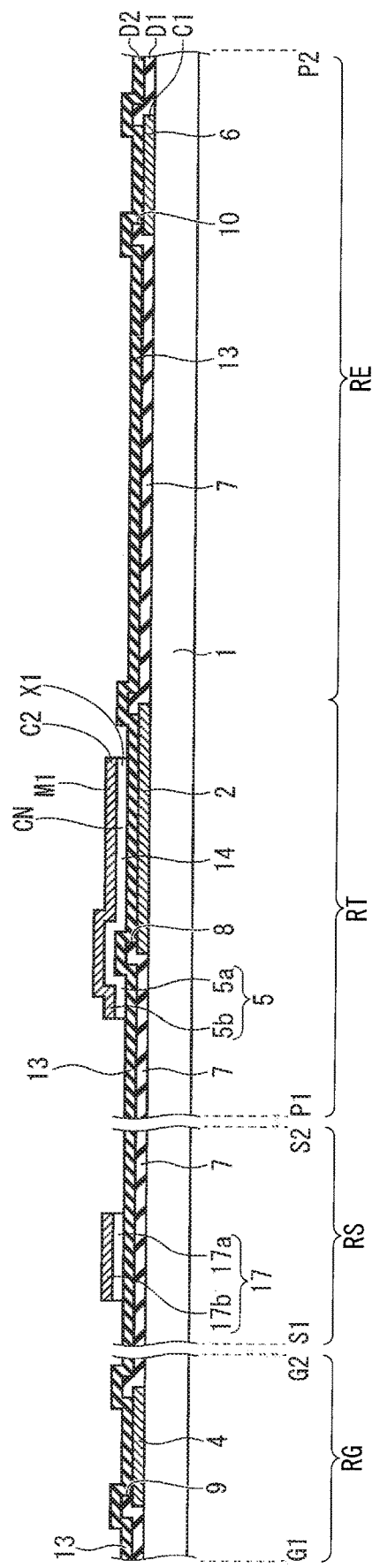
FIG. 9 is a schematic partial sectional view showing a third step of the method of manufacturing the thin film transistor substrate according to the first preferred embodiment of the present invention and taken along the lines G1-G2, S1-S2, and P1-P2 of FIG. 10.
Figure 10:
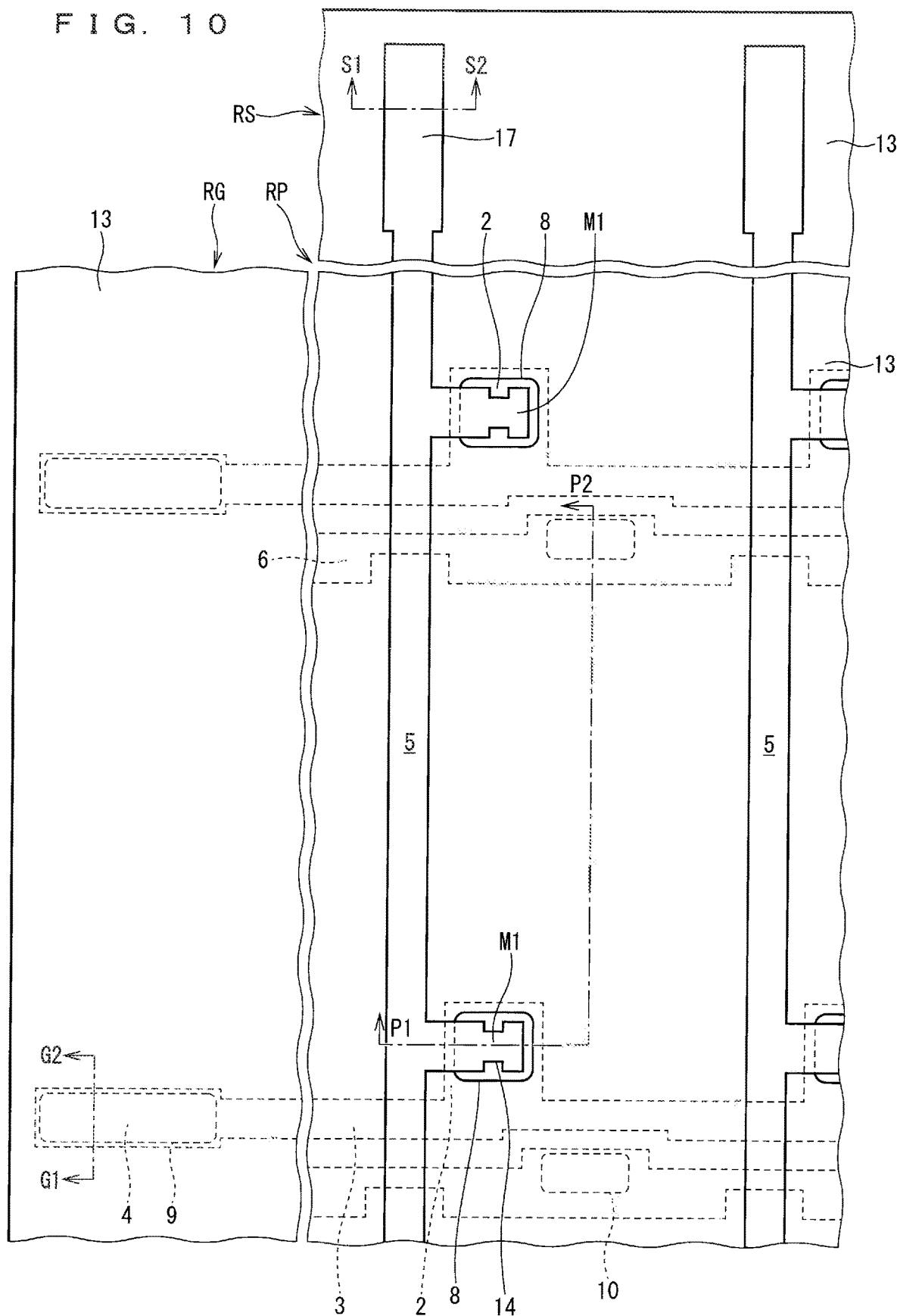
FIG. 10 is a schematic partial plan view showing the third step of the method of manufacturing the thin film transistor substrate according to the first preferred embodiment of the present invention.

(Third Photolithographic Step: FIGS. 9 and 10)

Next, the second insulation layer D2 serving as the gate insulation film 13 is deposited on the first insulation layer D1. In the example, a SiO layer is deposited to a thickness of 200 nm as the second insulation layer D2 with the use of a PECVD method using $SiH_4$ gas and nitrous oxide ($N_2O$) as raw materials. $SiH_4$ gas containing H is used as the raw material for the deposition. The concentration of H contained in the SiO layer is limited to less than 5 at. % because $NH_3$ gas is not used unlike the aforementioned deposition of the SiN layer.

Subsequently, the oxide semiconductor layer X1 is deposited on the gate insulation film 13. A sputtering method with the use of a target comprised of an oxide (e.g., InGaZnO) containing In, Ga, and Zn is used in the example. Specifically, an InGaZnO film is deposited to a thickness of 50 nm by a sputtering method using a gas mixture prepared by adding $O_2$ gas to Ar gas with the use of an In—Ga—Zn—O [$In_2O_3$. $Ga_2O_3$.2(ZnO)] target having an In:Ga:Zn:O atomic composition ratio of 1:1:1:4. In this process, an $O_2$/Ar gas partial pressure ratio is 10%. Thus, the InGaZnO layer having a resistivity value of approximately $1 \times 10^4$ Ωcm is deposited as the oxide semiconductor layer X1.

In place of the Ar gas, Ne gas or Kr gas which is a group 18 inert gas may be used for the sputtering deposition of the oxide semiconductor layer X1. In particular, the use of the Kr gas higher in atomic weight than Ar provides an InGaZnO semiconductor layer having a higher film density. This achieves the deposition of the oxide semiconductor layer X1 having stabilized properties and high reliability. Although the $O_2$/Ar gas partial pressure ratio is 10% in the above description, the partial pressure ratio may be adjusted as appropriate in accordance with the properties of a sputtering apparatus so as to provide the oxide semiconductor layer X1 having a resistivity value in the range of 0.1 Ωcm to less than $1 \times 10^6$ Ωcm, and more preferably in the range of 1 Ωcm to less than $1 \times 10^5$ Ωcm. In general, the resistivity value of a metal oxide film typified by InGaZnO based film is adjustable by changing the $O_2$/Ar (or Ne, Kr) gas partial pressure ratio during the sputtering. Specifically, the resistivity value decreases with a decrease in partial pressure ratio, and increases with an increase in partial pressure ratio.

Next, the second conductive layer C2 is deposited on the oxide semiconductor layer X1. In the example, a Cu layer similar to the first conductive layer C1 is used as the second conductive layer C2. Specifically, a Cu layer having a thickness of 200 nm is deposited by a sputtering method using Ar gas.

Thereafter, a photoresist material is applied onto the second conductive layer C2. A photoresist pattern is formed in the third photolithographic step. The second conductive layer C2 and the oxide semiconductor layer X1 are patterned by etching in sequential order with the use of the photoresist pattern as a mask. In the example, the second conductive layer C2 is initially etched by a wet etching process using a solution containing ammonium persulfate. Subsequently, the oxide semiconductor layer X1 is etched by a wet etching process using a solution containing oxalic acid. Thereafter, the photoresist pattern is removed. Thus, the semiconductor channel films 14 and the terminal lower-layer portion 17a are formed from the oxide semiconductor layer X1 on the gate insulation film 13 in the TFT portions RT and the source terminal regions RS, respectively, as shown in FIGS. 9 and 10. Also, a pattern M1 and the terminal upper-layer portion 17b laminated on the semiconductor channel films 14 and the terminal lower-layer portion 17a, respectively, are formed from the second conductive layer C2.

The semiconductor channel films 14 included in the oxide semiconductor layer X1 in the TFT-region opening portions 8 in the TFT portions RT are formed on the gate electrode, with only the gate insulation film 13 therebetween, rather than the first insulation layer D1 therebetween. The pattern M1 which becomes the source and drain electrodes in a subsequent step is formed from the second conductive layer C2 on the semiconductor channel films 14. The pattern M1 has the same shape as the semiconductor channel films 14 lying thereunder. Thus, channel portions are not defined at this point in time.

Laminates (FIG. 9) each comprised of the interconnect lower-layer portion 5a and the interconnect upper-layer portion 5b are formed as the source interconnect lines 5 (FIG. 10) intersecting the gate interconnect lines 3 and the common electrodes 6 and extending in a vertical direction as seen in plan view. The source terminals 17 are formed in first end portions of the respective source interconnect lines 5. Laminates comprised of the semiconductor channel films 14 and the pattern M1 (FIG. 9) are formed so as to branch off from the source interconnect lines 5 and extend inwardly of the TFT-region opening portions 8 on the gate electrodes 2, as shown in FIG. 10.

Figure 11:
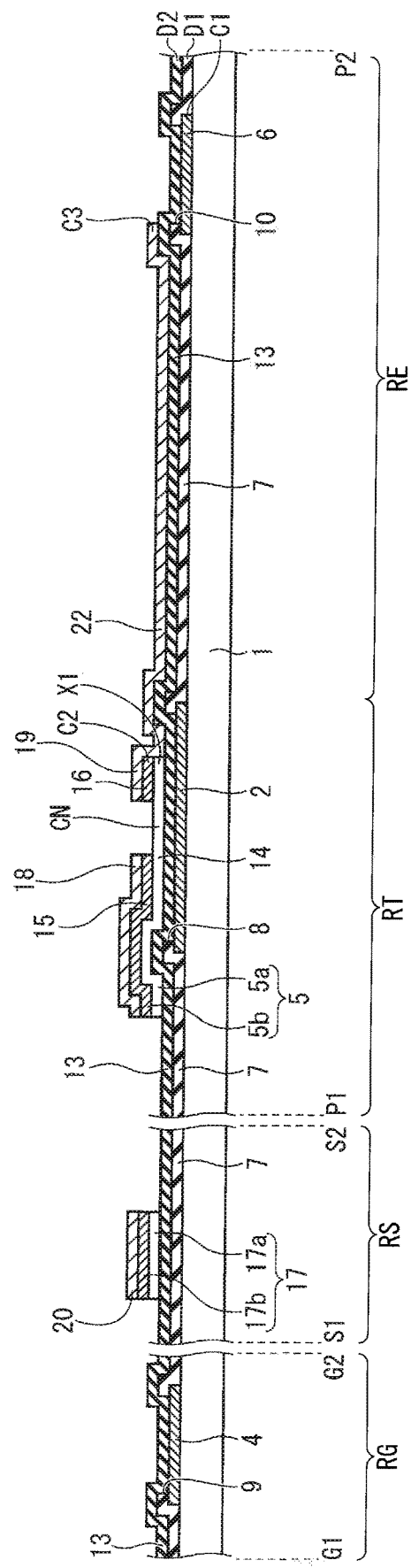
FIG. 11 is a schematic partial sectional view showing a fourth step of the method of manufacturing the thin film transistor substrate according to the first preferred embodiment of the present invention and taken along the lines G1-G2, S1-S2, and P1-P2 of FIG. 12.
Figure 12:
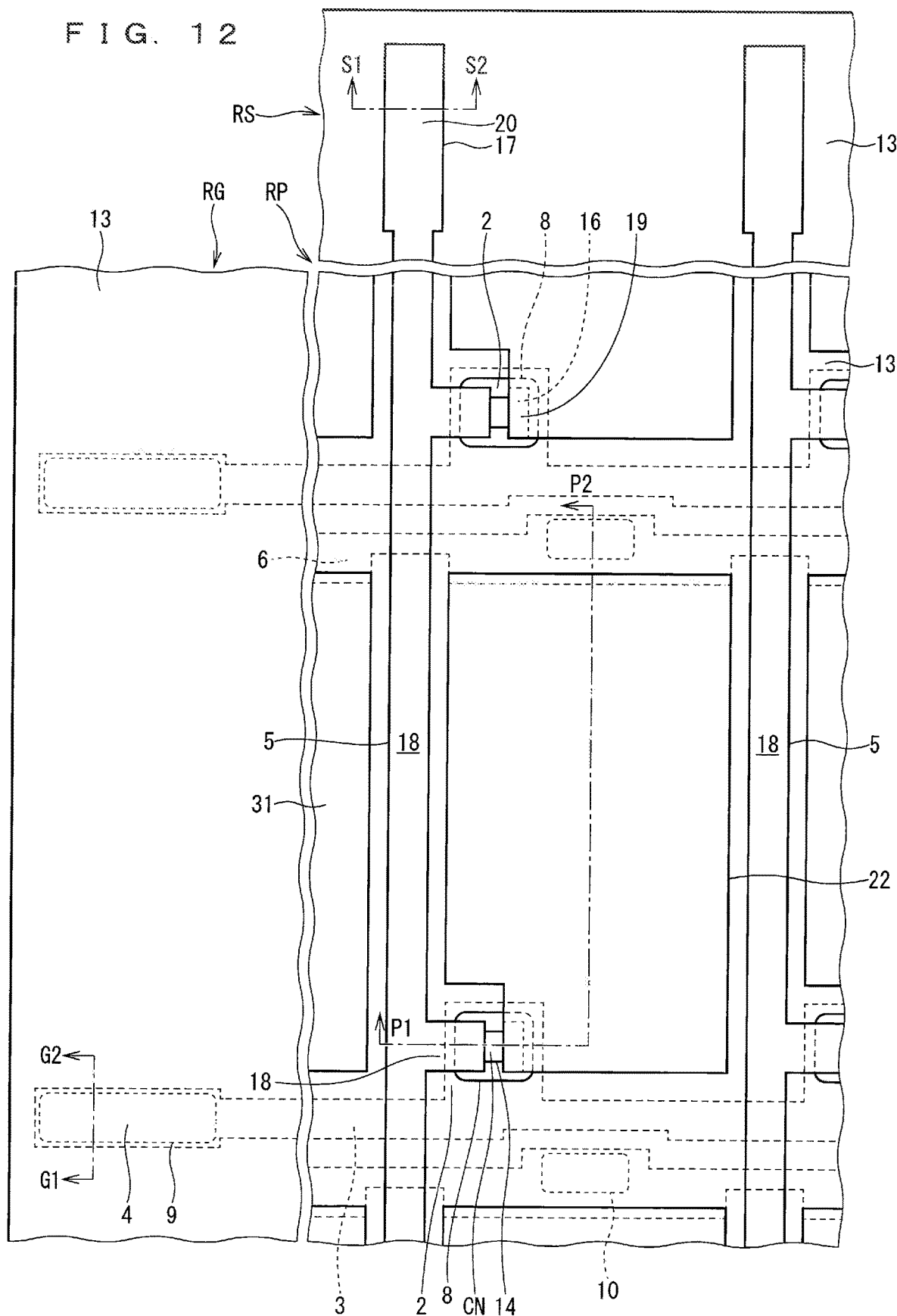
FIG. 12 is a schematic partial plan view showing the fourth step of the method of manufacturing the thin film transistor substrate according to the first preferred embodiment of the present invention.

(Fourth Photolithographic Step: FIGS. 11 and 12)

Next, the third conductive layer C3 is deposited. In the example, an IZO layer that is a transparent conductive layer made of an oxide is deposited. Specifically, the IZO layer is deposited to a thickness of 100 nm by a sputtering method using a gas mixture prepared by adding $O_2$ gas to Ar gas with the use of an IZO target having a 90:10 mixture ratio (wt. %) of the indium oxide ($In_2O_3$) to zinc oxide (ZnO).

Thereafter, a photoresist material is applied onto the third conductive layer C3. A photoresist pattern is formed in the fourth photolithographic step. The third conductive layer C3 and the second conductive layer C2 are patterned by etching in sequential order with the use of the photoresist pattern as a mask. In the example, the third conductive layer C3 is initially etched by a wet etching process using a solution containing oxalic acid. Further, part of the second conductive layer C2 which lies on the channel portions CN of the semiconductor channel films 14 is removed by a wet etching process using a solution containing ammonium persulfate. Thereafter, the photoresist pattern is removed. Thus, the pixel electrodes 22 and the drain upper-layer electrodes 19 connected thereto are formed in the pixel regions RP each surrounded by one gate interconnect line 3, one common electrode 6, and two adjacent source interconnect lines 5, as shown in FIG. 12.

In regions overlapping the gate electrodes 2 in the TFT portions RT, the second conductive layer C2 and the third conductive layer C3 are removed so that end surfaces of a laminate comprised of the second conductive layer C2 and the third conductive layer C3 are opposed to each other in constantly spaced apart relation on the semiconductor channel films 14. This provides regions in which the surfaces of the semiconductor channel films 14 are exposed, and these regions function as the channel portions CN for TFTs. The source electrodes 15 and the drain electrodes 16 included in the second conductive layer C2 are formed with the channel portions CN therebetween. The source upper-layer electrodes 18 and the drain upper-layer electrodes 19 which are included in the third conductive layer C3 are further formed on the source electrodes 15 and the drain electrodes 16, respectively. The drain upper-layer electrodes 19 and the pixel electrodes 22 which are included in the third conductive layer C3 are integrally formed in a pattern contiguous with each other.

The source upper-layer electrodes 18 included in the third conductive layer C3 are in a continuous pattern extending via regions lying over the source interconnect lines 5 to the upper-layer source terminals 20, and are formed in the same shape as the source electrodes 15, the source interconnect lines 5, and the source terminals 17 which lie thereunder. From a different point of view, the members serving as the source electrodes, the source interconnect lines, and the source terminals can be said to be formed by laminating the oxide semiconductor layer X1, the second conductive layer C2, and the third conductive layer C3 in bottom-to-top order.

Figure 13:
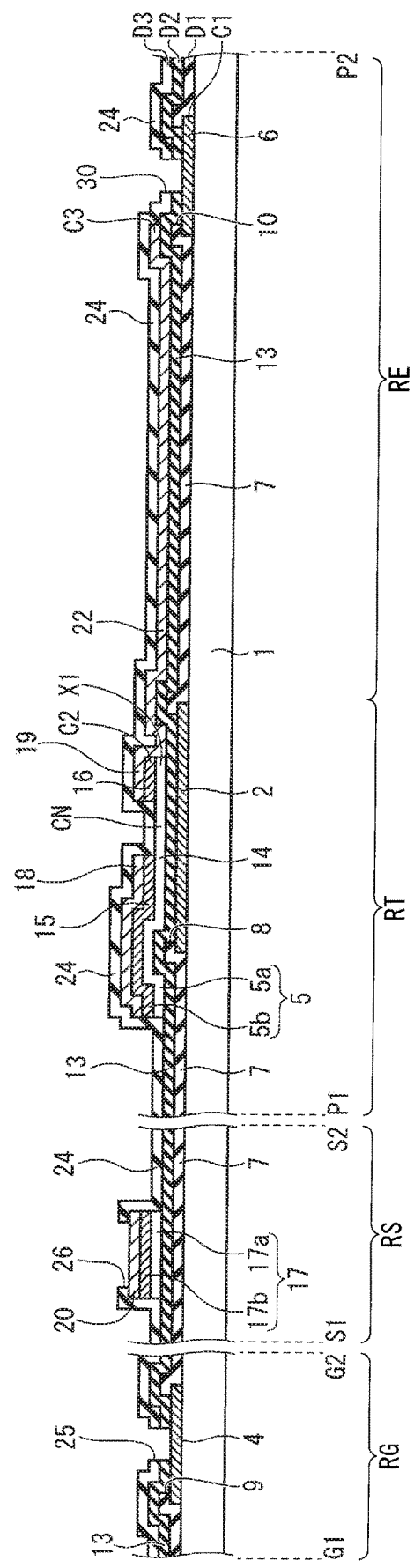
FIG. 13 is a schematic partial sectional view showing a fifth step of the method of manufacturing the thin film transistor substrate according to the first preferred embodiment of the present invention and taken along the lines G1-G2, S1-S2, and P1-P2 of FIG. 14.
Figure 14:
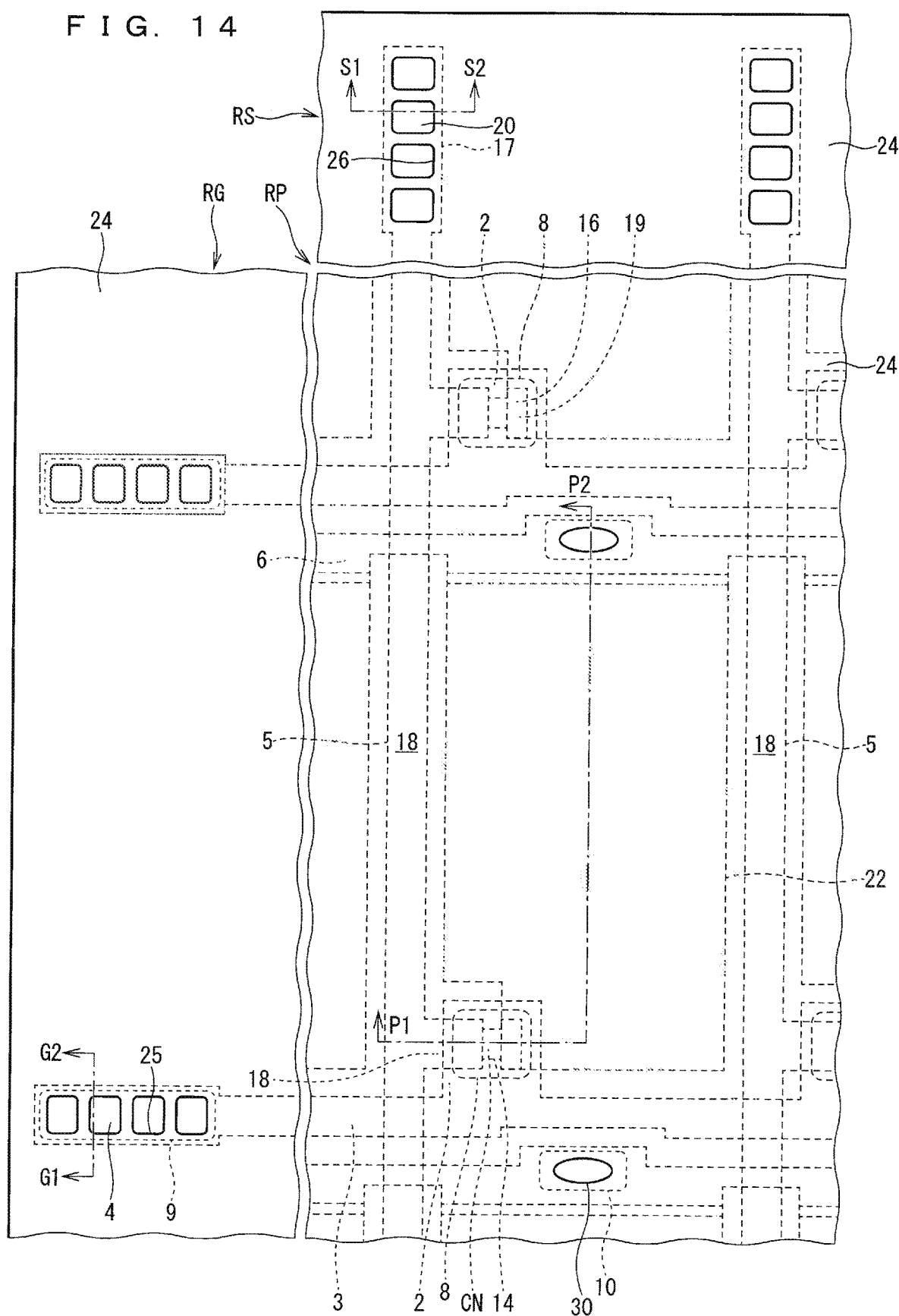
FIG. 14 is a schematic partial plan view showing the fifth step of the method of manufacturing the thin film transistor substrate according to the first preferred embodiment of the present invention.

(Fifth Photolithographic Step: FIGS. 13 and 14)

Next, the third insulation layer D3 serving as the interlayer insulation film 24 is deposited. In the example, a SiO layer is deposited to a thickness of 100 nm as the third insulation layer D3 with the use of a PECVD method using $SiH_4$ gas and $N_2O$ as raw materials in a manner similar to the second insulation layer D2. In this case, the concentration of H contained in the SiO layer may be also less than 5 at. %. If a surface of the second conductive layer C2 made of metals (e.g., Cu) or alloys is included in the surface on which the SiO layer is deposited, there are cases in which an undesirable structural defect resulting from oxygen vacancy occurs in the vicinity of an interface with the semiconductor channel films 14 in the SiO layer because the surface of the second conductive layer C2 is oxidized whereas the SiO layer is reduced. In the first preferred embodiment, the third conductive layer C3 (e.g., an IZO layer) made of an oxide is formed on the second conductive layer C2. This prevents the reduction of the SiO layer to thereby suppress the occurrence of the aforementioned structural defect.

Thereafter, a photoresist material is applied onto the third insulation layer D3. A photoresist pattern is formed in the fifth photolithographic step. The third insulation layer D3 and the second insulation layer D2 which are, for example, made of SiO in common are patterned by etching in sequential order with the use of the photoresist pattern as a mask. In the example, a dry etching process using a gas prepared by adding $O_2$ to $SF_6$ is used. Thereafter, the photoresist pattern is removed. Thus, the gate-terminal contact holes 25 and the common-electrode contact holes 30 which extend through the third insulation layer D3 and the second insulation layer D2 are formed on the gate terminals 4 in the gate terminal region RG and the common electrodes 6 in the pixel electrode portions RE, respectively, as shown in FIGS. 13 and 14. The common-electrode contact holes 30 are formed in regions which do not overlap the pattern of the pixel electrodes 22 as seen in plan view. Further, the source-terminal contact holes 26 extending through the third insulation layer D3 are formed on the upper-layer source terminals 20 in the source terminal region RS.

The gate-terminal contact holes 25 and the common-electrode contact holes 30 are formed respectively in regions inside the gate-terminal-region opening portions 9 and the common-electrode-region opening portions 10 which are previously formed in the first insulation layer D1 (e.g., a SiN layer) in the second photolithographic step as seen in plan view. Thus, the gate-terminal contact holes 25 and the common-electrode contact holes 30 are formed only by etching the second insulation layer D2 and the third insulation layer D3 without etching the first insulation layer D1. This allows the side surfaces of the contact holes to be finished in a uniform shape. If contact holes are formed in a laminated film comprised of different insulation film materials, the side surfaces of the contact holes are prone to become uneven surfaces in an irregular shape or in the shape of notches typically because of differences in etching rate or in how the etching proceeds. On such uneven surfaces, the fourth conductive layer C4 to be deposited in a subsequent step has poor coverage. The first preferred embodiment suppresses such nonuniformity. This effect is enhanced, in particular, when the second insulation layer D2 and the third insulation layer D3 are made of a common material (e.g., the layers D2 and D3 are SiO layers).

(Sixth Photolithographic Step: FIGS. 1 and 2)

Next, the fourth conductive layer C4 is deposited. In the example, an IZO layer is deposited to a thickness of 100 nm as the fourth conductive layer C4 by a sputtering method in a manner similar to the third conductive layer C3.

Thereafter, a photoresist material is applied onto the fourth conductive layer C4. A photoresist pattern is formed in the sixth photolithographic step. The fourth conductive layer C4 is patterned by etching with the use of the photoresist pattern as a mask. In the example, a wet etching process using a solution containing oxalic acid is used. Thereafter, the photoresist pattern is removed. Thus, the counter electrode 31, the gate terminal pads 32, and the source terminal pads 33 are formed respectively in the pixel regions RP, the gate terminal region RG, and the source terminal region RS, as shown in FIG. 1 or 2.

The counter electrode 31 is connected directly to the common electrodes 6 through the common-electrode contact holes 30. The slit opening portions SL are formed in a region of the counter electrode 31 which overlaps the pixel electrodes 22 as seen in plan view. The gate terminal pads 32 are connected to the gate terminals 4 through the gate-terminal contact holes 25. The source terminal pads 33 are connected to the upper-layer source terminals 20 through the source-terminal contact holes 26.

The manufacture of the TFT substrate 701 according to the first preferred embodiment is completed through the aforementioned steps.

For assembly of a liquid crystal display panel, an alignment film and a spacer are formed on a surface of the TFT substrate 701 manufactured as described above. The alignment film is a film for arranging liquid crystal, and is made of polyimide or the like. A separately manufactured counter substrate having a color filter, an alignment film, and the like is affixed to the TFT substrate 701. At this time, a gap is formed between the TFT substrate 701 and the counter substrate by the spacer. A liquid crystal layer is sealed in the gap. This provides a FFS mode liquid crystal display panel of a horizontal electric field type. Finally, polarizing plates, a retardation film, a driving circuit, a backlight unit, and the like are disposed on the outside of the liquid crystal display panel, whereby an LCD (FIG. 4) is completed.

(Summary of Method of Manufacturing Thin Film Transistor Substrate)

In summary, the aforementioned method of manufacturing the TFT substrate 701 generally includes the following steps.

(A) With reference to FIGS. 5 and 6, the first conductive layer C1 is deposited on the substrate 1. The gate electrodes 2 provided in the respective TFT portions RT and each having side surfaces, and the gate interconnect lines 3 connected to the gate electrodes 2 and extending in one direction in the pixel regions RP are formed from the first conductive layer C1.

(B) With reference to FIGS. 7 and 8, the first insulation layer D1 is then deposited so as to cover the substrate 1. The opening insulation film 7 is formed from the first insulation layer D1. The opening insulation film 7 is in contact with the side surfaces of the gate electrodes 2. The TFT-region opening portions 8 (first opening portions) having side surfaces on the gate electrodes 2 are provided in the opening insulation film 7.

(C) With reference to FIGS. 9 and 10, the second insulation layer D2 made of an oxide insulator different from the material of the first insulation layer D1 is then deposited on the gate electrodes 2 and the opening insulation film 7. Thus, the gate insulation film 13 is formed.

(D) Next, the oxide semiconductor layer X1 and the second conductive layer C2 are deposited in sequential order on the gate insulation film 13. Thus, a laminate comprised of the oxide semiconductor layer X1 and the second conductive layer C2 is formed. This laminate is patterned. Thus, the semiconductor channel films 14 encompassed by the respective TFT-region opening portions 8 of the opening insulation film 7 as seen in plan view are formed from the oxide semiconductor layer X1, and the source interconnect lines 5 intersecting the gate interconnect lines 3 as seen in plan view are formed from the laminate.

(E) With reference to FIGS. 11 and 12, the third conductive layer C3 made of an oxide is then deposited. Next, the third conductive layer C3 and the second conductive layer C2 are patterned. Thus, the source electrodes 15 and the drain electrodes 16 are formed from the second conductive layer C2 on the upper surfaces of the semiconductor channel films 14. The source upper-layer electrodes 18 and the drain upper-layer electrodes 19 are formed from the third conductive layer C3 on the source electrodes 15 and the drain electrodes 16, respectively. The pixel electrodes 22 connected to the drain upper-layer electrodes 19 and in contact with side surfaces of the drain electrodes 16 are formed from the third conductive layer C3. Regions in which the surfaces of the semiconductor channel films 14 are exposed are formed by this patterning, so that the channel portions CN for the respective TFTs are formed.

(F) With reference to FIGS. 13 and 14, the third insulation layer D3 made of an oxide is then deposited as the interlayer insulation film 24.

(G) With reference to FIGS. 1 and 2, the fourth conductive layer C4 is then deposited. The counter electrode 31 is formed from the fourth conductive layer C4.

(Summary of Method of Manufacturing Thin Film Transistor)

In the aforementioned method of manufacturing the thin film transistor substrate 701, TFT portions RT (thin film transistors) are manufactured as part of the thin film transistor substrate 701. The method of manufacturing a TFT portion RT generally includes the following steps.

(A) With reference to FIGS. 5 and 6, the first conductive layer C1 is deposited on the substrate 1. The gate electrode 2 having side surfaces is formed from the first conductive layer C1.

(B) With reference to FIGS. 7 and 8, the first insulation layer D1 is then deposited so as to cover the substrate 1, The opening insulation film 7 in contact with the side surfaces of the gate electrode 2 and provided with the TFT-region opening portion 8 having side surfaces on the gate electrode 2 is formed from the first insulation layer D1.

(C) With reference to FIGS. 9 and 10, the second insulation layer D2 made of an oxide insulator different from the material of the first insulation layer D1 is then deposited on the gate electrode 2 and the opening insulation film 7. Thus, the gate insulation film 13 is formed.

(D) Next, the oxide semiconductor layer X1 and the second conductive layer C2 are deposited in sequential order on the gate insulation film 13. Thus, a laminate comprised of the oxide semiconductor layer X1 and the second conductive layer C2 is formed. This laminate is patterned. Thus, the semiconductor channel film 14 encompassed by the TFT-region opening portion 8 of the opening insulation film 7 as seen in plan view is formed from the oxide semiconductor layer X1.

(E) With reference to FIGS. 11 and 12, the third conductive layer C3 made of an oxide is then deposited. Next, a laminate comprised of the third conductive layer C3 and the second conductive layer C2 is patterned into two spaced portions on the upper surface of the semiconductor channel film 14. Thus, the source electrode 15 and the drain electrode 16 are formed from the second conductive layer C2 on the upper surface of the semiconductor channel film 14. The source upper-layer electrode 18 and the drain upper-layer electrode 19 are formed from the third conductive layer C3 on the source electrode 15 and the drain electrode 16, respectively. A region in which the surface of the semiconductor channel film 14 is exposed is formed by this patterning, so that the channel portion CN for the TFT is formed.

(Summary of Effects)

In the TFT substrate 701 according to the first preferred embodiment, substantially the entire surface of the substrate 1 except the TFT-region opening portions 8, the gate-terminal-region opening portions 9, and the common-electrode-region opening portions 10 which are provided respectively on the gate electrodes 2, the gate terminals 4, and the common electrodes 6 is covered with the first insulation layer D1 (e.g., a SiN layer) excellent in barrier properties (transmission blocking properties). This prevents the deterioration of the properties of the semiconductor channel films 14 resulting from the diffusion of impurities from the substrate 1. The semiconductor channel films 14 are disposed so as to be encompassed by the respective TFT-region opening portions 8 as seen in plan view. This arrangement precludes the presence of the first insulation layer D1 under the semiconductor channel films 14 to thereby prevent the semiconductor channel films 14 from being reduced under the influence of the first insulation layer D1 (e.g., the SiN layer), specifically the influence of H atoms contained in the first insulation layer D1. The gate insulation film 13 on which the semiconductor channel films 14 are forming is made of an oxide insulator (e.g., SiO). This prevents the semiconductor channel films 14 from being reduced under the influence of the gate insulation film 13. Based on the above, the TFT portions RT having good properties and high reliability are provided.

The source upper-layer electrodes 18 and the drain upper-layer electrodes 19 both made of an oxide (e.g., IZO) are provided on the upper surfaces of the source electrodes 15 and the drain electrodes 16, respectively. This suppresses the occurrence of an oxidation-reduction reaction such that the source and drain electrodes 15 and 16 are oxidized and the third insulation layer D3 is reduced near the channel portions CN to thereby prevent an undesirable structural defect resulting from oxygen vacancy from occurring in the vicinity of the interface with the semiconductor channel films 14 in the third insulation layer D3. Thus, the properties and reliability of the TFT portions RT are improved.

As shown in FIG. 3, the source upper-layer electrodes 18 extend along the source interconnect lines 5 on the source interconnect lines 5. Thus, if the source interconnect lines 5 have a break, the broken location is short-circuited by the source upper-layer electrodes 18. This reduces the occurrence of failure in the TFT substrate 701 resulting from a break in the source interconnect lines 5 to thereby increase manufacturing yields.

At least one end portion (e.g., upper and lower end portions as seen in FIG. 3) of the semiconductor channel film 14 is spaced inwardly apart from edges of the gate electrode 2 and is spaced inwardly apart from edges of the TFT-region opening portion 8 of the opening insulation film 7, as seen in plan view. This prevents the photo-deterioration of the semiconductor channel film 14 made of an oxide resulting from light coming from the back surface of the substrate 1. This effect is especially pronounced when the TFT substrate 701 is applied to a LCD having a backlight.

In the manufacture of the TFT substrate 701, the patterning shown in FIGS. 9 and 10 is performed to form the oxide semiconductor layer X1 having portions which become the semiconductor channel films 14 and the second conductive layer C2 having a portion which becomes the pattern M1 by one operation. Next, the patterning shown in FIGS. 11 and 12 is performed to form the source electrodes 15 and the drain electrodes 16 from the pattern M1, to form the source upper-layer electrodes 18 and the drain upper-layer electrodes 19, and to form the pixel electrodes 22. The combination of these patterning processes decreases the number of times of the photolithographic steps to improve production efficiency.

As show in FIGS. 11 and 12, the drain upper-layer electrodes 19 and the pixel electrodes 22 are patterned by one operation. This improves production efficiency.

As shown in FIGS. 13 and 14, the gate-terminal contact holes 25 and the common-electrode contact holes 30 are formed respectively in regions inside the gate-terminal-region opening portions 9 and the common-electrode-region opening portions 10 as seen in plan view. This allows the gate-terminal contact holes 25 and the common-electrode contact holes 30 to be formed only by etching the second insulation layer D2 and the third insulation layer D3 without etching the first insulation layer D1. Thus, the side surfaces of the contact holes are finished in a uniform shape.

Although the configuration and manufacturing method of the TFT substrate 701, i.e. a TFT substrate for a FFS mode LCD, have been described in the first preferred embodiment, the mode of the LCDs is not limited to the FFS mode. For example, a TFT substrate for a TN mode may be obtained by manufacturing the TFT substrate mainly through the first to fifth photolithographic steps. This TFT substrate is affixed to a separately produced counter substrate for a TN mode, with a liquid crystal layer therebetween. The counter substrate for a TN mode includes a counter electrode, a color filter, an alignment film, and the like. Further, a TFT substrate for an organic EL display (an OLED display or an organic light-emitting diode display) may be configured by providing a pixel display element including an anode electrode made of a conductive material (metal film) having light reflectivity and a self light emitting layer and a transparent electrode which are provided on the anode electrode and include an organic EL material, for example, in place of the pixel electrode 22 in a pixel electrode portion.

Modification of First Preferred Embodiment (Configuration)

Figure 15:
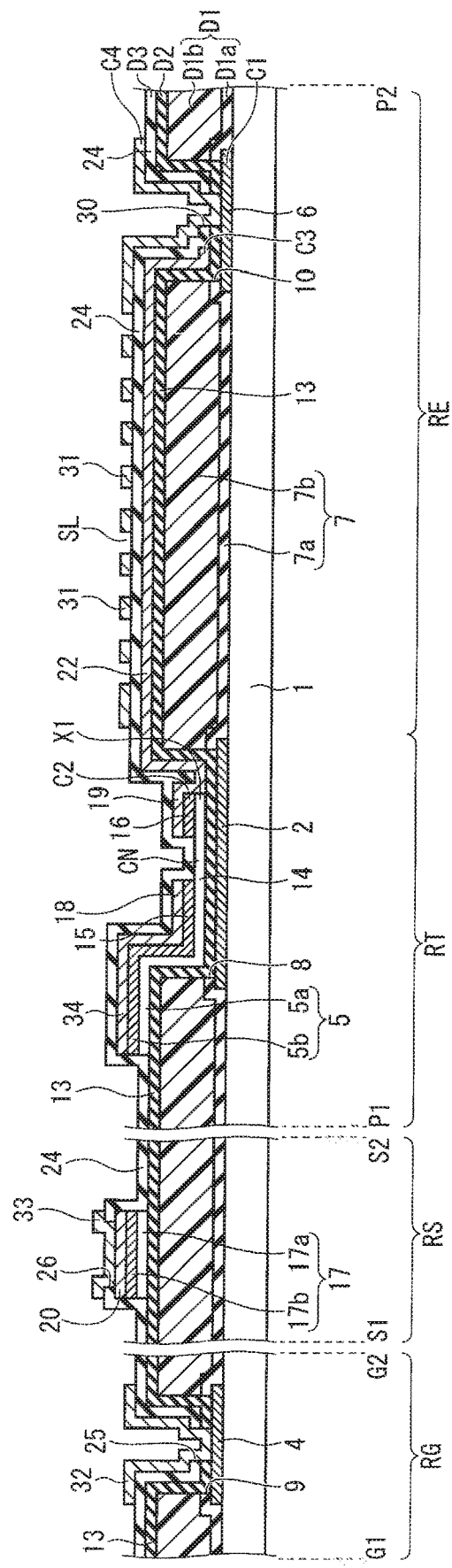
FIG. 15 is a schematic partial sectional view showing a configuration of a thin film transistor substrate according to a modification of the first preferred embodiment of the present invention and taken along the lines G1-G2, S1-S2, and P1-P2 of FIG. 16.
Figure 16:
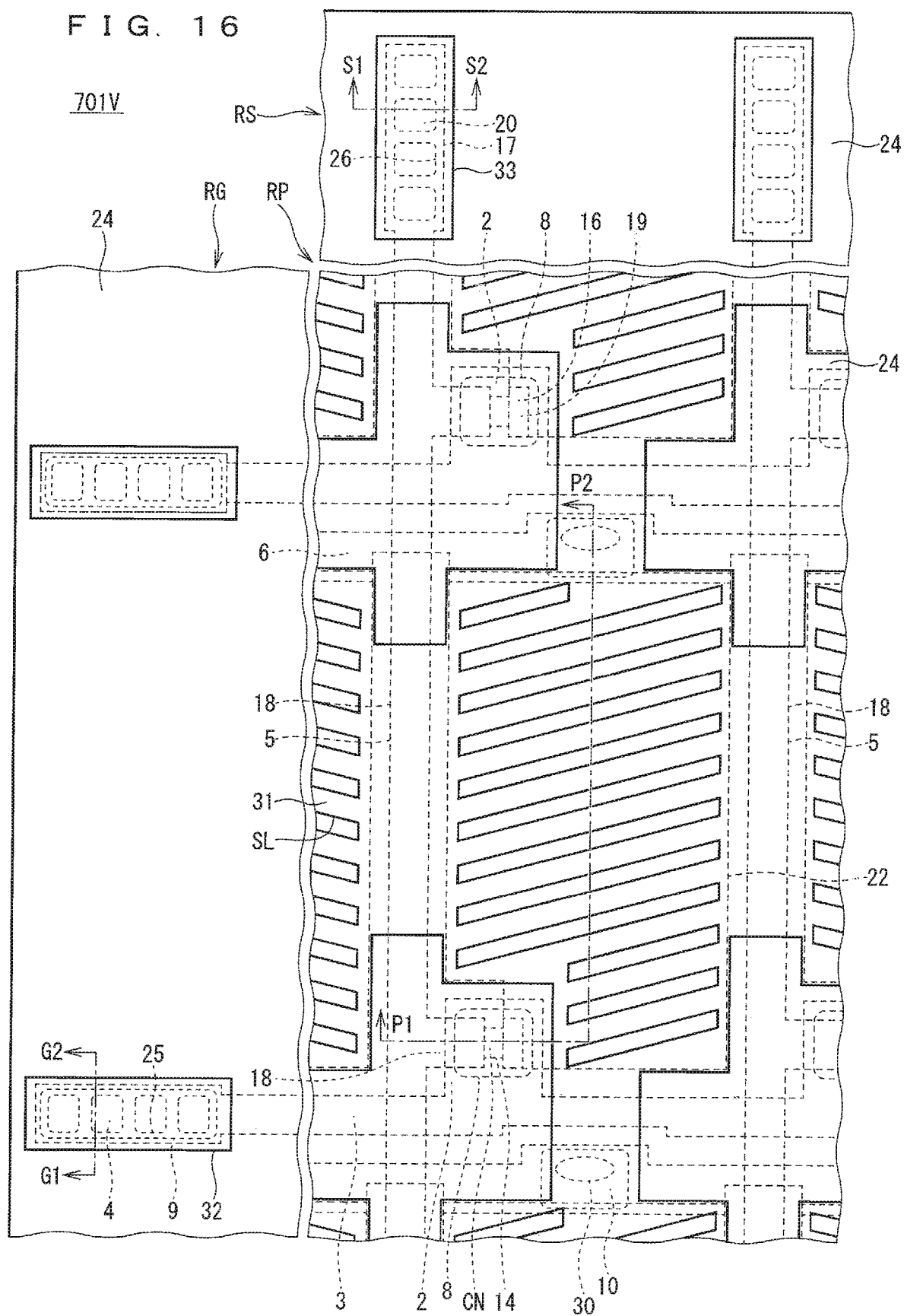
FIG. 16 is a schematic partial plan view showing the configuration of the thin film transistor substrate according the modification of the first preferred embodiment of the present invention.

FIG. 15 is a schematic partial sectional view showing a configuration of a TFT substrate 701V (thin film transistor substrate) according to a modification of the first preferred embodiment of the present invention and taken along the lines G1-G2, S1-S2, and P1-P2 of FIG. 16. In the figure, members belonging to a common layer are indicated by common hatching in a layered structure to be described later, as in FIG. 1 (the first preferred embodiment). FIG. 16 is a schematic partial plan view showing the configuration of the TFT substrate 701V. In FIG. 16, some of the members are not shown, as in FIG. 3 (the first preferred embodiment).

With reference to FIG. 15, the first insulation layer D1 in the TFT substrate 701V includes an inorganic insulation layer D1a and a resin insulation layer D1b (resin layer) which are laminated together. The inorganic insulation layer D1a is disposed on the first conductive layer C1, and the resin insulation layer D1b is disposed on the inorganic insulation layer D1a. Thus, the second insulation layer D2 in this modification is disposed on the resin insulation layer D1b. As a result of this layered structure, the opening insulation film 7 in this modification includes an inorganic insulation film 7a included in the inorganic insulation layer D1a, and a resin insulation film 7b included in the resin insulation layer D1b.

The inorganic insulation layer D1a is preferably made of a material low in moisture permeability and excellent in barrier (transmission blocking) properties. The term "barrier properties" used herein refers the properties of being less prone to allow impurity atoms (ions) contained in the substrate 1 to pass through. Examples of the impurity atoms referred to herein include lithium (Li), boron (B), carbon (C), sodium (Na), magnesium (Mg), and potassium (K). In the example, a SiN layer typically used in conventional a-Si-TFTs is used as the inorganic insulation layer D1a.

The resin insulation layer D1b is preferably made of an alkaline resin, but is not limited to this. Examples of the material of the resin insulation layer D1b used herein may include olefin, novolac, polyimide, polyamide, epoxy, and siloxane resins resistant to heat.

The pixel electrodes 22 disposed in the pixel electrode portions RE are not directly provided on the resin insulation film 7b but are provided on the resin insulation film 7b, with the gate insulation film 13 therebetween. The gate insulation film 13 is typically an inorganic film, e.g. a SiO film. If the pixel electrodes 22 are made of a transparent oxide conductor such as IZO and are provided directly on a resin insulation film, for example, as shown in FIG. 3 of Japanese Patent Application Laid-Open No. 2009-151285 mentioned above, gas (a component of the resin insulation film) emitted from the resin insulation film due to damages during the deposition of IZO is drawn into the IZO film to deteriorate electrical properties. This modification prevents such a problem.

As shown in FIG. 16, each of the common-electrode-region opening portions 10 is disposed in such a manner that a region in which the pixel electrode 22 and the common electrode 6 overlap each other is partially opened as seen in plan view. Thus, as shown in FIG. 15, part of the pixel electrode 22 has a region opposed to the common electrode 6, with only the gate insulation film 13 therebetween, rather than the opening insulation film 7 therebetween. This sufficiently ensures the storage capacitance of the pixel electrode 22.

According to this modification, the opening insulation film 7 includes the resin insulation film 7b. This allows the upper surface of the opening insulation film 7 to become more planarized in the pixel regions RP. Specifically, the irregularities of the upper surface of the opening insulation film 7 resulting from a pattern level difference between the gate electrode 2 and the common electrode 6 included in the first conductive layer C1 under the opening insulation film 7 are alleviated. This allows the pixel electrodes 22 or the counter electrode 31 to be disposed on the more planarized surface. Thus, when the TFT substrate 701V is used for TFT-LCDs, liquid crystal alignment is lost in a smaller region, whereby an effective pixel display area is increased. This provides a display device with high brightness and high definition. The structure of this modification may be applied to an OLED display including a self light emitting layer having an organic EL material in the pixel electrode portions. In such a case, the effect of increasing the effective pixel display area is produced.

The opening insulation film 7 in the form of a laminated film comprised of the inorganic insulation film 7a that is a SiN film and the resin insulation film 7b is described in this modification. However, the configuration of the opening insulation film 7 is not limited to this. While the inorganic insulation film 7a that is a SiN film has high barrier properties, the resin insulation film 7b can have somewhat high barrier properties when having a thickness approximately exceeding 1 μm, for example. In this case, the inorganic insulation film 7a may be dispensed with. In other words, the first insulation layer D1 may be comprised of only the resin insulation layer D1b.

(Manufacturing Method)

Next, a method of manufacturing the TFT substrate 701V will be described hereinafter. As in the first preferred embodiment, the first photolithographic step (FIGS. 5 and 6) is initially performed.

The inorganic insulation layer D1a is deposited on the substrate 1 on which the gate electrodes 2, the gate terminals 4, the common electrodes 6, and the like are provided in the aforementioned step. Specifically, a SiN layer having a thickness of 400 nm is deposited by a PECVD method. Next, the resin insulation layer D1b (the resin layer) is deposited on the inorganic insulation layer D1a. Specifically, the resin insulation layer D1b made of organic acrylic and permeable to light is deposited. The resin insulation layer D1b is preferably photosensitive. Specifically, a photosensitive organic alkaline resin layer is applied and formed to a thickness of 2 μm by means of a spin coating method so as to have a planarized surface. A roll coating method, a spray coating method, a slit coating method, or the like may be used in place of the spin coating method. The thickness of the photosensitive organic alkaline resin layer is not limited to 2 μm but may be set to any value in a range which ensures sufficient impurity barrier properties and surface planarity. The process described above forms the first insulation layer D1 (with reference to FIG. 15) including the inorganic insulation layer D1a and the resin insulation layer D1b.

Next, the first insulation layer D1 is patterned in the second photolithographic step. Specifically, the photosensitive organic alkaline resin layer is patterned first. Thereafter, the SiN layer lying thereunder is patterned by etching with the use of the organic alkaline resin layer as a mask. Thus, the TFT-region opening portions 8, the gate-terminal-region opening portions 9, and the common-electrode-region opening portions 10 which extend through the inorganic insulation layer D1a (the SiN layer) and the resin insulation layer D1b (the organic alkaline resin insulation layer) are formed.

Thereafter, steps similar to the third and its subsequent photolithographic steps in the method of manufacturing the TFT substrate 701 according to the first preferred embodiment are performed. Thus, the manufacture of the TFT substrate 701V according to the modification of the first preferred embodiment is completed.

In this manufacturing method, the SiN layer underlying the photosensitive resin insulation layer is etched with the use of the photosensitive resin insulation layer as a mask in the second photolithographic step. Thereafter, the photosensitive resin insulation layer D1b is used as the resin insulation film 7b that is part of the opening insulation film 7 without being removed. This achieves the manufacture of the TFT substrate 701V including the resin insulation film 7b having a planarized surface without increasing the number of photolithographic steps.

Second Preferred Embodiment

Next, a second preferred embodiment according to the present invention will be described hereinafter. In a configuration similar to that of the first preferred embodiment described above, identical or corresponding components are designated by the same reference numerals and characters, and will not be described repeatedly in some cases.

(Overview of Configuration of Thin Film Transistor Substrate)

Figure 17:
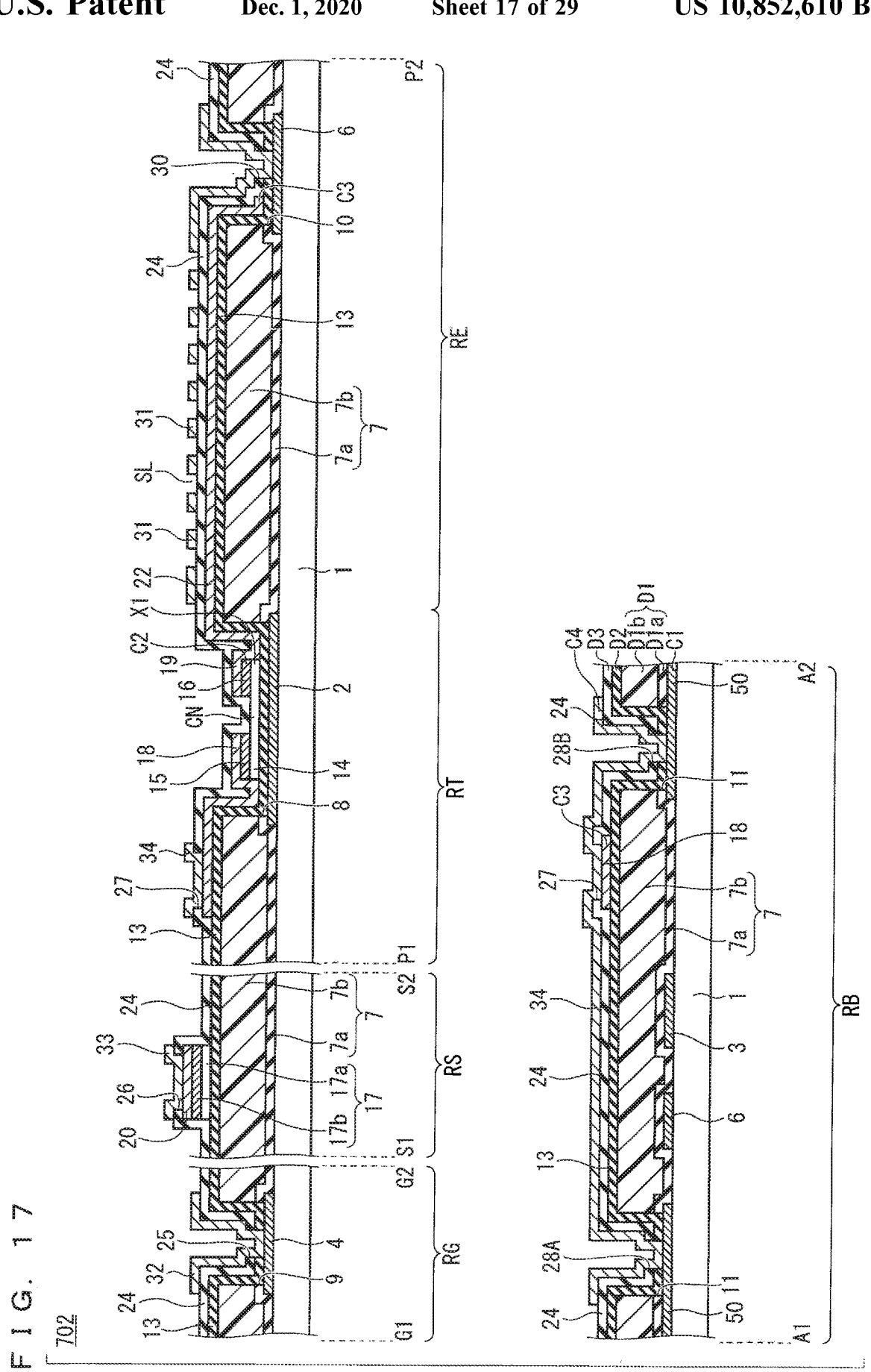
FIG. 17 is a schematic partial sectional view showing a configuration of a thin film transistor substrate according to a second preferred embodiment of the present invention and taken along the lines G1-G2, S1-S2, P1-P2, and A1-A2 of FIGS. 18 and 19.
Figure 18:
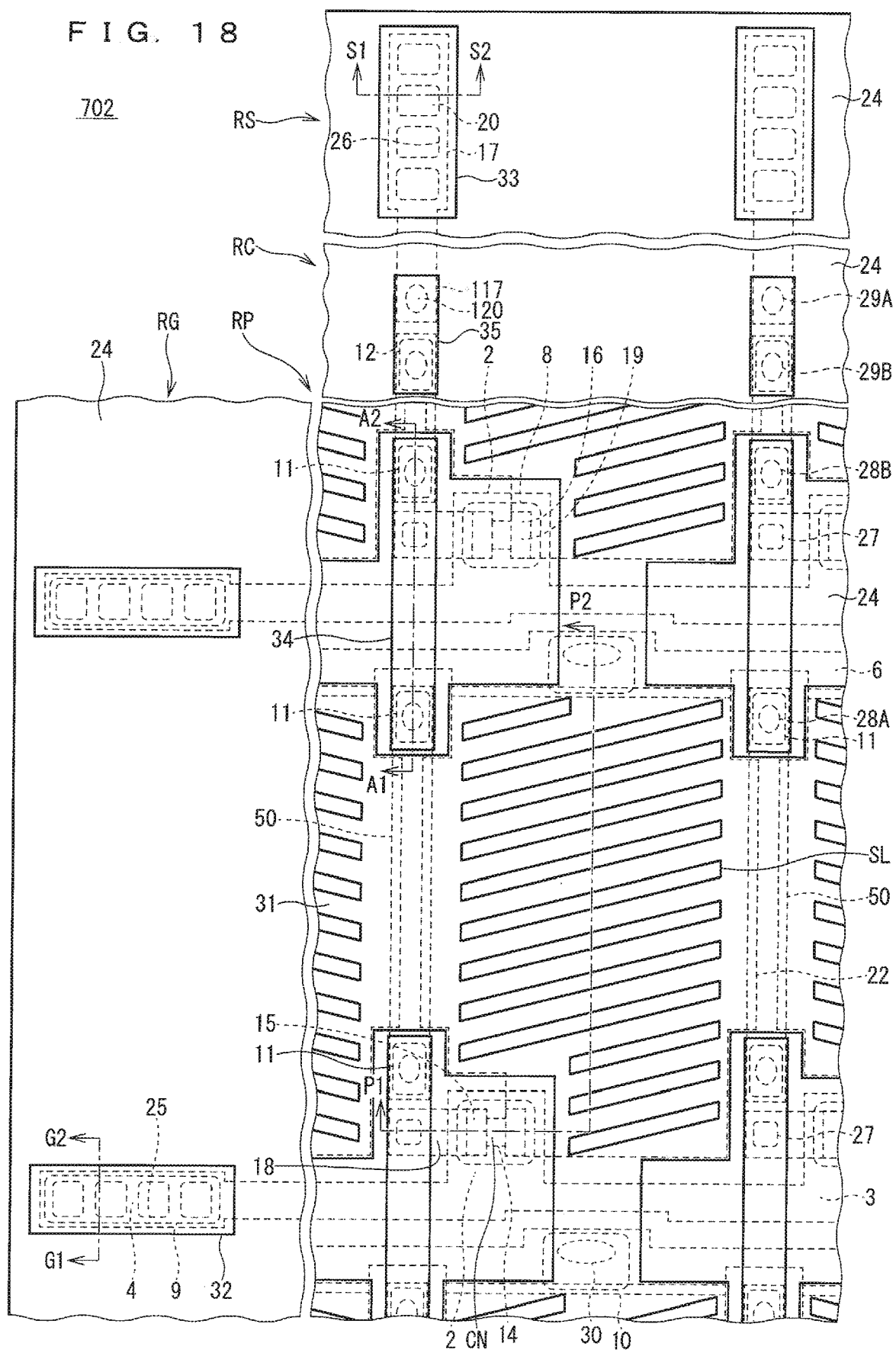
FIG. 18 is a schematic partial plan view showing the configuration of the thin film transistor substrate according the second preferred embodiment of the present invention.
Figure 19:
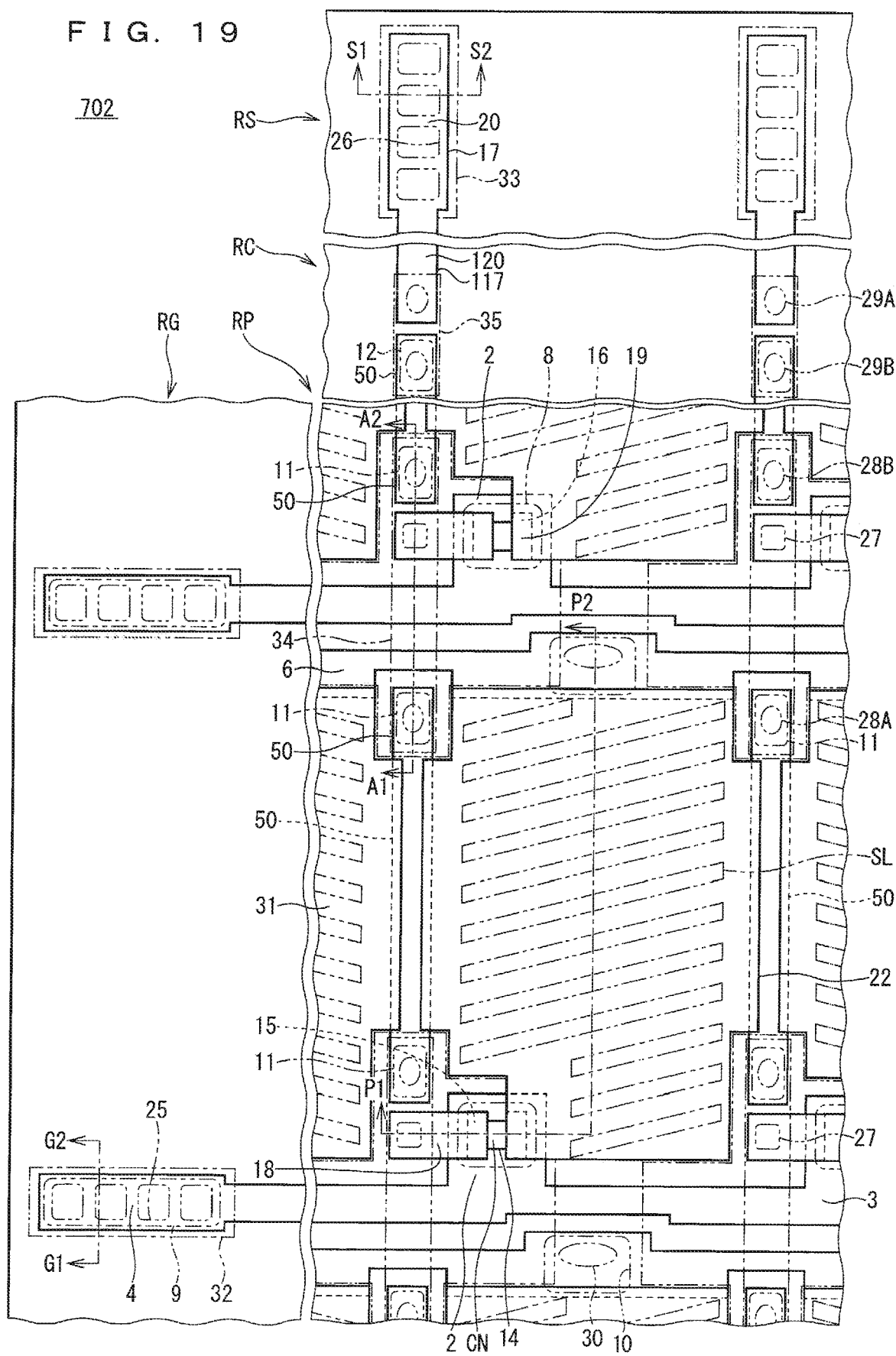
FIG. 19 is a partial plan view showing an internal configuration of the thin film transistor substrate according to the second preferred embodiment of the present invention by omitting some of the members shown in FIG. 18.

FIG. 17 is a schematic partial sectional view showing a configuration of a TFT substrate 702 (thin film transistor substrate) according to the second preferred embodiment of the present invention and taken along the lines G1-G2, S1-S2, P1-P2, and A1-A2 of FIGS. 18 and 19. Although the section taken along the line A1-A2 is drawn below the sections taken along the lines G1-G2, S1-S2, and P1-P2 because of space limitations in FIG. 17, all of these sections are positioned substantially on the same horizontal plane. In the figure, members belonging to a common layer are indicated by common hatching in a layered structure.

FIG. 18 is a schematic partial plan view showing the configuration of the TFT substrate 702. FIG. 19 is a partial plan view showing an internal configuration of the TFT substrate 702 by omitting some of the members shown in FIG. 18. Each of FIGS. 18 and 19 shows the periphery of one pixel region RP, the gate terminal region RG disposed outside all pixel regions included in the TFT substrate 702 (at the left-hand end as seen in the figures), the source terminal region RS disposed outside all pixel regions included in the TFT substrate 702 (at the upper end as seen in the figures), and a source-terminal connection region RC between the pixel region RP and the source terminal region RS.

The TFT substrate 702 includes the plurality of pixel regions RP (FIGS. 18 and 19) disposed in a matrix as seen in plan view on the substrate 1 (FIG. 17), and the TFT portions RT disposed in corresponding relation to the respective pixel regions RP, as shown in FIG. 17.

The TFT substrate 702 has a layered structure shown in FIG. 17. The layered structure includes the first conductive layer C1, the first insulation layer D1 including the resin insulation layer D1b, the second insulation layer D2 made of an oxide insulator different from the material of the first insulation layer D1, the oxide semiconductor layer X1, the second conductive layer C2, the third conductive layer C3 made of an oxide, the third insulation layer D3 made of an oxide, and the fourth conductive layer C4, all of which are disposed on the substrate 1. These layers may be laminated in the order named. Each of the layers may have at least one pattern. In such a case, the layers have space as a region lying between patterns or an open region in patterns. Layers lying above and below a layer having the space may be in contact with each other through the space. A plurality of members included in the same layer may be made of a common material. The term "common material" as used herein may refer to a common laminate material. Also, the term "common material" as used herein may refer to materials having the same composition ratio or materials slightly different in composition ratio between the members. In the former case, the members can be formed by performing a simple patterning process on one layer. In the latter case, the members can be formed by locally performing some process that influences the composition on one layer after the one layer is deposited.

The TFT substrate 702 includes the plurality of gate electrodes 2 included in the first conductive layer C1, the plurality of gate interconnect lines 3 included in the first conductive layer C1, a plurality of source interconnect lines 50 included in the first conductive layer C1, the opening insulation film 7 included in the first insulation layer D1, the gate insulation film 13 included in the second insulation layer D2, the plurality of semiconductor channel films 14 included in the oxide semiconductor layer X1, the plurality of source electrodes 15 included in the second conductive layer C2, the plurality of drain electrodes 16 included in the second conductive layer C2, the plurality of source upper-layer electrodes 18 included in the third conductive layer C3, the plurality of drain upper-layer electrodes 19 included in the third conductive layer C3, the plurality of pixel electrodes 22 included in the third conductive layer C3, the interlayer insulation film 24 included in the third insulation layer D3, and a plurality of source-interconnect-line connecting lines 34 (first connecting lines) included in the fourth conductive layer C4.

The gate electrodes 2 are provided on the substrate 1. The gate electrodes 2 are provided in the respective TFT portions RT. Each of the gate electrodes 2 has side surfaces. The gate interconnect lines 3 are provided on the substrate 1. Each of the gate interconnect lines 3 are connected to some of the gate electrodes 2 which belong to a corresponding row in the matrix arrangement. Each of the gate interconnect lines 3 may extend in one direction (in a horizontal direction as seen in FIG. 19). The gate interconnect lines 3 preferably extend linearly in one direction but may extend in a zigzag fashion.

The source interconnect lines 50 are provided in spaced apart relation to the gate electrodes 2 and the gate interconnect lines 3 on the substrate 1. Each of the source interconnect lines 50 has side surfaces (with reference to FIG. 17).

The opening insulation film 7 covers the substrate 1, and is in contact with the side surfaces of the plurality of gate electrodes 2 and the side surfaces of the plurality of source interconnect lines 50. The opening insulation film 7 is provided with the plurality of TFT-region opening portions 8 (first opening portions) and a plurality of source-interconnect-line-connection-region opening portions 11 (second opening portions). Each of the TFT-region opening portions 8 has side surfaces on a corresponding one of the gate electrodes 2. Each of the source-interconnect-line-connection-region opening portions 11 has side surfaces on a corresponding one of the source interconnect lines 50. The gate insulation film 13 is provided on the gate electrodes 2 and the opening insulation film 7.

The semiconductor channel films 14 are provided on the gate insulation film 13. The semiconductor channel films 14 are encompassed by the respective TFT-region opening portions 8 of the opening insulation film 7 as seen in plan view.

The source electrodes 15 and the drain electrodes 16 are provided on the respective semiconductor channel films 14. The specific configuration of the source electrodes 15 and the drain electrodes 16 are substantially similar to that in the first preferred embodiment.

The source upper-layer electrodes 18 are provided at least on the upper surfaces of the source electrodes 15, Specifically, one source upper-layer electrode 18 is provided at least on the upper surface of one source electrode 15 in each of the pixel regions RP.

The drain upper-layer electrodes 19 are provided at least on the upper surfaces of the drain electrodes 16. Specifically, one drain upper-layer electrode 19 is provided at least on the upper surface of one drain electrode 16 in each of the pixel regions RP.

The pixel electrodes 22 are connected to the respective drain upper-layer electrodes 19. The pixel electrodes 22 are in contact with the side surfaces of the respective drain electrodes 16. Each of the pixel electrodes 22 partially overlaps at least one source interconnect line 50 as seen in plan view. Specifically, each of the pixel electrodes 22 partially overlaps at least one source interconnect line 50, preferably two source interconnect lines 50, extending along edges of a corresponding one of the pixel regions RP.

The interlayer insulation film 24 has a portion provided on the source upper-layer electrodes 18 and the drain upper-layer electrodes 19. The interlayer insulation film 24 is in contact with the semiconductor channel films 14. The interlayer insulation film 24 is provided with a plurality of source-electrode-connection contact holes 27 (first contact holes) extending to the respective source upper-layer electrodes 18. The interlayer insulation film 24 and the gate insulation film 13 are provided with a plurality of source-interconnect-line-connection contact holes 28 (second contact holes) extending to the source interconnect lines 50 in the respective source-interconnect-line-connection-region opening portions 11 of the opening insulation film 7.

The respective source-interconnect-line connecting lines 34 are electrically connected to the source upper-layer electrodes 18 through the source-electrode-connection contact holes 27. The respective source-interconnect-line connecting lines 34 are electrically connected to the source interconnect lines 50 through the source-interconnect-line-connection contact holes 28.

The TFT substrate 702 may include the counter electrode 31 included in the fourth conductive layer C4. The counter electrode 31 is provided over the pixel electrodes 22, with the interlayer insulation film 24 therebetween. The counter electrode 31 has openings in the form of comb teeth or slits. In the configuration shown in FIG. 18, the counter electrode 31 has the slit opening portions SL.

In the second preferred embodiment, each of the gate interconnect lines 3 is a continuous interconnect line extending continuously, and each of the source interconnect lines 50 is an intermittent interconnect line extending intermittently. The continuous interconnect lines and the intermittent interconnect lines intersect each other in separation locations which are breaks in the intermittent interconnect lines. The source-interconnect-line connecting lines 34 (second connecting lines) included in the fourth conductive layer C4 extend over the separation locations of the intermittent interconnect lines to thereby short-circuit the separation locations of the intermittent interconnect lines. A modification may be made in which each of the source interconnect lines 50 is the continuous interconnect line extending continuously and each of the gate interconnect lines 3 is the intermittent interconnect line extending intermittently. In the second preferred embodiment, the aforementioned "first connecting lines" and the "second connecting lines" are integrated together as the source-interconnect-line connecting lines 34.

(Details on Configuration)

Next, details on the configuration of the TFT substrate 702 according to the second preferred embodiment will be described in reference to a preferred example thereof.

Like the TFT substrate 701 (in the first preferred embodiment), the TFT substrate 702 is provided for a display device and specifically for a FFS mode LCD capable of light transmission type image display. With reference to FIGS. 18 and 19, the image display is performed in an area where the pixel regions RP are arranged. The gate terminal pads 32 for applying a gate signal to the gate interconnect lines 3 are arranged in the gate terminal region RG. The source terminal pads 33 for applying a display signal to the source interconnect lines 5 are arranged in the source terminal region RS. Each of the pixel regions RP (FIGS. 18 and 19) includes the TFT portion RT, the pixel electrode portion RE in which the pixel electrodes 22 are arranged, and a source interconnect line connection portion RB.

As shown in FIG. 17, the gate electrodes 2, the gate terminals 4, and the common electrodes 6 which are included in the first conductive layer C1 are provided respectively in the TFT portions RT, the gate terminal region RG, and the pixel electrode portions RE on the substrate 1. The gate interconnect lines 3, the source interconnect lines 50, and the common electrodes 6 all of which are included in the first conductive layer C1 are provided in the source interconnect line connection portions RB.

With reference to FIG. 19, the gate interconnect lines 3 and the common electrodes 6 extend substantially parallel to each other in a horizontal direction. The gate electrodes 2 are provided in the respective TFT portions RT (FIG. 17). Some of the gate electrodes 2 which correspond to one row in the matrix arrangement of the pixel regions RP may be connected to a common one of the gate interconnect lines 3. In the configuration of FIG. 19, the gate electrodes 2 in corresponding relation to respective columns in the matrix arrangement of the pixel regions RP protrude from each of the gate interconnect lines 3. The gate terminals 4 are provided on respective first end portions of the gate interconnect lines 3.

The source interconnect lines 50 extend in a vertical direction as seen in FIG. 19. The source interconnect lines 50 are disposed so as to be split by the gate interconnect lines 3 and the common electrodes 6 which extend in a horizontal direction. The source interconnect lines 50 are disposed in spaced apart relation to the gate interconnect lines 3 and the common electrodes 6. A region surrounded by one gate interconnect line 3, one common electrode 6, and two source interconnect lines 50 serves as one pixel region RP.

Examples of the material of the first conductive layer C1 used in the second preferred embodiment include: metals such as Cu, Mo, Cr, and Al; and alloys prepared by adding other elements in trace amounts to these metals, as in the first preferred embodiment. In the example, a Cu layer is used as the first conductive layer C1.

As shown in FIG. 17, the opening insulation film 7 included in the first insulation layer D1 is provided on the substrate 1 so as to cover the gate electrodes 2, the gate terminals 4, the source interconnect lines 50, and the common electrodes 6. The configuration of the first insulation layer D1 is similar to that in the modification of the first preferred embodiment described above. That is, the first insulation layer D1 is a laminate comprised of the inorganic insulation layer D1$a$ provided on the substrate 1 and the resin insulation layer D1$b$ provided on the inorganic insulation layer D1$a$. The resin insulation layer D1$b$ is preferably made of an organic alkaline resin, but may be made of other materials. Examples of the material of the resin insulation layer D1$b$ used herein may include olefin, novolac, polyimide, polyamide, epoxy, and siloxane resins resistant to heat. These resins have a low permittivity to provide a low wiring capacitance between electrodes or between interconnect lines.

With reference to FIG. 19, the opening insulation film 7 is provided with the TFT-region opening portions 8 in regions which overlap the gate electrodes 2 and in which the channel portions CN for TFTs are disposed. The opening insulation film 7 is also provided with the gate-terminal-region opening portions 9 in regions which overlap the gate terminals 4, and the common-electrode-region opening portions 10 in regions which overlap the common electrodes 6. The opening insulation film 7 is also provided with the source-interconnect-line-connection-region opening portions 11 in regions near the opposite ends of the source interconnect lines 50. The opening insulation film 7 is also provided with source-terminal-connection-region opening portions 12 in end regions of the source interconnect lines 50 which are adjacent to source terminal interconnect lines 117. These opening portions expose the surface of the first conductive layer C1 which is made of Cu, for example. On the other hand, no opening portions are provided in regions where electrodes and interconnect line patterns included in the first conductive layer C1 are not provided. Thus, substantially the entire surface of the substrate 1 is covered with the opening insulation film 7 which is the laminate comprised of the inorganic insulation film 7$a$ (e.g., a SiN film) and the resin insulation film 7$b$. This prevents the impurity atoms contained in the substrate 1 from being diffused from the surface of the substrate 1.

As shown in FIG. 17, the gate insulation film 13 included in the second insulation layer D2 is provided on the opening insulation film 7 having the opening portions 8, 9, 10, 11, and 12 (not shown). The second insulation layer D2 is preferably made of an oxide insulator so that the semiconductor channel films 14 included in the oxide semiconductor layer X1 are not reduced, i.e. so that the semiconductor channel films 14 are not deprived of oxygen atoms, as in the first preferred embodiment. In the example, a SiO layer is used as the second insulation layer D2.

The semiconductor channel film 14 included in the oxide semiconductor layer X1 and the source and drain electrodes 15 and 16 included in the second conductive layer C2 on the semiconductor channel film 14 are provided on the gate insulation film 13 in each TFT portion RT. The source terminal 17 that is a laminate comprised of the terminal lower-layer portion 17$a$ included in the oxide semiconductor layer X1 and the terminal upper-layer portion 17$b$ included in the second conductive layer C2 is provided in the source terminal region RS. In the example, an InGaZnO layer is used as the oxide semiconductor layer X1, and the same Cu layer as the first conductive layer C1 is used as the second conductive layer C2, as in the first preferred embodiment.

As shown in FIGS. 17 and 19, the pattern of the semiconductor channel films 14 included in the oxide semiconductor layer X1 and the pattern of the source and drain electrodes 15 and 16 included in the second conductive layer C2 have outer edges of the same shape as seen in plan view except the channel portions CN. These outer edges are disposed inside the gate electrodes 2 and inside the TFT-region opening portions 8 as seen in plan view. Further, the outer edge of the semiconductor channel films 14 in the second preferred embodiment coincides with the outer edge of the oxide semiconductor layer X1 including the semiconductor channel films 14. Thus, the outer edge of the oxide semiconductor layer X1 including the semiconductor channel films 14 is also inside the gate electrodes 2 and inside the TFT-region opening portions 8 as seen in plan view. With reference to FIG. 17, this prevents light coming from the backlight and entering the back surface (the lower surface as seen in the figure) during the display operation of the LCD from entering the channel portions CN due to the reflection from the source electrodes 15 or the drain electrodes 16 included in the second conductive layer C2. In particular, the second preferred embodiment is characterized in that the outer edge of the oxide semiconductor layer X1 is inside the gate electrodes 2 and inside the TFT-region opening portions 8 as seen in plan view. This prevents the light coming from the backlight from entering all of the portions of the oxide semiconductor layer X1. The second preferred embodiment therefore provides a desirable configuration in terms of the photo-deterioration of the oxide semiconductor layer X1 or in terms of the capability of preventing the deterioration of the properties of the TFTs associated with the photo-deterioration.

The source terminal interconnect lines 117 extend from first end portions (the lower end portions as seen in FIG. 19) of the respective source terminals 17 so as to overlap source-terminal connecting lines 35 (FIG. 18).

As shown in FIG. 17, the source upper-layer electrode 18 and the drain upper-layer electrode 19 both of which are included in the third conductive layer C3 are provided respectively on the source electrode 15 and the drain electrode 16 in each TFT portion RT. The source upper-layer electrode 18 is in contact with a side surface of the laminate comprised of the semiconductor channel film 14 and drain electrode 16, and extends onto the gate insulation film 13 in the source-interconnect-line connection portion RB outside the gate electrode 2. The drain upper-layer electrode 19 is provided in a pattern contiguous with the pixel electrode 22 similarly included in the third conductive layer C3 and integrally therewith. That is, the drain upper-layer electrode 19 is connected to the pixel electrode 22. The pixel electrodes 22 is in contact with a side surface of the laminate comprised of the semiconductor channel film 14 and the drain electrode 16, and extends to part of the gate insulation film 13 which lies on the pixel electrode portion RE. In the source terminal region RS, the upper-layer source terminal 20 included in the third conductive layer C3 is provided on the terminal upper-layer portion 17b of the source terminal 17.

The source upper-layer electrodes 18 included in the third conductive layer C3 (FIG. 17) protrude outwardly (leftwardly as seen in the figure) of the gate electrodes 2 as seen in plan view (FIG. 19), and extend to regions overlapping the source-interconnect-line connecting lines 34 (FIG. 18). With reference to FIG. 19, upper-layer source terminal interconnect lines 120 are provided on the source terminal interconnect lines 117 disposed on the first end portions of the source terminals 17. The pattern formed by the upper-layer source terminals 20 and the upper-layer source terminal interconnect lines 120 and the pattern formed by the source terminals 17 and the source terminal interconnect lines 117 provided thereunder have substantially the same shape.

Each of the pixel electrodes 22 (FIG. 19) is disposed in a region surrounded by one gate interconnect line 3, one common electrode 6, and two adjacent source interconnect lines 50. The pixel electrodes 22 are disposed so as to extend to regions partially overlapping part of the source interconnect lines 50. In the second preferred embodiment, not only the gate insulation film 13 but also the inorganic insulation film 7a and the resin insulation film 7b are provided under the pixel electrodes 22. For this reason, if the pixel electrodes 22 are disposed so as to overlap part of the source interconnect lines 50, failure resulting from to a short circuit between layers due to film defects or the like is less prone to occur. Also, a decrease in electrical capacitance (parasitic capacitance) between the pixel electrodes 22 and the source interconnect lines 50 suppresses signal delays resulting from the parasitic capacitance. Further, the surface planarized by the resin insulation film 7b decreases the area where liquid crystal alignment is lost to increase an effective pixel display area for use in an LCD. Thus, the effective pixel display area is made wider in the second preferred embodiment than in the first preferred embodiment and the modification of the first preferred embodiment. This provides a display device with higher brightness and higher definition. A modification according to the second preferred embodiment may be made in which the pixel electrode portions include a self light emitting layer having an organic EL material, whereby an OLED display is formed. In such a case, the effect of increasing the effective pixel display area is produced.

Part of the pixel electrode 22 (FIG. 19) includes a region overlapping the common electrode 6 in the common-electrode-region opening portion 10. This region forms a proper storage capacitance of the pixel electrode 22.

As shown in FIG. 17 or 19, a laminate comprised of the source electrode 15 and the source upper-layer electrode 18 and a laminate comprised of the drain electrode 16 and the drain upper-layer electrode 19 overlap part of the semiconductor channel film 14. End surfaces of these laminates are opposed to each other, with a constant distance therebetween. A region of the semiconductor channel film 14 which is exposed for this constant distance between these laminates functions as the channel portion CN for each TFT.

The third conductive layer C3 is made of an oxide, and is typically a transparent conductive layer. Thus, the pixel electrodes 22 are permeable to light. In the example, IZO is used as the material of the pixel electrodes 22, as in the first preferred embodiment. The third conductive layer C3 made of IZO is not directly provided on the resin insulation film 7b but is provided on the gate insulation film 13 that is a SiO film. Thus, the IZO layer is provided without being damaged by the resin insulation film.

As shown in FIG. 17, the interlayer insulation film 24 included in the third insulation layer D3 is provided so as to cover the channel portion CN, the source upper-layer electrode 18, the upper-layer source terminal 20, the drain upper-layer electrode 19, the pixel electrode 22, and the like. The interlayer insulation film 24 functions also as a protective insulation layer for protecting the channel portion CN included in the oxide semiconductor layer X1. It is hence preferable to use an oxide insulation film containing oxygen as the third insulation layer D3 so that the semiconductor channel film 14 included in the oxide semiconductor layer X1 is not reduced. In this example, a SiO film is used as the third insulation layer D3 in a manner similar to the second insulation layer D2, as in the first preferred embodiment.

In each pixel electrode portion RE, the common-electrode contact hole 30 is provided in the gate insulation film 13 and the interlayer insulation film 24 in a region overlapping the common electrode 6 and lying inside the common-electrode-region opening portion 10 as seen in plan view, as shown in FIG. 17 or 19. In the gate terminal region RG, the gate-terminal contact holes 25 are provided in the gate insulation film 13 and the interlayer insulation film 24 in regions overlapping the gate terminals 4 and lying inside the gate-terminal-region opening portions 9 as seen in plan view. In the source terminal region RS, the source-terminal contact holes 26 are provided in the interlayer insulation film 24 in regions overlapping the upper-layer source terminals 20.

In the source interconnect line connection portion RB, the source-electrode-connection contact holes 27 are provided in the gate insulation film 13 in regions overlapping the source upper-layer electrodes 18 as see in plan view. In the source interconnect line connection portion RB, source-interconnect-line-connection contact holes 28A and 28B (also referred to collectively as the source-interconnect-line-connection contact holes 28) are provided in the gate insulation film 13 and the interlayer insulation film 24 in regions overlapping the source interconnect lines 50 and lying inside the source-interconnect-line-connection-region opening portions 11 as seen in plan view.

As shown in FIG. 19, source-terminal-interconnect-line-connection contact holes 29A are provided in the interlayer insulation film 24 on the upper-layer source terminal interconnect lines 120 in regions near end portions of the upper-layer source terminal interconnect lines 120 which are opposed to the source interconnect lines 50. Source-terminal-interconnect-line-connection contact holes 29B are provided in the gate insulation film 13 and the interlayer insulation film 24 on the source interconnect lines 50 in regions near end portions of the source interconnect lines 50 which are opposed to the upper-layer source terminal interconnect lines 120.

As shown in FIG. 17, the counter electrode 31 included in the fourth conductive layer C4 is provided on a region of the interlayer insulation film 24 which overlaps the pixel electrodes 22 in the pixel electrode portions RE. Part of the counter electrode 31 is electrically connected to the common electrodes 6 provided thereunder through the common-electrode contact holes 30. This provides a common potential signal from the common electrodes 6 to the counter electrode 31.

The counter electrode 31 (FIG. 18) is disposed so as to be opposed to the greater region of the pixel electrodes 22 (FIG. 19) as seen in plan view. As shown in FIG. 18, the counter electrode 31 extends over the plurality of pixel regions RP each surrounded by one gate interconnect line 3, one common electrode 6, and two adjacent source interconnect lines 5, as in the first preferred embodiment. Thus, if the conduction failure of the common potential signal occurs in one of the pixel regions RP, for example, due to contact failure of the common electrode 6 and the counter electrode 31 in the common-electrode contact hole 30, the common potential signal is supplied from its adjacent pixel region RP to the counter electrode 31. This prevents display failure (point defects) pixel by pixel.

The slit opening portions SL are provided in the counter electrode 31, as in the first preferred embodiment. Thus, when a signal voltage is applied between the pixel electrodes 22 and the counter electrode 31, an electric field in a substantially horizontal direction with reference to the substrate surface is generated over the counter electrode 31. This makes the TFT substrate 702 applicable to FFS mode LCDs made to horizontal electric field driving specifications. Comb tooth shaped openings may be provided in place of the slit opening portions SL.

As shown in FIG. 17, the source-interconnect-line connecting line 34 included in the fourth conductive layer C4 is provided in each source-interconnect-line connection portion RB so as to connect the two source interconnect lines 50 split in opposed relation to each other, with the gate interconnect line 3 and the common electrode 6 therebetween. The source-interconnect-line connecting line 34 is electrically connected to the two source interconnect lines 50 disposed thereunder through the respective source-interconnect-line-connection contact holes 28A and 28B, and is electrically connected to the source upper-layer electrode 18 disposed thereunder through the source-electrode-connection contact hole 27.

Each of the source-terminal connecting lines 35 (FIG. 18) included in the fourth conductive layer C4 (FIG. 17) is provided so as to connect a source interconnect line 50 (FIG. 19) and an upper-layer source terminal interconnect line 120 (FIG. 19) opposed to the source interconnect line 50. Each of the source-terminal connecting lines 35 is electrically connected to the upper-layer source terminal interconnect line 120 and the source interconnect line 50 which are disposed thereunder through the respective source-terminal-interconnect-line-connection contact holes 29A and 29B. The source-interconnect-line connecting lines 34 (FIG. 18) provided so as to connect the source interconnect lines 50 split vertically as seen in FIG. 19 and the source-terminal connecting lines 35 (FIG. 18) provided so as to connect the source interconnect lines 50 and the upper-layer source terminal interconnect lines 120 which are split vertically as seen in FIG. 19 couple the source interconnect lines 50 provided in the pixel regions RP on the substrate 1 and the source terminals 17 to each other throughout the pixel regions RP, Further, the source interconnect lines 50 and the source electrodes 15 are electrically connected to each other through the source-electrode-connection contact holes 27 and the source upper-layer electrodes 18.

In the gate terminal region RG and the source terminal region RS, the gate terminal pads 32 and the source terminal pads 33 which are included in the fourth conductive layer C4 are provided respectively in regions of the gate-terminal contact holes 25 and the source-terminal contact holes 26 which are provided in the interlayer insulation film 24, as shown in FIG. 17 or 19.

A transparent conductive layer made of an oxide is used as the fourth conductive layer C4, as in the first preferred embodiment, and an IZO layer is used in the example. Thus, both of the pixel electrodes 22 and the counter electrode 31 are permeable to light. In the gate terminal region RG or the source terminal region RS, a good (separation-free) connection is ensured between a driving IC terminal for signal input and a gate terminal or a source terminal. This improves the reliability of IC mounting.

The TFT substrate 702 according to the second preferred embodiment is configured as mentioned above, and may be used as a TFT substrate for FFS mode LCDs capable of light transmission type image display. The TFT substrate 702 may be used in place of the TFT substrate 701 of the first preferred embodiment to constitute a LCD (FIG. 4).

(Manufacturing Method)

Next, a method of manufacturing the TFT substrate 702 according to the second preferred embodiment will be described with reference to FIGS. 20 to 29. The figures of the final process step of the manufacture correspond to FIGS. 17 and 18.

Figure 20:
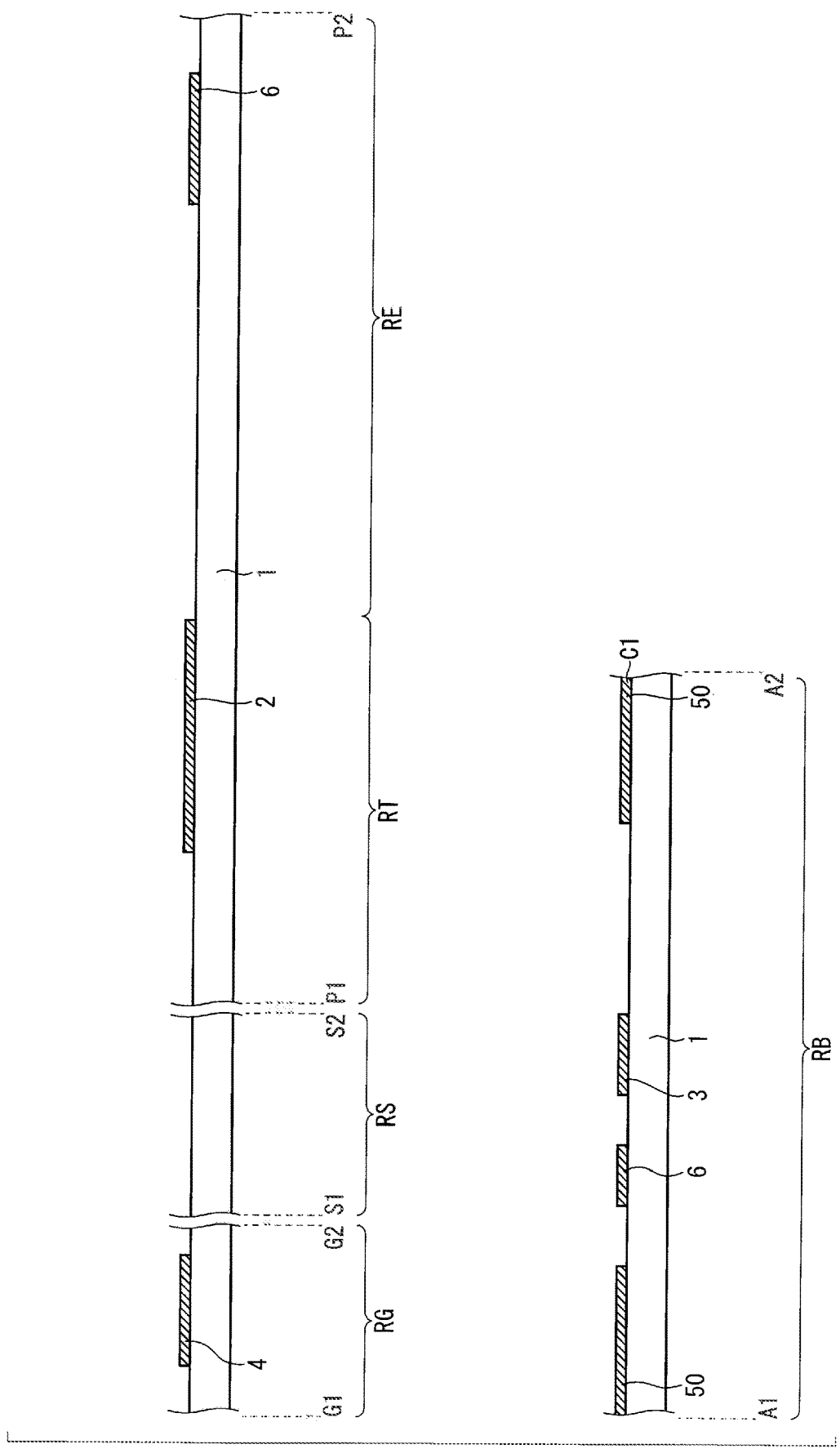
FIG. 20 is a schematic partial sectional view showing a first step of a method of manufacturing the thin film transistor substrate according to the second preferred embodiment of the present invention and taken along the lines G1-G2, S1-S2, P1-P2, and A1-A2 of FIG. 21.
Figure 21:
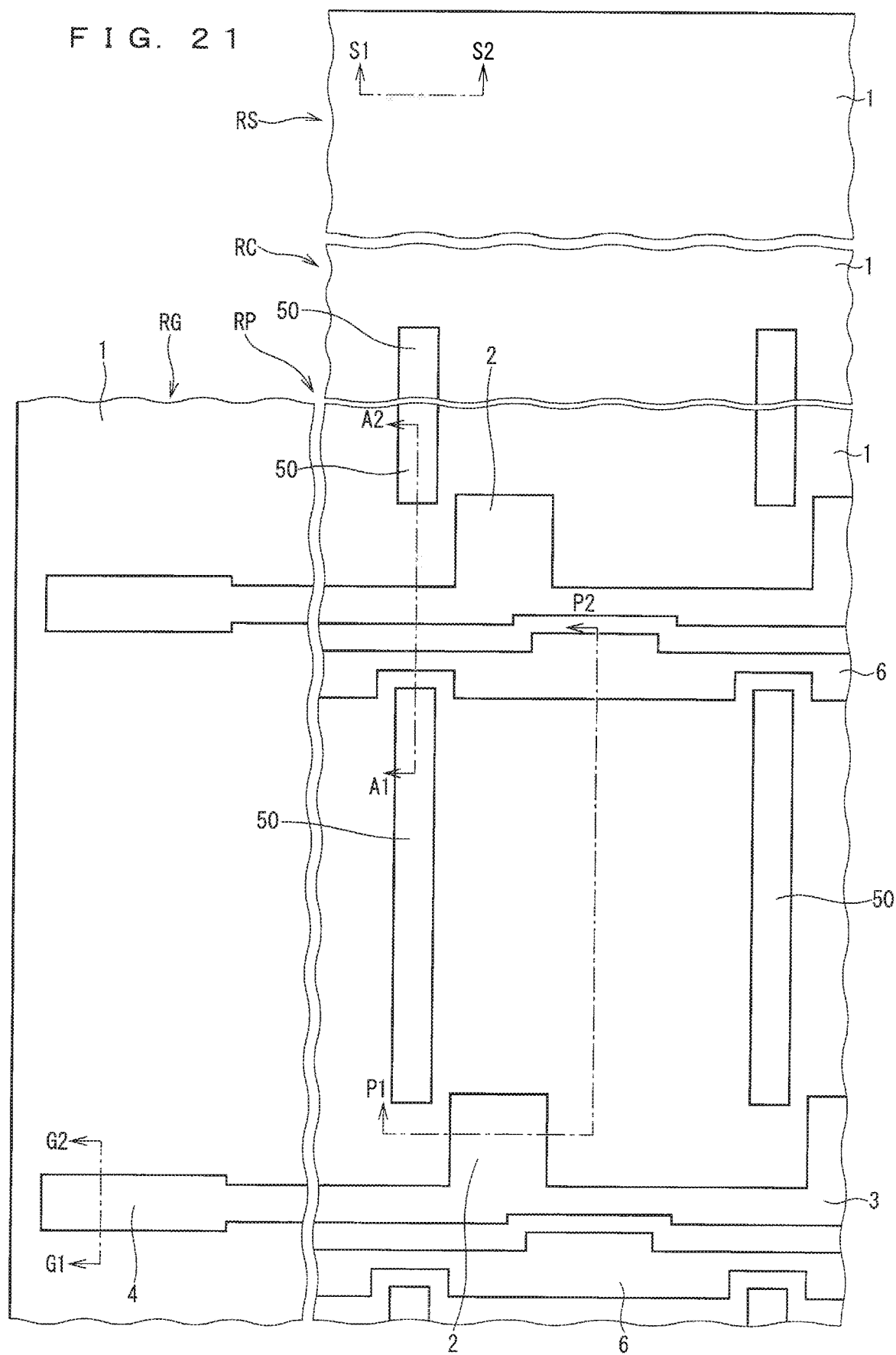
FIG. 21 is a schematic partial plan view showing the first step of the method of manufacturing the thin film transistor substrate according to the second preferred embodiment of the present invention.

(First Photolithographic Step: FIGS. 20 and 21)

First, the substrate 1 is cleaned and the first conductive layer C1 is deposited on the substrate 1 by means of a method similar to that of the first preferred embodiment.

Thereafter, a photoresist material is applied onto the first conductive layer C1. A photoresist pattern is formed in the first photolithographic step including the pattern exposure and development process of the photoresist material. Then, the first conductive layer C1 is patterned by etching with the use of the photoresist pattern as a mask. In the example, wet etching using a solution containing ammonium persulfate is used. Thereafter, the photoresist pattern is removed. Thus, the patterns of the gate electrodes 2, the gate interconnect lines 3, the gate terminals 4, the source interconnect lines 50, and the common electrodes 6 are formed on the substrate 1, as shown in FIGS. 20 and 21. The gate interconnect lines 3 and the common electrodes 6 are formed so as to extend parallel to each other in a horizontal direction as seen in plan view. The gate electrodes 2 are formed so as to be connected to the gate interconnect lines 3. The gate terminals 4 are formed on first end portions of the respective gate interconnect lines 3. The source interconnect lines 50 include a plurality of traces split by the gate interconnect lines 3 and the common electrodes 6 extending in a horizontal direction, and are formed to extend in a vertical direction as seen in plan view.

Figure 22:
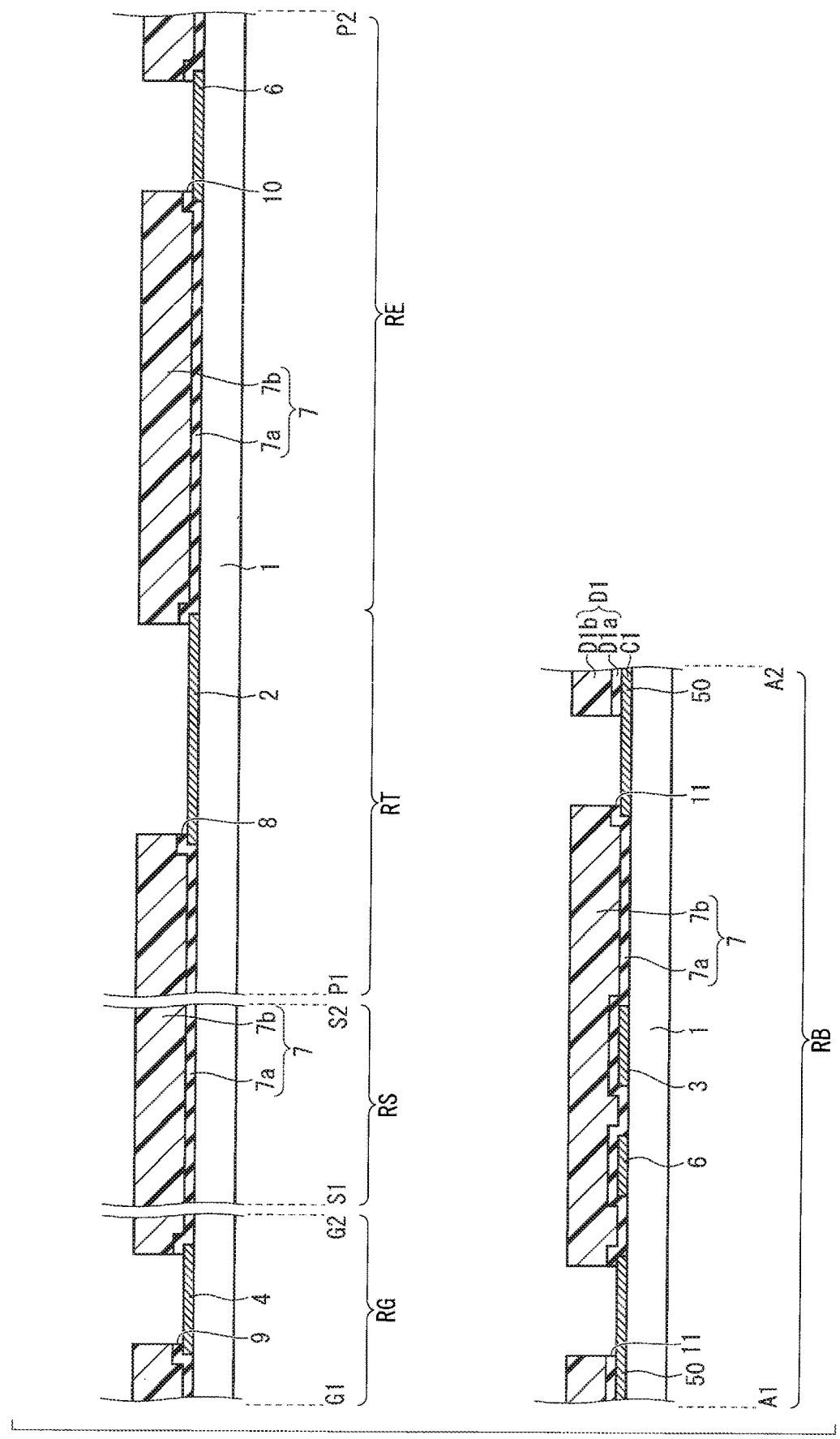
FIG. 22 is a schematic partial sectional view showing a second step of the method of manufacturing the thin film transistor substrate according to the second preferred embodiment of the present invention and taken along the lines G1-G2, S1-S2, P1-P2, and A1-A2 of FIG. 23.
Figure 23:
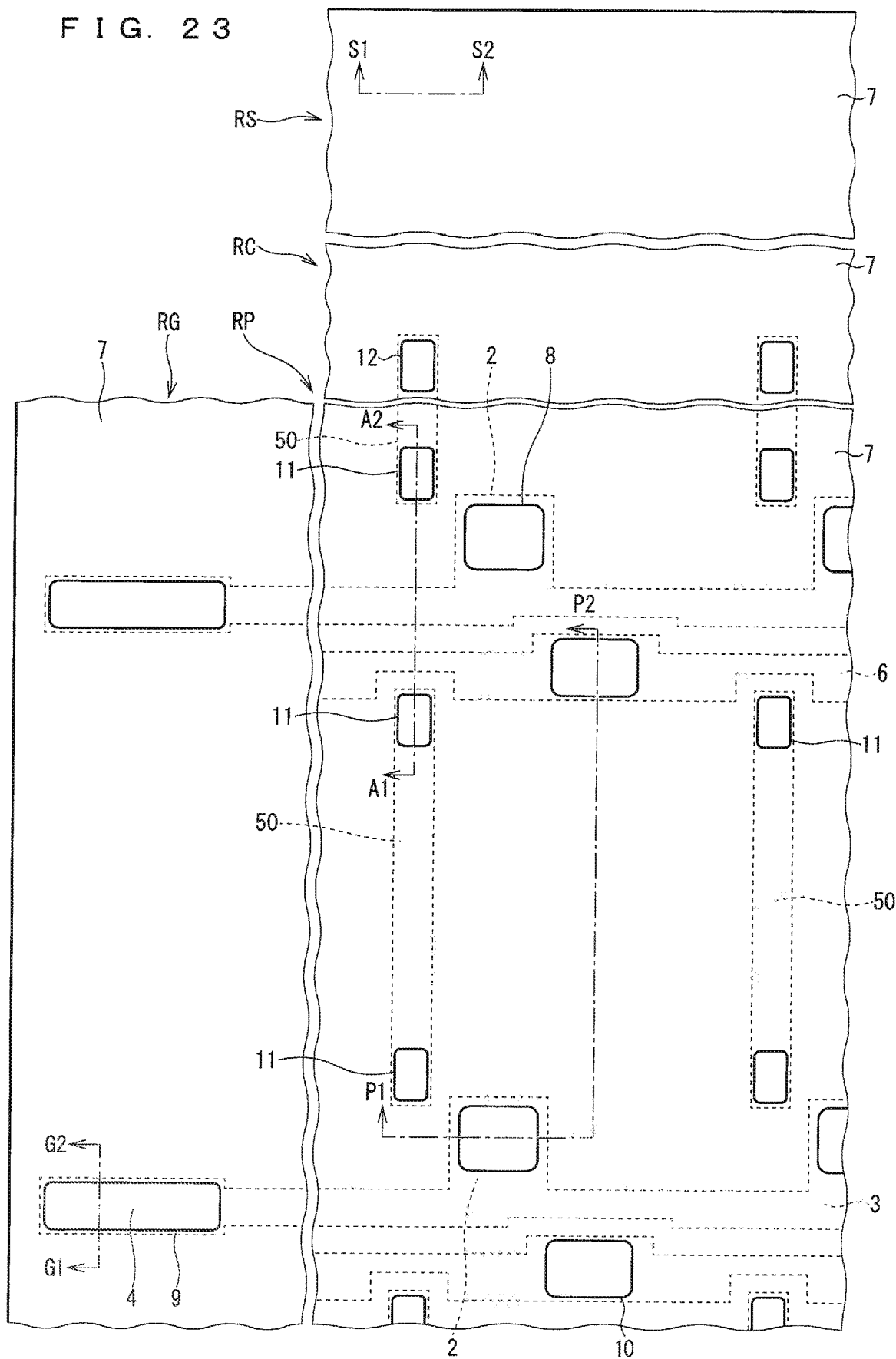
FIG. 23 is a schematic partial plan view showing the second step of the method of manufacturing the thin film transistor substrate according to the second preferred embodiment of the present invention.

(Second Photolithographic Step: FIGS. 22 and 23)

Next, a SiN layer is deposited to a thickness of 400 nm as the inorganic insulation layer D1a with the use of a PECVD method using $SiH_4$ gas, $NH_3$ gas, and $N_2$ gas as source gases. Thereafter, a photosensitive acrylic organic resin insulation material is applied to a thickness of 2 μm as the resin insulation layer D1b by a spin coating method. This provides the first insulation layer D1 that is a laminate film comprised of the SiN layer and the resin insulation layer. This configuration allows the surface of the first insulation layer D1 to become more planarized, as in the modification of the first preferred embodiment. In other words, this configuration alleviates the irregularities of the surface of the first insulation layer D1 resulting from a pattern level difference between the gate electrodes 2 and the common electrodes 6. Further, impurities contained in the substrate 1 are prevented from being diffused into the semiconductor channel films 14 to be formed later with higher reliability.

Thereafter, the photosensitive acrylic organic resin insulation layer is patterned by exposure and development in the second photolithographic step. The SiN layer serving as the inorganic insulation layer D1a is patterned by a dry etching process using a gas prepared by adding $O_2$ to $SF_6$ with the use of the pattern formed in the organic resin insulation film as a mask. Thus, the opening insulation film 7 is formed, as shown in FIGS. 22 and 23. In the opening insulation film 7, the TFT-region opening portions 8 are formed in the regions which overlap the gate electrodes 2 in the TFT portions RT and in which the channel portions CN for TFTs are to be disposed. In the opening insulation film 7, the gate-terminal-region opening portions 9 are further formed in the regions which overlap the gate terminals in the gate terminal region RG, and the common-electrode-region opening portions 10 are formed in the regions which overlap the common electrodes 6 in the pixel electrode portions RE. In the opening insulation film 7, the source-interconnect-line-connection-region opening portions 11 are also formed on the source interconnect lines 50 in the vicinity of the opposite ends of the source interconnect lines 50 in the source interconnect line connection portions RB. In the opening insulation film 7, the source-terminal-connection-region opening portions 12 are further provided on the source interconnect lines 50 in the vicinity of end portions of the source interconnect lines 50 which are adjacent to the source terminal interconnect lines 117 (FIG. 25) to be disposed in a later step.

Figure 24:
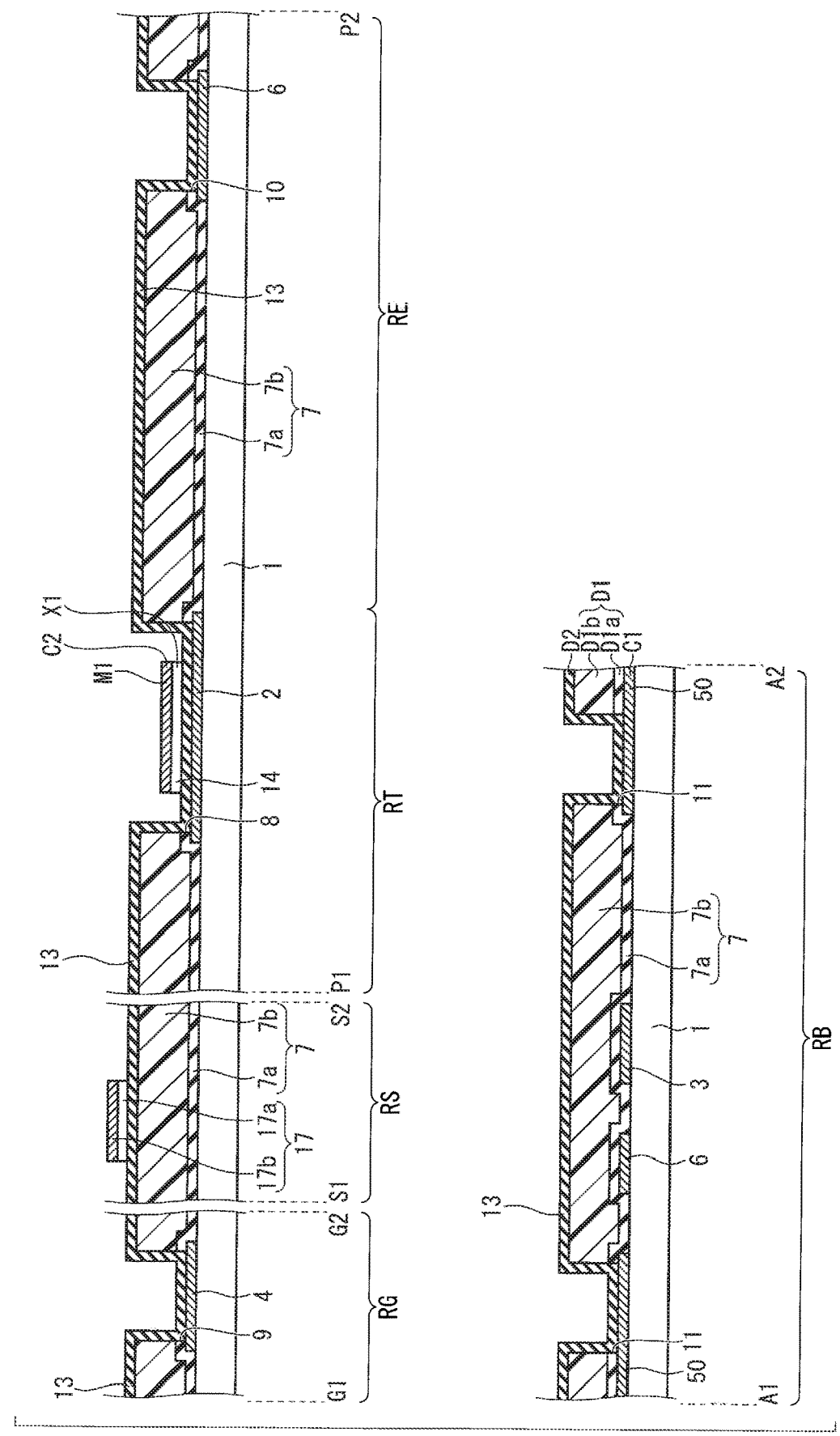
FIG. 24 is a schematic partial sectional view showing a third step of the method of manufacturing the thin film transistor substrate according to the second preferred embodiment of the present invention and taken along the lines G1-G2, S1-S2, P1-P2, and A1-A2 of FIG. 25.
Figure 25:
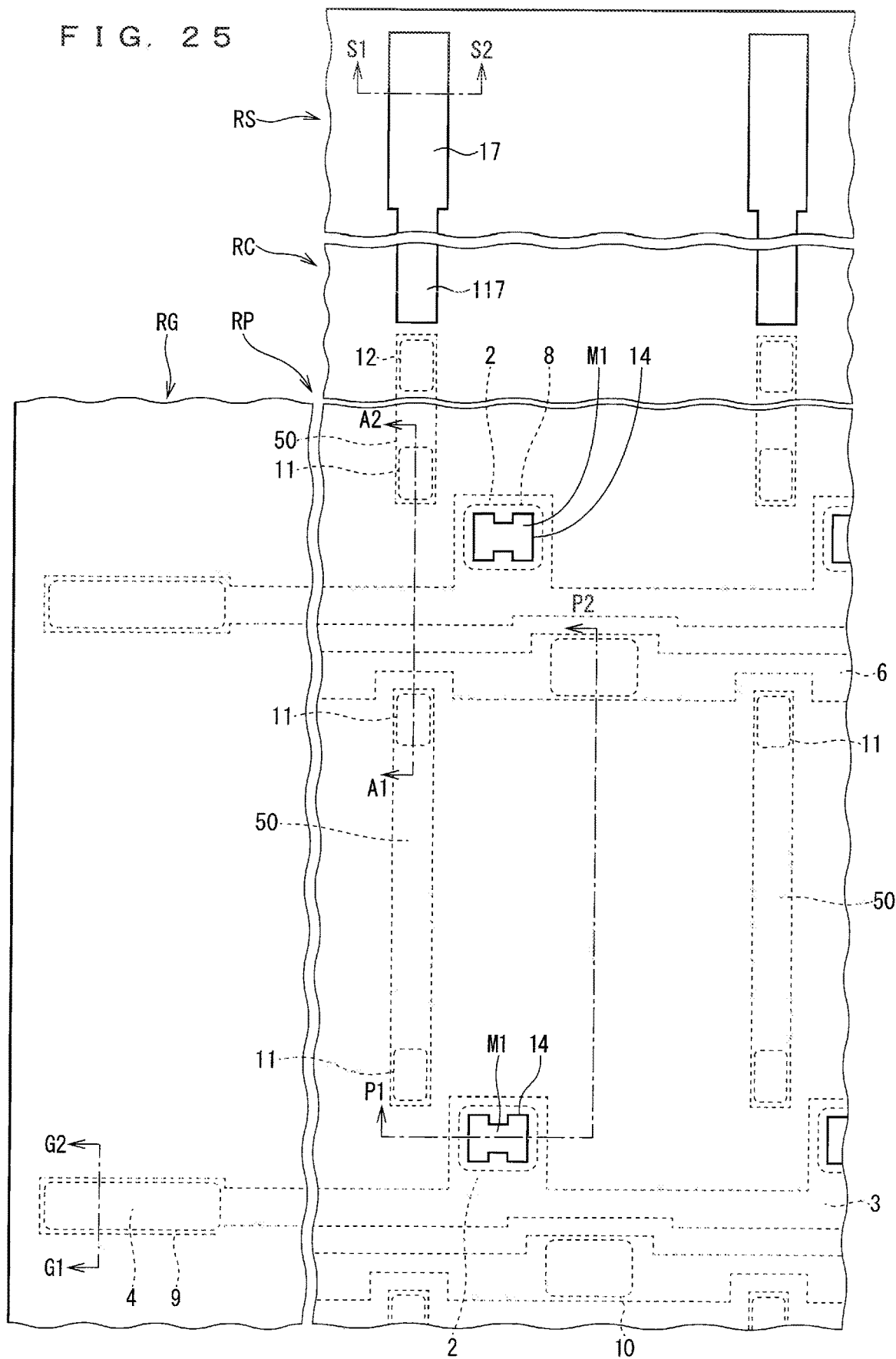
FIG. 25 is a schematic partial plan view showing the third step of the method of manufacturing the thin film transistor substrate according to the second preferred embodiment of the present invention.

(Third Photolithographic Step: FIGS. 24 and 25)

Next, the second insulation layer D2 serving as the gate insulation film 13 is deposited on the opening insulation film 7 by means of a method similar to that of the first preferred embodiment. Subsequently, the oxide semiconductor layer X1 is deposited on the gate insulation film 13 by means of a method similar to that of the first preferred embodiment. Subsequently, the second conductive layer C2 is deposited on the oxide semiconductor layer X1 by means of a method similar to that of the first preferred embodiment.

Thereafter, a photoresist material is applied onto the second conductive layer C2. A photoresist pattern is formed in the third photolithographic step. The second conductive layer C2 and the oxide semiconductor layer X1 are patterned by etching in sequential order with the use of the photoresist pattern as a mask. In the example, the second conductive layer C2 is initially etched by a wet etching process using a solution containing ammonium persulfate. Subsequently, the oxide semiconductor layer X1 is etched by a wet etching process using a solution containing oxalic acid. Thereafter, the photoresist pattern is removed. Thus, the semiconductor channel films 14 and the terminal lower-layer portions 17a are formed from the oxide semiconductor layer X1 on the gate insulation film 13 in the TFT portions RT and the source terminal region RS, respectively, as shown in FIGS. 24 and 25. Also, the pattern M1 and the terminal upper-layer portions 17b laminated on the semiconductor channel films 14 and the terminal lower-layer portions 17a, respectively, are formed from the second conductive layer C2. Also, the source terminals 17 and the source terminal interconnect lines 117 are formed from the laminate comprised of the oxide semiconductor layer X1 and the second conductive layer C2, as shown in FIG. 25. The source terminal interconnect lines 117 are formed so as to extend from first end portions of the source terminals 17.

The semiconductor channel films 14 included in the oxide semiconductor layer X1 in the TFT-region opening portions 8 in the TFT portions RT are formed on the gate electrodes, with only the gate insulation film 13 therebetween, rather than the first insulation layer D1 therebetween. The pattern M1 which becomes the source and drain electrodes in a subsequent step is formed from the second conductive layer C2 on the semiconductor channel films 14. The pattern M1 has the same shape as the semiconductor channel films 14 lying thereunder. Thus, the channel portions are not defined at this point in time.

The pattern M1 is disposed inside the TFT-region opening portion 8 and inside the gate electrode 2 as seen in plan view. With reference to FIG. 17, this prevents direct light, scattered light, and reflected light coming from the backlight and entering the back surface of the substrate 1 from entering the semiconductor channel films 14 during the display operation of the LCD. This prevents the deterioration of the properties of the TFTs resulting from the photo-deterioration of the oxide semiconductor layer X1.

Figure 26:
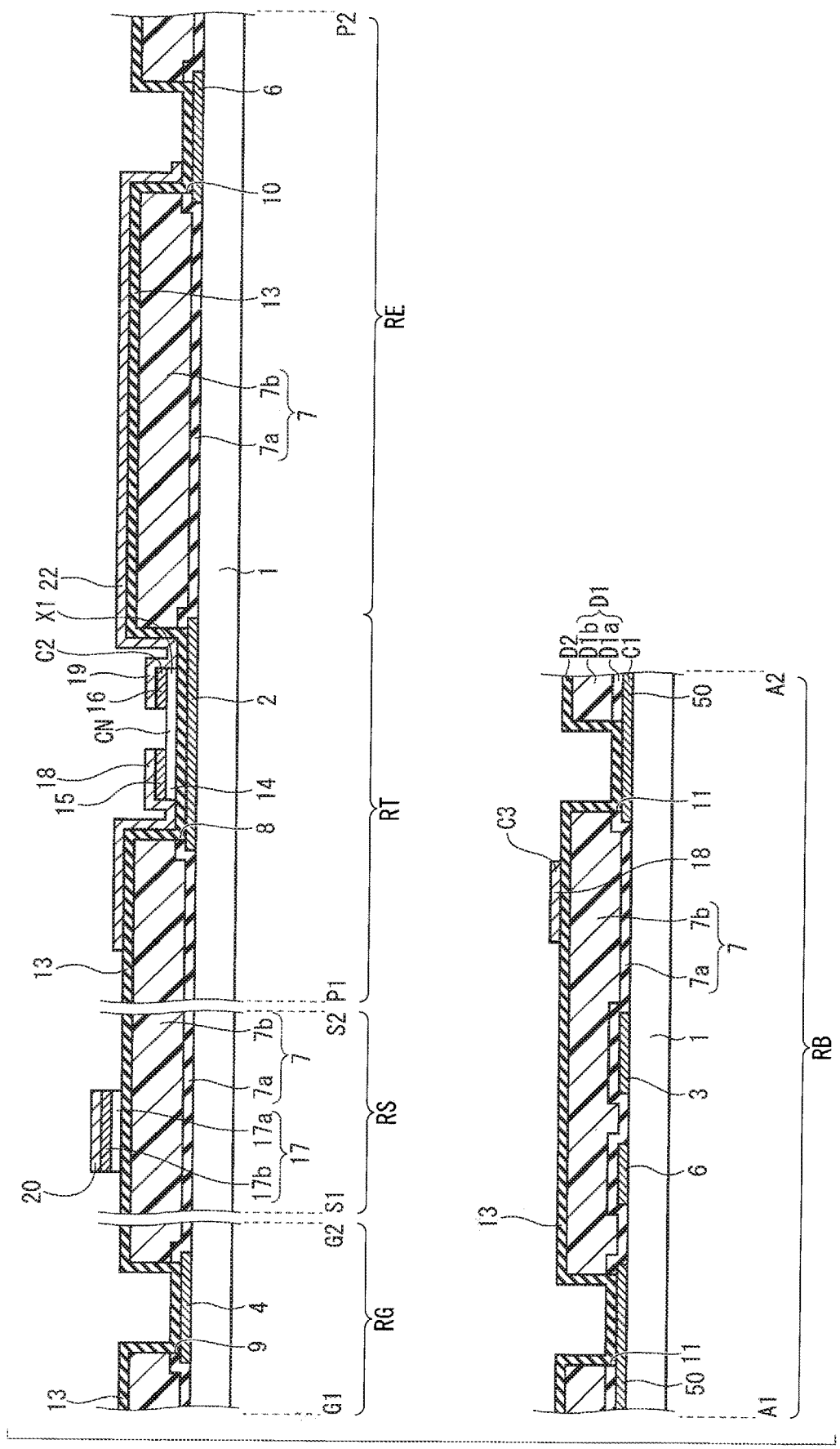
FIG. 26 is a schematic partial sectional view showing a fourth step of the method of manufacturing the thin film transistor substrate according to the second preferred embodiment of the present invention and taken along the lines G1-G2, S1-S2, P1-P2, and A1-A2 of FIG. 27.
Figure 27:
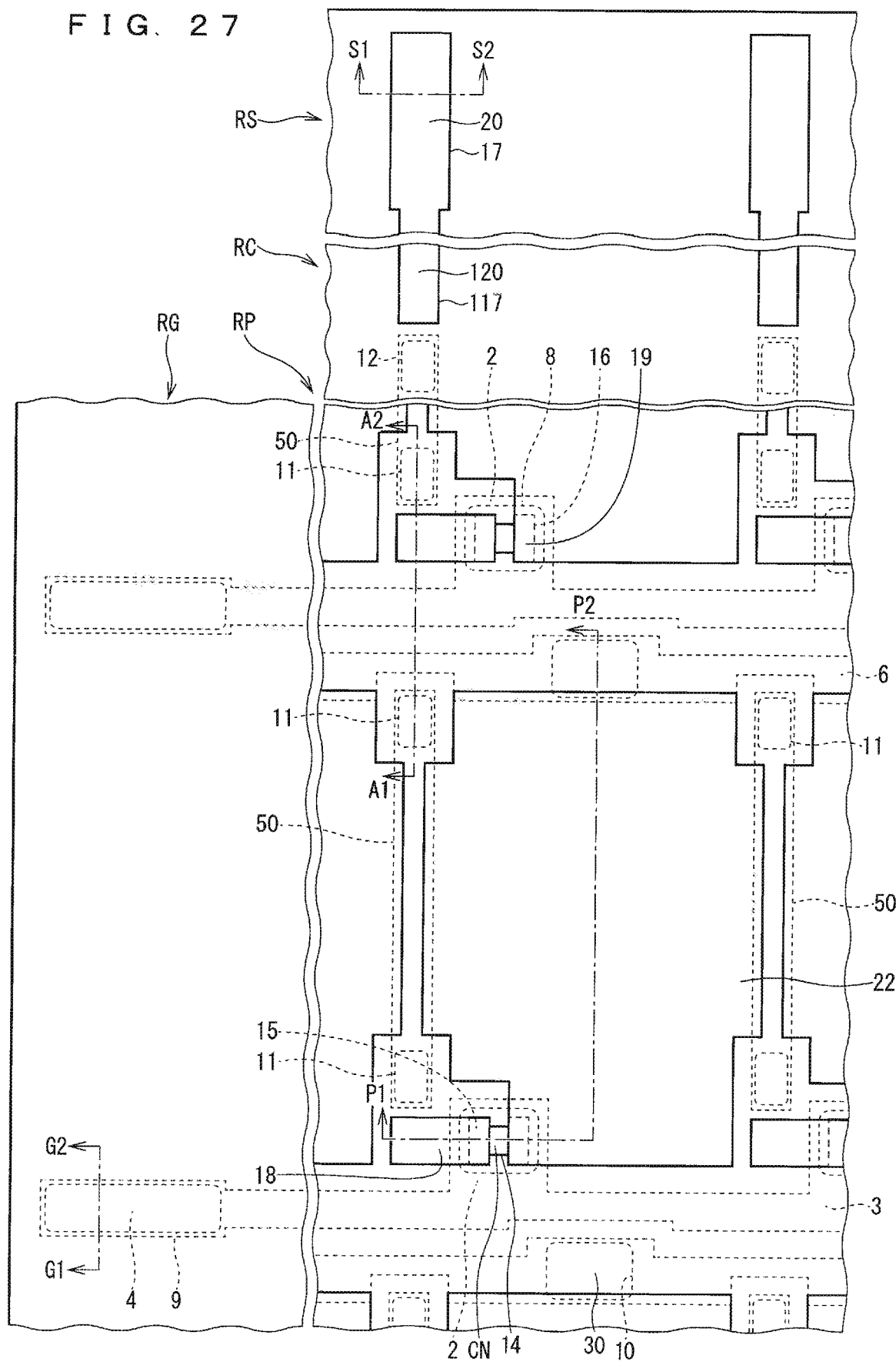
FIG. 27 is a schematic partial plan view showing the fourth step of the method of manufacturing the thin film transistor substrate according to the second preferred embodiment of the present invention.

(Fourth Photolithographic Step: FIGS. 26 and 27)

Next, the third conductive layer C3 is deposited by means of a method similar to that of the first preferred embodiment.

Thereafter, a photoresist material is applied onto the third conductive layer C3. A photoresist pattern is formed in the fourth photolithographic step. The third conductive layer C3 and the second conductive layer C2 are patterned by etching in sequential order with the use of the photoresist pattern as a mask. In the example, the third conductive layer C3 is initially etched by a wet etching process using a solution containing oxalic acid. Further, part of the second conductive layer C2 (specifically, the aforementioned pattern M1) which lies on the channel portions CN of the semiconductor channel films 14 are removed by a wet etching process using a solution containing ammonium persulfate. Thereafter, the photoresist pattern is removed. Thus, the pixel electrodes 22 and the drain upper-layer electrodes 19 connected thereto are formed in the pixel regions RP each surrounded by one gate interconnect line 3, one common electrode 6, and two adjacent source interconnect lines 50, as shown in FIG. 27. The pixel electrodes 22 are disposed to extend to regions overlapping part of the source interconnect lines 50. The pixel electrodes 22 include portions overlapping the common electrodes 6 in the common-electrode-region opening portions 10. These portions form a proper storage capacitance of the pixel electrodes 22.

In the second preferred embodiment, the pixel electrodes 22 disposed in the pixel electrode portions RE are not directly provided on the resin insulation film 7b but are provided on the inorganic gate insulation film 13 (e.g., a SiO film) provided on the resin insulation film 7b, as in the modification of the first preferred embodiment. This prevents the adverse effects during the deposition of the third conductive layer C3. Specifically, this prevents a problem such that gas emitted from the resin insulation film during the sputtering deposition of IZO from being drawn into the IZO layer and deteriorating electrical properties.

In regions overlapping the gate electrodes 2 in the TFT portions RT, the second conductive layer C2 and the third conductive layer C3 are removed so that end surfaces of a laminate comprised of the second conductive layer C2 and the third conductive layer C3 are opposed to each other in constantly spaced apart relation on the semiconductor channel films 14. This provides regions in which the surfaces of the semiconductor channel films 14 are exposed, and these regions function as the channel portions CN for TFTs. The source electrodes 15 and the drain electrodes 16 included in the second conductive layer C2 are formed with the channel portions CN therebetween. The source upper-layer electrodes 18 and the drain upper-layer electrodes 19 which are included in the third conductive layer C3 are further formed on the source electrodes 15 and the drain electrodes 16, respectively. The drain upper-layer electrodes 19 and the pixel electrodes 22 both of which are included in the third conductive layer C3 are integrally formed in a pattern contiguous with each other.

The source upper-layer electrodes 18 included in the third conductive layer C3 protrude outwardly of the gate electrodes 2 as seen in plan view (FIG. 19) to thereby extend to regions overlapping the source-interconnect-line connecting lines 34 to be provided in a subsequent step. Also, the upper-layer source terminal interconnect lines 120 are formed on the source terminal interconnect lines 117 disposed on the first end portions of the source terminals 17. The contours of the upper-layer source terminals 20 and the upper-layer source terminal interconnect lines 120 both of which are included in the third conductive layer C3 have substantially the same shape as the contours of the source terminals 17 and the source terminal interconnect lines 117 provided thereunder.

Figure 28:
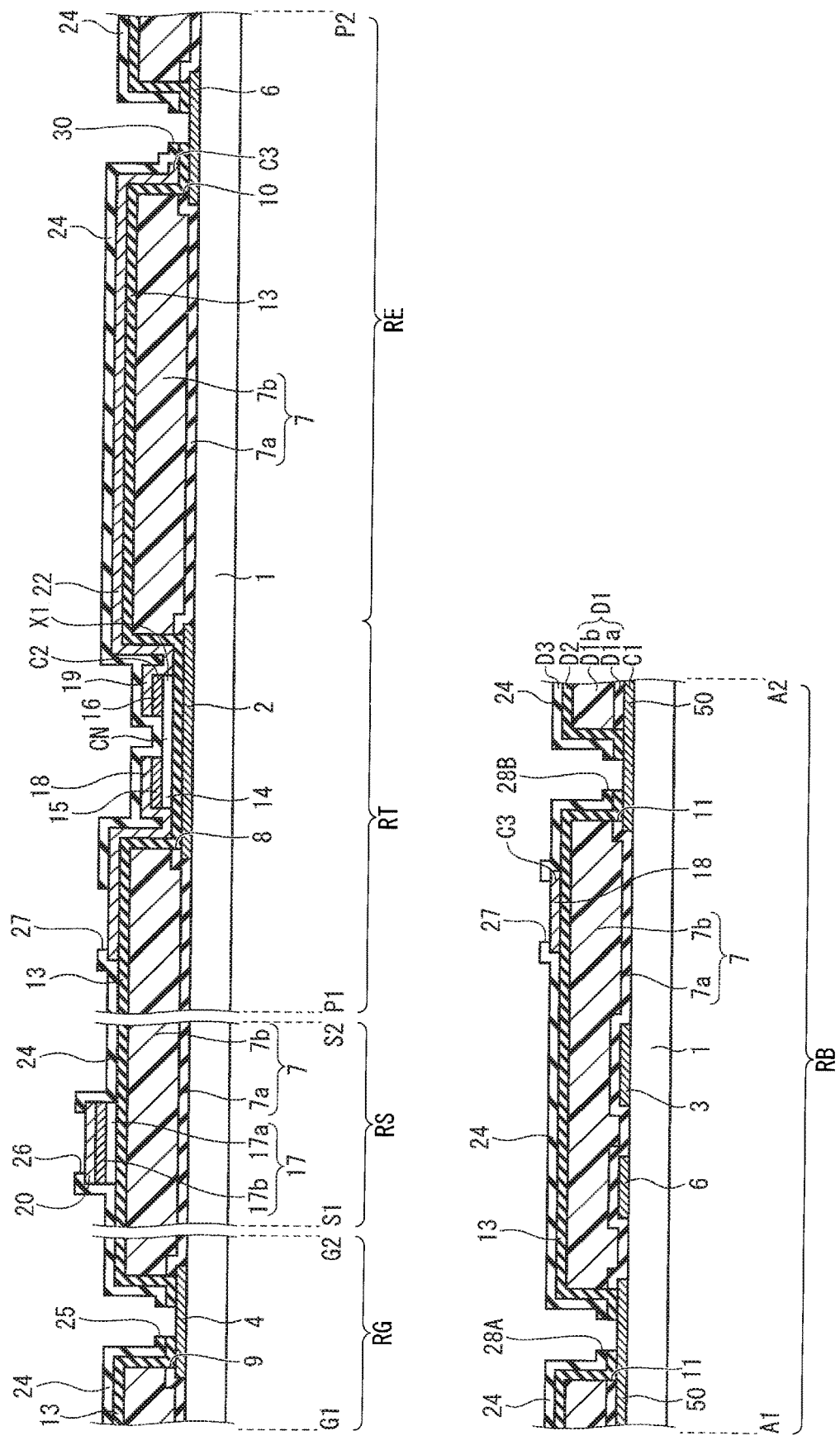
FIG. 28 is a schematic partial sectional view showing a fifth step of the method of manufacturing the thin film transistor substrate according to the second preferred embodiment of the present invention and taken along the lines G1-G2, S1-S2, P1-P2, and A1-A2 of FIG. 29.
Figure 29:
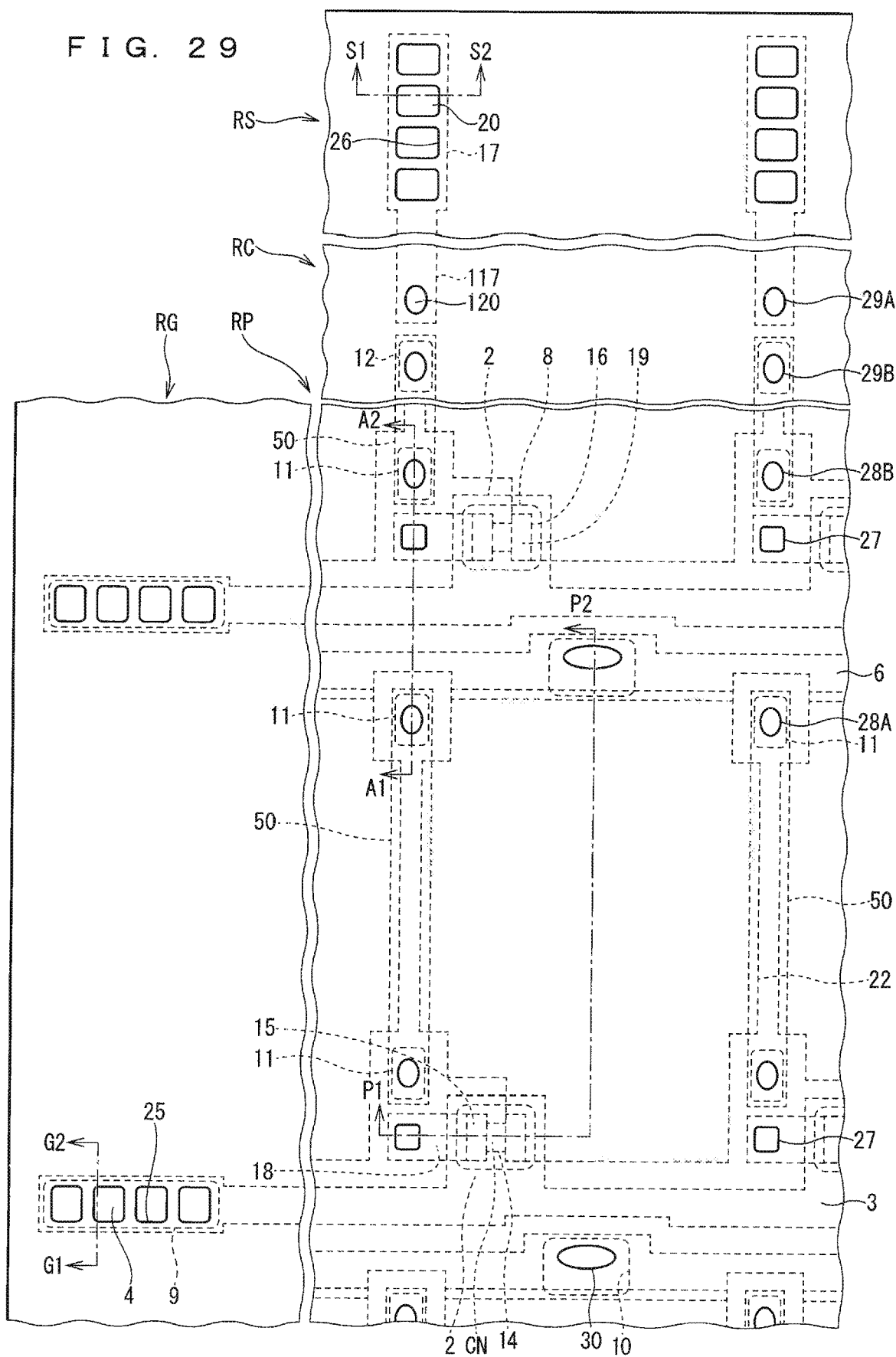
FIG. 29 is a schematic partial plan view showing the fifth step of the method of manufacturing the thin film transistor substrate according to the second preferred embodiment of the present invention.

(Fifth Photolithographic Step: FIGS. 28 and 29)

Next, the third insulation layer D3 serving as the interlayer insulation film 24 is deposited by means of a method similar to that of the first preferred embodiment.

Thereafter, a photoresist material is applied onto the third insulation layer D3. A photoresist pattern is formed in the fifth photolithographic step. The third insulation layer D3 and the second insulation layer D2 which are, for example, made of SiO in common are patterned by etching in sequential order with the use of the photoresist pattern as a mask. In the example, a dry etching process using a gas prepared by adding $O_2$ to $SF_6$ is used. Thereafter, the photoresist pattern is removed. Thus, the gate-terminal contact holes 25 and the common-electrode contact holes 30 which extend through the third insulation layer D3 and the second insulation layer D2 are formed on the gate terminals 4 in the gate terminal region RG and the common electrodes 6 in the pixel electrode portions RE, respectively, as shown in FIG. 28 or 29. The common-electrode contact holes 30 are formed in regions which do not overlap the pattern of the pixel electrodes 22 as seen in plan view. Further, the source-terminal contact holes 26 extending through the third insulation layer D3 are formed on the upper-layer source terminals 20 in the source terminal region RS.

In the source interconnect line connection portion RB, the source-electrode-connection contact holes 27 are formed in the gate insulation film 13 in regions overlapping the source upper-layer electrodes 18 as see in plan view. In the source interconnect line connection portion RB, the source-interconnect-line-connection contact holes 28A and 28B are formed in the gate insulation film 13 and the interlayer insulation film 24 in regions overlapping the source interconnect lines 50 and lying inside the source-interconnect-line-connection-region opening portions 11.

As shown in FIG. 29, the source-terminal-interconnect-line-connection contact holes 29A are formed in the interlayer insulation film 24 in the vicinity of end portions of the upper-layer source terminal interconnect lines 120 which are opposed to the source interconnect lines 50. The source-terminal-interconnect-line-connection contact holes 29B are formed in the gate insulation film 13 and the interlayer insulation film 24 in the vicinity of end portions of the source interconnect lines 50 which are opposed to the upper-layer source terminal interconnect lines 120.

The gate-terminal contact holes 25 and the common-electrode contact holes 30 are formed respectively inside the gate-terminal-region opening portions 9 and the common-electrode-region opening portions 10 which are previously formed in the first insulation layer D1 (e.g., a SiN layer) in the second photolithographic step as seen in plan view. The source-interconnect-line-connection contact holes 28A and 28B and the source-terminal-interconnect-line-connection contact hole 29B are formed respectively inside the source-interconnect-line-connection-region opening portions 11 and the source-terminal-connection-region opening portions 12 which are previously formed in the first insulation layer D1 in the second photolithographic step as seen in plan view. Thus, these contact holes 25, 28A, 28B, 29B, and 30 are formed only by etching the second insulation layer D2 and the third insulation layer D3 without etching the first insulation layer D1. This allows the side surfaces of the contact holes to be finished in a uniform shape. If contact holes are formed in a laminated film comprised of different insulation film materials, the side surfaces of the contact holes are prone to become uneven surfaces in an irregular shape or in the shape of notches typically because of differences in etching rate or in how the etching proceeds. The second preferred embodiment suppresses such nonuniformity. This effect is enhanced, in particular, when the second insulation layer D2 and the third insulation layer D3 are made of a common material (e.g., the layers D2 and D3 are SiO layers).

(Sixth Photolithographic Step: FIGS. 17 and 18)

Next, the fourth conductive layer C4 is deposited by means of a method similar to that of the first preferred embodiment.

Thereafter, a photoresist material is applied onto the fourth conductive layer C4. A photoresist pattern is formed in the sixth photolithographic step. The fourth conductive layer C4 is patterned by etching with the use of the photoresist pattern as a mask. In the example, a wet etching process using a solution containing oxalic acid is used. Thereafter, the photoresist pattern is removed. Thus, the counter electrode 31, the gate terminal pads 32, and the source terminal pads 33 are formed respectively in the pixel regions RP, the gate terminal region RG, and the source terminal region RS, as shown in FIG. 17 or 18, as in the first preferred embodiment.

In the second preferred embodiment, the source-interconnect-line connecting line 34 included in the fourth conductive layer C4 is formed in each source-interconnect-line connection portion RB so as to connect regions overlapping the two source interconnect lines 50 which are opposed, with the gate interconnect line 3 and the common electrode 6 therebetween, as shown in FIG. 17. The source-interconnect-line connecting line 34 is electrically connected to the two source interconnect lines 50 disposed thereunder through the respective source-interconnect-line-connection contact holes 28A and 28B, and is electrically connected to the source upper-layer electrode 18 disposed thereunder through the source-electrode-connection contact hole 27.

Each of the source-terminal connecting lines 35 (FIG. 18) included in the fourth conductive layer C4 (FIG. 17) is formed so as to connect the source interconnect line 50 (FIG. 19) and the upper-layer source terminal interconnect line 120 (FIG. 19) opposed to the source interconnect line 50. Each of the source-terminal connecting lines 35 is electrically connected to the upper-layer source terminal interconnect line 120 and the source interconnect line 50 which are disposed thereunder through the respective source-terminal-interconnect-line-connection contact holes 29A and 29B. The source-interconnect-line connecting lines 34 (FIG. 18) provided so as to connect the source interconnect lines 50 split vertically as seen in FIG. 19 and the source-terminal connecting lines 35 (FIG. 18) provided so as to connect the source interconnect lines 50 and the upper-layer source terminal interconnect lines 120 which are split vertically as seen in FIG. 19 couple the source interconnect lines 50 provided in the pixel regions RP on the substrate 1 and the source terminals 17 to each other throughout the pixel regions RP. Further, the source interconnect lines 50 and the source electrodes 15 are electrically connected to each other through the source-electrode-connection contact holes 27 and the source upper-layer electrodes 18.

The manufacture of the TFT substrate 702 according to the second preferred embodiment is completed through the aforementioned steps. The TFT substrate 702 may be used in place of the TFT substrate 701 of the first preferred embodiment to assemble a LCD.

(Summary of Method of Manufacturing Thin Film Transistor Substrate)

In summary, the aforementioned method of manufacturing the TFT substrate 702 generally includes the following steps.

(A) With reference to FIGS. 20 and 21, the first conductive layer C1 is deposited on the substrate 1. The gate electrodes 2 provided in the respective TFT portions RT and each having side surfaces, the gate interconnect lines 3 connected to the gate electrodes 2 and extending in one direction, and the source interconnect lines 50 spaced apart from the gate electrodes 2 and the gate interconnect lines 3 are formed from the first conductive layer C1.

(B) With reference to FIGS. 22 and 23, the first insulation layer D1 including the resin layer D1b is deposited so as to cover the substrate 1. The opening insulation film 7 is formed from the first insulation layer D1. The opening insulation film 7 is in contact with the side surfaces of the gate electrodes 2. The TFT-region opening portions 8 (first opening portions) having side surfaces on the gate electrodes 2 are provided in the opening insulation film 7. The source-interconnect-line-connection-region opening portions 11 are also provided in the opening insulation film 7. The source-interconnect-line-connection-region opening portions 11 have respective side surfaces on the source interconnect lines 50.

(C) With reference to FIGS. 24 and 25, the second insulation layer D2 made of an oxide insulator different from the material of the first insulation layer D1 is then deposited on the gate electrodes 2 and the opening insulation film 7. Thus, the gate insulation film 13 is formed.

(D) Next, the oxide semiconductor layer X1 and the second conductive layer C2 are deposited in sequential order on the gate insulation film 13. Thus, a laminate comprised of the oxide semiconductor layer X1 and the second conductive layer C2 is formed. This laminate is patterned. Thus, the semiconductor channel films 14 encompassed by the respective TFT-region opening portions 8 of the opening insulation film 7 as seen in plan view are formed from the oxide semiconductor layer X1.

(E) With reference to FIGS. 26 and 27, the third conductive layer C3 made of an oxide is then deposited. Next, the third conductive layer C3 and the second conductive layer C2 are patterned. This patterning forms the source electrodes 15 and the drain electrodes 16 from the second conductive layer C2 on the upper surfaces of the semiconductor channel films 14, and forms the source upper-layer electrodes 18 and the drain upper-layer electrodes 19 from the third conductive layer C3 on the source electrodes 15 and the drain electrodes 16, respectively. This patterning further forms the pixel electrodes 22 which are connected to the drain upper-layer electrodes 19, which are in contact with side surfaces of the drain electrodes 16, and which partially overlap the source interconnect lines 50 as seen in plan view are formed from the third conductive layer C3 in the respective pixel regions RP. This patterning also forms regions in which surfaces of the semiconductor channel films 14 are exposed to form the channel portions CN for the respective TFTs.

(F) With reference to FIGS. 28 and 29, the third insulation layer D3 made of an oxide is then deposited. Next, the third insulation layer D3 and the gate insulation film 13 are patterned. Thus, the interlayer insulation film 24 which has portions provided on the source upper-layer electrodes 18 and the drain upper-layer electrodes 19, which is in contact with the semiconductor channel films 14, and which is provided with the source-electrode-connection contact holes 27 extending to the source upper-layer electrodes 18 is formed from the third insulation layer D3. The source-interconnect-line-connection contact holes 28 extending to the source interconnect lines 50 in the respective source-interconnect-line-connection-region opening portions 11 of the opening insulation film 7 are formed in the interlayer insulation film 24 and the gate insulation film 13.

(G) With reference to FIGS. 17 and 18, the fourth conductive layer C4 is then deposited on the interlayer insulation film 24. Next, the fourth conductive layer C4 is patterned. Thus, the source-interconnect-line connecting lines 34 electrically connected to the source upper-layer electrodes 18 through the respective source-electrode-connection contact holes 27 and electrically connected to the source interconnect lines 50 through the respective source-interconnect-line-connection contact holes 28 are formed. The aforementioned patterning may form the counter electrode 31 over the pixel electrodes 22, with the interlayer insulation film 24 therebetween.

In the aforementioned step (A), one of the set of gate interconnect lines 3 and the set of source interconnect lines 50 may serve as the continuous interconnect lines extending continuously (the gate interconnect lines 3 as seen in FIG. 21), whereas the other set serves as intermittent interconnect lines extending intermittently (the source interconnect lines 50 as seen in FIG. 21). The continuous interconnect lines and the intermittent interconnect lines intersect each other in separate locations which are breaks in the intermittent interconnect lines.

In the aforementioned step (G), the source-interconnect-line connecting lines 34 (FIG. 18) may be formed by patterning the fourth conductive layer C4 (FIG. 17). The source-interconnect-line connecting lines 34 extend over the separation locations of the intermittent interconnect lines (the source interconnect lines 50 as seen in FIG. 29). Thus, the separation locations in the intermittent interconnect lines are short-circuited.

(Summary of Effects)

The second preferred embodiment produces effects similar to those of the first preferred embodiment and the modification of the first preferred embodiment.

Further, the pixel electrodes 22 are extended so as to partially overlapping the source interconnect lines 50 as seen in plan view, as shown in FIG. 18. This increases the aperture ratio of pixels. The outer edge of the semiconductor channel films 14 coincides with the outer edge of the oxide semiconductor layer X1 including the semiconductor channel films 14. Thus, the outer edge of the oxide semiconductor layer X1 including the semiconductor channel films 14 is also inside the gate electrodes 2 and inside the TFT-region opening portions 8 as seen in plan view. This prevents light coming from the backlight from entering all portions of the oxide semiconductor layer X1 to thereby prevent the photo-deterioration of the oxide semiconductor layer X1 or the deterioration of the properties of the TFTs associated with the photo-deterioration.

According to the second preferred embodiment, the gate interconnect lines 3 and the source interconnect lines 50 are included in the first conductive layer C1 in common. One of the two types of interconnect lines included in the same layer in this manner serves as the continuous interconnect lines, whereas the other type serves as the intermittent interconnect lines. This allows the continuous interconnect lines and the intermittent interconnect lines to intersect each other without a short circuit. Although the gate interconnect lines 3 serve as the continuous interconnect lines whereas the source interconnect lines 50 serve as the intermittent interconnect lines in the instance of FIG. 21, the gate interconnect lines may serve as the intermittent interconnect lines whereas the source interconnect lines serve as the continuous interconnect lines.

As shown in FIG. 17, the source-interconnect-line connecting line 34 included in the fourth conductive layer C4 is provided in each source-interconnect-line connection portion RB so as to connect the two source interconnect lines 50 split in opposed relation to each other, with the gate interconnect line 3 and the common electrode 6 therebetween. This ensures an electrical path along the source interconnect lines if the intermittent interconnect lines are used as the source interconnect lines.

The opening insulation film 7 in the second preferred embodiment is the laminate comprised of the inorganic insulation film 7a (e.g., a SiN film) and the resin insulation film 7b. However, the inorganic insulation film 7a may be dispensed with as described in the modification of the first preferred embodiment. In other words, the first insulation layer D1 may be comprised of only the resin insulation layer D1b.

Although the configuration and manufacturing method of the TFT substrate 702, i.e. a TFT substrate for a FFS mode LCD, have been described in the second preferred embodiment, the mode of the LCDs is not limited to the FFS mode. For example, a TFT substrate for a TN mode may be obtained by manufacturing the TFT substrate mainly through the first to fifth photolithographic steps. This TFT substrate is affixed to a separately produced counter substrate for a TN mode, with a liquid crystal layer therebetween. The counter substrate for a TN mode includes a counter electrode, a color filter, an alignment film, and the like. Further, a TFT substrate for an OLED display may be configured by providing a pixel display element including an anode electrode made of a conductive material (metal film) having light reflectivity and a self light emitting layer and a transparent electrode which are provided on the anode electrode and include an organic EL material, for example, in place of the pixel electrode 22 in a pixel electrode portion.

In the aforementioned second preferred embodiment, the gate interconnect lines 3 and the common electrodes 6 are the continuous interconnect lines, whereas the source interconnect lines 50 are the intermittent interconnect lines, so that the separation locations of the source interconnect lines 50 are electrically connected by the source-interconnect-line connecting lines 34 included in the fourth conductive layer C4. However, the gate interconnect lines 3 and the common electrodes 6 may be the intermittent interconnect lines, whereas the source interconnect lines 50 are the continuous interconnect lines, so that the separation locations of the gate interconnect lines 3 and the common electrodes 6 are electrically connected by the connecting lines included in the fourth conductive layer C4. In this case, effects similar to those of the second preferred embodiment are produced.

In the first and second preferred embodiments and the modifications thereof, the counter electrode 31 is electrically connected to the common electrode 6 through the common-electrode contact hole 30 in each of the pixel regions RP. However, if the counter electrode 31 is continuously formed so as to extend over the plurality of pixel regions RP to sufficiently ensure the uniformity of common potential signals between the pixel regions RP, each of the pixel regions RP need not always have the common electrode 6 and the common-electrode contact hole 30, but the common electrode 6 and the common-electrode contact hole 30 may be dispensed with, as appropriate. If the common-electrode contact hole 30 is dispensed with, a corresponding one of the common-electrode-region opening portions 10 may also be dispensed with.

Although the InGaZnO based material is used as the material of the oxide semiconductor layer X1 in the aforementioned preferred embodiments and the modifications thereof, the present invention is not limited to this. For example, other oxide semiconductor materials such as InZnO based, InGaO based, InZnO based, InSnZnO based, InGaZnSnO based, InAlZnO based, InHfZnO based, InZrZnO based, InMgZnO based, and InYZnO based materials may be used. When these materials are used, a high-performance TFT substrate having mobility higher than that of the conventional a-Si semiconductor films is provided.

The preferred embodiments according to the present invention may be freely combined within the scope of the invention or the preferred embodiments may be changed and dispensed with, as appropriate.

While the invention has been described in detail, the foregoing description is in all aspects illustrative and not restrictive. It is understood that numerous other modifications and variations can be devised without departing from the scope of the invention.

What is claimed is:

1. A thin film transistor substrate including a thin film transistor having a layered structure in which a first conductive layer, a first insulation layer, a second insulation layer made of an oxide insulator different from a material of the first insulation layer, an oxide semiconductor layer, a second conductive layer, a third conductive layer made of an oxide, and a third insulation layer made of an oxide are disposed on a substrate, the thin film transistor substrate comprising:
   a gate electrode provided on the substrate and having a side surface, the gate electrode being included in the first conductive layer;
   an opening insulation film covering the substrate and in contact with the side surface of the gate electrode, the opening insulation film being provided with a first opening portion having a side surface on the gate electrode, the opening insulation film being included in the first insulation layer;
   a gate insulation film provided on the gate electrode and the opening insulation film, the gate insulation film being included in the second insulation layer;
   a semiconductor channel film provided on the gate insulation film and encompassed by the first opening portion of the opening insulation film as seen in plan view, the semiconductor channel film being included in the oxide semiconductor layer;
   a source electrode and a drain electrode provided on the semiconductor channel film and included in the second conductive layer;
   a source upper-layer electrode provided at least on an upper surface of the source electrode and included in the third conductive layer;
   a drain upper-layer electrode provided at least on an upper surface of the drain electrode and included in the third conductive layer; and
   an interlayer insulation film having a portion provided on the source upper-layer electrode and the drain upper-layer electrode and in contact with the semiconductor channel film, the interlayer insulation film being included in the third insulation layer.

2. The thin film transistor substrate according to claim 1, wherein at least one end portion of the semiconductor channel film is spaced inwardly apart from an edge of the gate electrode and is spaced inwardly apart from an edge of the first opening portion of the opening insulation film as seen in plan view.

3. The thin film transistor substrate according to claim 1, wherein the thin film transistor is disposed in corresponding relation to each of pixel regions, the pixel regions being arranged in a matrix on the substrate,
the thin film transistor substrate further comprising:
a gate interconnect line provided on the substrate and connected to the gate electrode, the gate interconnect line extending in one direction in the pixel regions, the gate interconnect line being included in the first conductive layer;
a source interconnect line intersecting the gate interconnect line as seen in plan view and connected to the source electrode, at least part of the source interconnect line being included in the second conductive layer; and
a pixel electrode connected to the drain upper-layer electrode and in contact with a side surface of the drain electrode, the pixel electrode being included in the third conductive layer.

4. The thin film transistor substrate according to claim 3, further comprising
a counter electrode provided over the pixel electrode, with the interlayer insulation film therebetween, the counter electrode including an opening portion in a form of a comb tooth or a slit.

5. The thin film transistor substrate according to claim 4, further comprising
a common electrode provided on the substrate and included in at least one of the first conductive layer and the second conductive layer,
wherein the opening insulation film is provided with a second opening portion, wherein the counter electrode in the second opening portion is in contact with the common electrode through a contact hole provided in at least one of the gate insulation film and the interlayer insulation film, and wherein the second opening portion has an edge disposed outside the contact hole as seen in plan view.

6. The thin film transistor substrate according to claim 3, wherein the first insulation layer includes a resin layer.

7. The thin film transistor substrate according to claim 1, wherein the thin film transistor is disposed in corresponding relation to each of pixel regions, the pixel regions being arranged in a matrix on the substrate, wherein the first insulation layer includes a resin layer, and wherein a fourth conductive layer is further disposed in the layered structure,
the thin film transistor substrate further comprising:
a gate interconnect line provided on the substrate and connected to the gate electrode, the gate interconnect line being included in the first conductive layer;
a source interconnect line provided in spaced apart relation to the gate electrode and the gate interconnect line on the substrate, and having a side surface, the source interconnect line being included in the first conductive layer; and
a pixel electrode connected to the drain upper-layer electrode and in contact with a side surface of the drain electrode, the pixel electrode partially overlapping the source interconnect line as seen in plan view, the pixel electrode being included in the third conductive layer,
wherein the opening insulation film is in contact with the side surface of the source interconnect line, and is provided with a second opening portion having a side surface on the source interconnect line, and
wherein the interlayer insulation film is provided with a first contact hole extending to the source upper-layer electrode, and the interlayer insulation film and the gate insulation film are provided with a second contact hole extending to the source interconnect line in the second opening portion of the opening insulation film,
the thin film transistor substrate further comprising
a first connecting line electrically connected to the source upper-layer electrode through the first contact hole and electrically connected to the source interconnect line through the second contact hole, the first connecting line being included in the fourth conductive layer.

8. The thin film transistor substrate according to claim 7, wherein the oxide semiconductor layer is disposed inside and encompassed by the gate electrode and the first opening portion as seen in plan view.

9. The thin film transistor substrate according to claim 7, further comprising
- a counter electrode provided over the pixel electrode, with the interlayer insulation film therebetween, and included in the fourth conductive layer, the counter electrode including an opening portion in a form of a comb tooth or a slit.

10. The thin film transistor substrate according to claim 7,
- wherein one of the gate interconnect line and the source interconnect line is a continuous interconnect line extending continuously, and the other of the gate interconnect line and the source interconnect line is an intermittent interconnect line extending intermittently, and
- wherein the continuous interconnect line and the intermittent interconnect line intersect each other in a separation location which is a break in the intermittent interconnect line,
- the thin film transistor substrate further comprising
- a second connecting line extending over the separation location of the intermittent interconnect line to thereby short-circuit the separation location in the intermittent interconnect line, the second connecting line being included in the fourth conductive layer.

11. A display device comprising a thin film transistor substrate as recited in claim 1.

\* \* \* \* \*